United States Patent
Ise et al.

(10) Patent No.: US 9,340,728 B2
(45) Date of Patent: May 17, 2016

(54) ORGANIC ELECTROLUMINESCENCE DEVICE

(75) Inventors: Toshihiro Ise, Kanagawa (JP); Tetsu Kitamura, Kanagawa (JP); Toru Watanabe, Kanagawa (JP); Akira Takeda, Kanagawa (JP); Keiju Tonosaki, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 1145 days.

(21) Appl. No.: 13/387,847

(22) PCT Filed: Jul. 29, 2010

(86) PCT No.: PCT/JP2010/062859
§ 371 (c)(1), (2), (4) Date: Jan. 30, 2012

(87) PCT Pub. No.: WO2011/013783
PCT Pub. Date: Feb. 3, 2011

(65) Prior Publication Data
US 2012/0126690 A1    May 24, 2012

(30) Foreign Application Priority Data

Jul. 31, 2009 (JP) ................................. 2009-180223
Aug. 31, 2009 (JP) ................................. 2009-201155
Sep. 25, 2009 (JP) ................................. 2009-221663

(51) Int. Cl.
*H01L 51/50*        (2006.01)
*C09K 11/06*        (2006.01)
(Continued)

(52) U.S. Cl.
CPC ............. *C09K 11/06* (2013.01); *H01L 51/0085* (2013.01); *H01L 51/5012* (2013.01);
(Continued)

(58) Field of Classification Search
None
See application file for complete search history.

(56) References Cited

U.S. PATENT DOCUMENTS

2002/0068192 A1 *  6/2002  Moriyama et al. ............ 428/690
2004/0214038 A1 * 10/2004  Kwong et al. ................. 428/690
(Continued)

FOREIGN PATENT DOCUMENTS

JP    2007221097      8/2007
JP    2009-16693 A    1/2009
(Continued)

OTHER PUBLICATIONS

International Search Report (PCT/ISA/210) issued by the International Searching Authority in corresponding International Application No. PCT/JP2010/062859 on Nov. 2, 2010.
(Continued)

*Primary Examiner* — Gregory Clark
(74) *Attorney, Agent, or Firm* — Riverside Law LLP

(57) ABSTRACT

As an organic electroluminescence device that has an excellent emission characteristic, suppresses a change in chromaticity when driving at a high temperature and has excellent durability, the organic electroluminescence device includes on a substrate a pair of electrodes and a light emitting layer disposed between the electrodes, in which the light emitting layer contains a compound represented by the following Formula (1) and a specific metal complex is provided.

$$(Cz)p\text{-}L\text{-}(A)q \qquad (1)$$

(In Formula (1), Cz represents a substituted or unsubstituted arylcarbazolyl group or a substituted or unsubstituted carbazolylaryl group. L represents a single bond, a substituted or unsubstituted arylene group, a substituted or unsubstituted cycloalkylene group or a substituted or unsubstituted aromatic heterocyclic ring. A is a substituted or unsubstituted nitrogen-containing aromatic heterocyclic six-membered ring, and each of p and q independently represent an integer of 1 to 6.)

19 Claims, 1 Drawing Sheet

(51) Int. Cl.
*H05B 33/14* (2006.01)
*H05B 33/20* (2006.01)
*H01L 51/00* (2006.01)

(52) U.S. Cl.
CPC ............... *H05B33/14* (2013.01); *H05B 33/20* (2013.01); *C09K 2211/1029* (2013.01); *C09K 2211/1044* (2013.01); *C09K 2211/1059* (2013.01); *C09K 2211/185* (2013.01); *H01L 51/0067* (2013.01); *H01L 51/0072* (2013.01); *H01L 51/0087* (2013.01)

(56) References Cited

U.S. PATENT DOCUMENTS

| | | | |
|---|---|---|---|
| 2004/0241495 | A1 | 12/2004 | Kwong et al. |
| 2006/0134461 | A1* | 6/2006 | Huo et al. ............... 428/690 |
| 2007/0172698 | A1 | 7/2007 | Iwakuma et al. |
| 2007/0190355 | A1 | 8/2007 | Ikeda et al. |
| 2007/0224448 | A1 | 9/2007 | Ikeda et al. |
| 2008/0261076 | A1 | 10/2008 | Kwong et al. |
| 2010/0044689 | A1* | 2/2010 | Nishimura et al. ............ 257/40 |

FOREIGN PATENT DOCUMENTS

| | | |
|---|---|---|
| JP | 2009031742 | 2/2009 |
| JP | 200994124 | 4/2009 |
| JP | 2009-99783 A | 5/2009 |
| JP | 2009-170815 A | 7/2009 |
| JP | 2009152572 | 7/2009 |
| WO | WO 2005/085387 A1 | 9/2005 |
| WO | WO 2005/112519 A1 | 11/2005 |
| WO | 2007143201 | 12/2007 |
| WO | WO 2008/109824 A2 | 9/2008 |
| WO | WO 2008/123178 A1 | 10/2008 |

OTHER PUBLICATIONS

Written Opinion (PCT/ISA/237) of the International Searching Authority, issued in corresponding International Application No. PCT/JP2010/062859 on Nov. 2, 2010.

English-language translation of the Written Opinion (PCT/ISA/237) of the International Searching Authority, issued in corresponding International Application No. PCT/JP2010/062859 on Nov. 2, 2010.

* cited by examiner

ORGANIC ELECTROLUMINESCENCE DEVICE

TECHNICAL FIELD

The present invention relates to an organic electroluminescence device (hereinafter, referred to as "device", or "organic EL device"), and an organic electroluminescence device that has high efficiency and high durability, and assuredly suppresses a change in chromaticity when driving at a high temperature.

BACKGROUND ART

Since organic electroluminescence devices are capable of obtaining a light emission with high luminance intensity by driving at a low voltage, the devices have been actively researched and developed recently. Generally, organic electroluminescence devices have an organic layer including a light emitting layer interposed between a pair of electrodes, and utilize, for light emission, energy of the exciton generated as a result of recombination of electrons injected from a cathode and holes injected from an anode in the organic layer.

Improvement in the efficiency of devices has been recently made by using a phosphorescence emitting material. As a phosphorescence emitting material, iridium complexes, platinum complexes and the like are known (for example, see Patent document 1). Further, among them, Ir(btp)$_2$(acac) is known as a red phosphorescent material.

In addition, a doping type device using a light emitting layer in which a light emitting material is doped into a host material has been widely adopted. Host material is actively developed, and as a host material for red phosphorescent device, examples of using CBP(4,4'-bis(N-carbazolyl)biphenyl) and Balq(Aluminum(III)bis(2-methyl-8-quinolinato)-4-phenylphenolate) have been well known (for example, see Patent document 2).

For example, Patent document 2 discloses an invention in which an aromatic polycyclic condensed ring-based material is used in a host material of a red phosphorescent material in order to manufacture a device having high efficiency and a long life-span. However, luminous efficiency of the device, and durability when driving at a high temperature of the device are not sufficient. Moreover, when considering a use for display or illumination, there is a problem in that chromaticity is changed according to driving, and thus, an improvement is required.

Conventionally, in the evaluations of the durability of the device, a change in chromaticity according to driving has been used as an evaluation item of the properties of organic electroluminescence devices along with increase in driving voltage or decrease in efficiency. Further, the evaluation of the environmental temperature from room temperature to a high temperature (mainly as a meaning of an acceleration test) has also been conducted. However, it has been unnoticed that variation in chromaticity increases when driving at a high temperature as compared with when driving at a lower temperature, and when considering the use of a in-vehicle panel which may be maintained at a high temperature of 80° C. or more, it may be expected that the change in chromaticity when driving at a high temperature becomes a serious problem.

RELATED ART

Patent Document

Patent Document 1: International Publication No. WO05/085387

Patent Document 2: Japanese Patent Application Laid-Open No. 2009-99783

DISCLOSURE OF INVENTION

Problems to be Solved by the Invention

As described in Patent document 2, it is known to be not preferable to introduce carbazole group that is liable to be oxidized from the viewpoint of durability of a device, and in the case where an aspect of the present invention is viewed in light of the common sense, efficiency in improvement of durability cannot be expected. Further, in an iridium complex-based phosphorescent material, it is assumed that decomposition caused by dissociation of a ligand, which is fate of a complex material, and generation of a quencher deteriorate performance of the device, and thus, it is known that there is a difficulty in use of the material in practice.

However, the present inventors found out that the effect of the improvement in durability is generated when a host material of the present invention containing a carbazole group is combined with a specific iridium complex material.

That is, an object of the present invention is to provide an organic electroluminescence device that has excellent light emission characteristics, suppresses a change in chromaticity when driving at a high temperature and has excellent durability.

Another object of the present invention is to provide a composition and a light emitting layer useful for the organic electroluminescence device. Yet another object of the present invention is to provide a method for forming a film of a compound useful for the organic electroluminescence device. Still another object of the present invention is to provide a light emission apparatus, a display apparatus and an illumination apparatus including the organic electroluminescence device.

Means for Solving the Problems

That is, the present invention is accomplished by the following means.

[1] An organic electroluminescence device, comprising on a substrate:

a pair of electrodes; and a light emitting layer disposed between the electrodes, wherein a compound represented by the following Formula (1) and a compound represented by Formula (PQ-1) are contained in the light emitting layer:

$$(Cz)p\text{-L-}(A)q \qquad (1)$$

in Formula (1), Cz represents a substituted or unsubstituted arylcarbazolyl group or a substituted or unsubstituted carbazolylaryl group;

L represents a single bond, a substituted or unsubstituted arylene group, a substituted or unsubstituted cycloalkylene group or a substituted or unsubstituted aromatic heterocyclic ring;

A is a substituted or unsubstituted nitrogen-containing aromatic heterocyclic six-membered ring; and each of p and q independently represents an integer of 1 to 6:

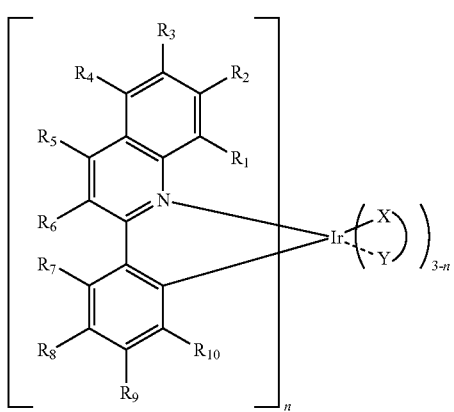

(PQ-1)

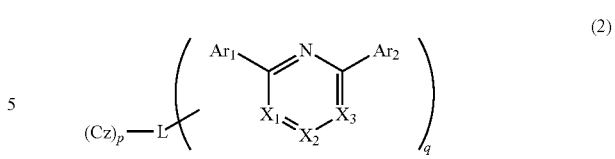

(2)

in the formula, each of $R_1$ to $R_{10}$ independently represents a hydrogen atom or a substituent, and the substituents may be bonded to each other to form a ring if possible;

X—Y represents a mono-anionic bidentate ligand; and n represents an integer of 1 to 3.

[2] The organic electroluminescence device as described in [1] above, wherein, in Formula (PQ-1), n=3.

[3] The organic electroluminescence device as described in [1] above, wherein, in Formula (PQ-1), n=2.

[4] The organic electroluminescence device as described in any one of [1] to [3] above, wherein, in Formula (PQ-1), $R_1$ to $R_6$ are hydrogen atoms.

[5] The organic electroluminescence device as described in any one of [1] to [4] above, wherein, in Formula (PQ-1), $R_9$ represents an aryl group.

[6] The organic electroluminescence device as described in any one of [1] to [5] above, wherein the compound represented by Formula (1) is a compound represented by the following Formula (2):

in Formula (2), Cz represents a substituted or unsubstituted arylcarbazolyl group or a substituted or unsubstituted carbazolylaryl group;

L represents a single bond, a substituted or unsubstituted arylene group, a substituted or unsubstituted cycloalkylene group or a substituted or unsubstituted aromatic heterocyclic ring, and is linked to a carbon atom of $Ar_1$, $Ar_2$, $X_1$, $X_2$ or $X_3$;

each of $Ar_1$ and $Ar_2$ independently represents a substituted or unsubstituted aryl group or a substituted or unsubstituted aromatic heterocyclic group;

each of $X_1$, $X_2$ and $X_3$ independently represents a nitrogen atom or a carbon atom to which a hydrogen atom or a substituent is bonded; and each of p and q independently represents an integer of 1 to 6.

[7] The organic electroluminescence device as described in [6] above, wherein the compound represented by Formula (2) is a compound represented by the following Formula (3):

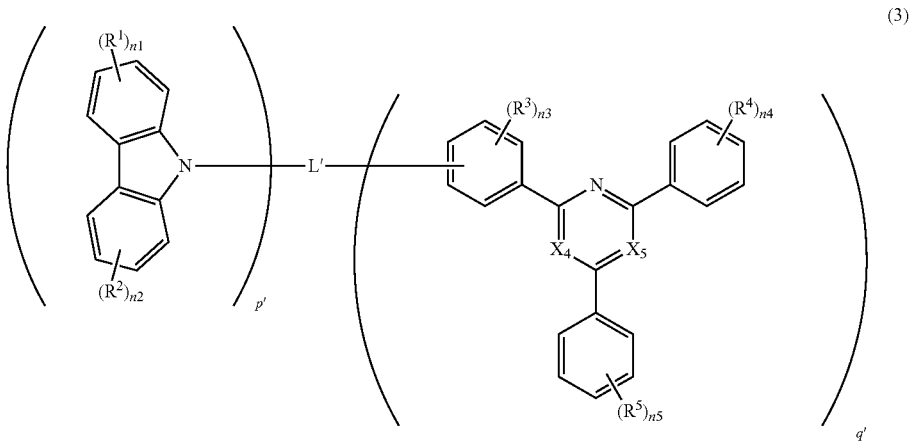

(3)

in Formula (3), each of $X_4$ and $X_5$ independently represents a nitrogen atom or a carbon atom to which a hydrogen atom or a substituent is bonded, and either one of $X_4$ and $X_5$ is a nitrogen atom, the other is a carbon atom to which a hydrogen atom or a substituent is bonded;

L' represents a single bond, a substituted or unsubstituted arylene group, a substituted or unsubstituted cycloalkylene group or a substituted or unsubstituted aromatic heterocyclic ring;

each of $R^1$ to $R^5$ independently represents a substituent;

each of n1 to n5 independently represents an integer of 0 to 5; and each of p' and q' independently represents an integer of 1 to 4.

[8] The organic electroluminescence device as described in any one of [1] to [7] above, wherein the (X—Y) is any one of acetylacetonate (acac), picolinate (pic) and a derivative thereof.

[9] The organic electroluminescence device as described in any one of [1] to [8] above,
wherein a compound represented by the following Formula (C-1) is further contained in the light emitting layer:

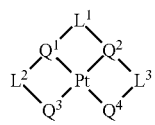

(C-1)

in Formula (C-1), each of $Q^1$, $Q^2$, $Q^3$ and $Q^4$ independently represents a ligand which is coordinated to Pt; and
each of $L^1$, $L^2$ and $L^3$ independently represents a single bond or a divalent linking group.

[10] The organic electroluminescence device as described in [9] above,
wherein the compound represented by Formula (C-1) is a compound represented by the following Formula (C-2):

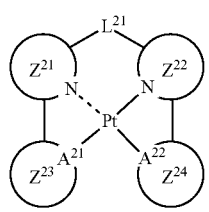

Formula (C-2)

in Formula (C-2), $L^{21}$ represents a single bond or a divalent linking group;
each of $A^{21}$ and $A^{22}$ independently represents a carbon atom or a nitrogen atom;
each of $Z^{21}$ and $Z^{22}$ independently represents a nitrogen-containing aromatic heterocyclic ring; and
each of $Z^{23}$ and $Z^{24}$ independently represents a benzene ring or an aromatic heterocyclic ring.

[11] The organic electroluminescence device as described in any one of [1] to [10] above, further comprising:
a layer containing a compound represented by Formula (1) between the light emitting layer and a cathode.

[12] A composition, comprising:
the compound represented by Formula (1); and
the compound represented by Formula (PQ-1), as defined in any one of [1] to [11] above.

[13] The composition as described in [12] above, further comprising:
the compound represented by Formula (C-1).

[14] A light emitting layer, comprising:
the compound represented by Formula (1); and
the compound represented by Formula (PQ-1), as defined in any one of [1] to [11] above.

[15] The light emitting layer as described in [14] above, further comprising:
the compound represented by Formula (C-1).

[16] A method for forming a film, comprising:
simultaneously heating the compound represented by Formula (1) and the compound represented by Formula (PQ-1) as defined in any one of [1] to [11] above so as to sublimate the compounds.

[17] A light emission apparatus using the organic electroluminescence device as described in any one of [1] to [11] above.

[18] A display apparatus using the organic electroluminescence device as described in any one of [1] to [11] above.

[19] An illumination apparatus using the organic electroluminescence device as described in any one of [1] to [11] above.

Effects of the Invention

The organic electroluminescence device of the present invention has high external quantum efficiency and excellent durability. Further, since a change in chromaticity is small when driving at a high temperature, stable performance may be exhibited for the use where the driving durability is required in a high temperature environment, such as an in-vehicle use.

EMBODIMENTS FOR CARRYING OUT THE INVENTION

Figure 1:
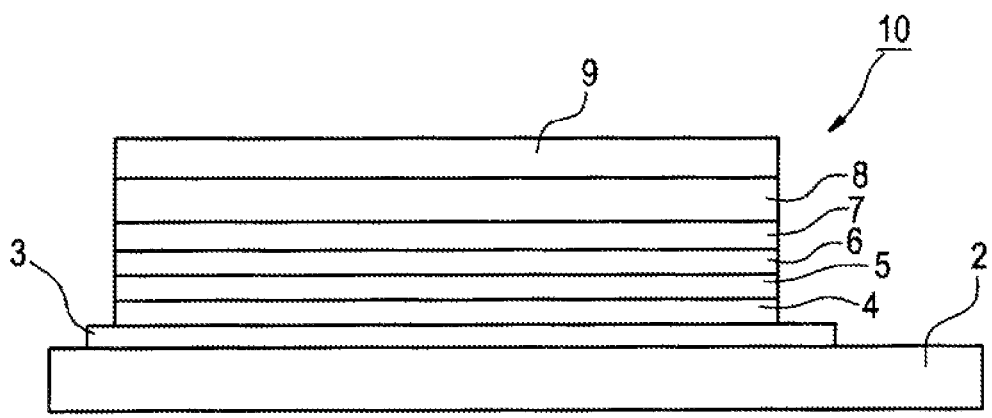
FIG. 1 is a schematic view illustrating an example (first exemplary embodiment) of a layer configuration of an organic EL device according to the present invention.

In the present invention, the groups A and B of substituents will be defined below.

(Group A of Substituents)

Examples may include an alkyl group (preferably the number of carbon atoms is 1 to 30, more preferably the number of carbon atoms is 1 to 20, and particularly preferably the number of carbon atoms is 1 to 10, and examples may include, for example, methyl, ethyl, isopropyl, tert-butyl, n-octyl, n-decyl, n-hexadecyl, cyclopropyl, cyclopentyl and cyclohexyl), an alkenyl group (preferably the number of carbon atoms is 2 to 30, more preferably the number of carbon atoms is 2 to 20, and particularly preferably the number of carbon atoms is 2 to 10, and examples may include, for example, vinyl, allyl, 2-buthenyl and 3-pentenyl), an alkynyl group (preferably the number of carbon atoms is 2 to 30, more preferably the number of carbon atoms is 2 to 20, and particularly preferably the number of carbon atoms is 2 to 10, and examples may include, for example, propargyl and 3-pentynyl), an aryl group (preferably the number of carbon atoms is 6 to 30, more preferably the number of carbon atoms is 6 to 20, and particularly preferably the number of carbon atoms is 6 to 12, and examples may include, for example, phenyl, p-methylphenyl, naphthyl and anthryl), an amino group (preferably the number of carbon atoms is 0 to 30, more preferably the number of carbon atoms is 0 to 20, and particularly preferably the number of carbon atoms is 0 to 10, and examples may include, for example, amino, methylamino, dimethylamino, diethylamino, dibenzylamino, diphenylamino and ditolylamino), an alkoxy group (preferably the number of carbon atoms is 1 to 30, more preferably the number of carbon atoms is 1 to 20, and particularly preferably the number of carbon atoms is 1 to 10, and examples may include, for example, methoxy, ethoxy, butoxy and 2-ethylhexyloxy), an aryloxy group (preferably the number of carbon atoms is 6 to 30, more preferably the number of carbon atoms is 6 to 20, and particularly preferably the number of carbon atoms is 6 to 12, and examples may include, for example, phenyloxy, 1-naphthyloxy and 2-naphthyloxy), a heterocyclic oxy group (preferably the number of carbon atoms is 1 to 30, more preferably the number of carbon atoms is 1 to 20, and particularly preferably the number of carbon atoms is 1 to 12, and examples may include, for example, pyridyloxy, pyrazyloxy, pyrimidyloxy and quinolyloxy), an acyl group (preferably the number of carbon atoms is 2 to 30, more preferably the number of carbon atoms is 2 to 20, and particularly preferably the number of carbon atoms is 2 to 12, and examples may include, for example, acetyl, benzoyl, formyl and pyvaloyl), an alkoxycarbonyl group (preferably the number of carbon atoms is 2 to 30, more preferably the number of carbon atoms is 2 to 20, and particularly preferably the number of carbon atoms is 2 to 12, and examples may include, for example, methoxycarbonyl and ethoxycarbonyl), an aryloxycarbonyl group (preferably the number of carbon atoms is 7 to 30, more preferably the number of carbon atoms is 7 to 20, and particularly preferably the number of carbon atoms is 7 to 12, and examples may include, for example, phenyloxycarbonyl), an acyloxy group (preferably the number of carbon atoms is 2 to 30, more preferably the number of carbon atoms is 2 to 20, and particularly preferably the number of carbon atoms is 2 to 10, and examples may include, for example, acetoxy and benzoyloxy), an acylamino group (preferably the number of carbon atoms is 2 to 30, more preferably the number of carbon atoms is 2 to 20, and particularly preferably the number of carbon atoms is 2 to 10, and examples may include, for example, acetylamino and benzoylamino), an alkoxycarbonylamino group (preferably the number of carbon atoms is 2 to 30, more preferably the number of carbon atoms is 2 to 20, and particularly preferably the number of carbon atoms is 2 to 12, and examples may include, for example, methoxycarbonylamino), an aryloxycarbonylamino group (preferably the number of carbon atoms is 7 to 30, more preferably the number of carbon atoms is 7 to 20, and particularly preferably the number of carbon atoms is 7 to 12, and examples may include, for example, phenyloxycarbonylamino), a sulfonylamino group (preferably the number of carbon atoms is 1 to 30, more preferably the number of carbon atoms is 1 to 20, and particularly preferably the number of carbon atoms is 1 to 12, and examples may include, for example, methanesulfonylamino and benzenesulfonylamino), a sulfamoyl group (preferably the number of carbon atoms is 0 to 30, more preferably the number of carbon atoms is 0 to 20, and particularly preferably the number of carbon atoms is 0 to 12, and examples may include, for example, sulfamoyl, methylsulfamoyl, dimethylsulfamoyl and phenylsulfamoyl), a carbamoyl group (preferably the number of carbon atoms is 1 to 30, more preferably the number of carbon atoms is 1 to 20, and particularly preferably the number of carbon atoms is 1 to 12, and examples may include, for example, carbamoyl, methylcarbamoyl, diethylcarbamoyl and phenylcarbamoyl), an alkylthio group (preferably the number of carbon atoms is 1 to 30, more preferably the number of carbon atoms is 1 to 20, and particularly preferably the number of carbon atoms is 1 to 12, and examples may include, for example, methylthio and ethylthio), an arylthio group (preferably the number of carbon atoms is 6 to 30, more preferably the number of carbon atoms is 6 to 20, and particularly preferably the number of carbon atoms is 6 to 12, and examples may include, for example phenylthio, a heterocyclic thio group (preferably the number of carbon atoms is 1 to 30, more preferably the number of carbon atoms is 1 to 20, and particularly preferably the number of carbon atoms is 1 to 12, and examples may include, for example, pyridylthio, 2-benzimidazolylthio, 2-benzoxazolylthio and 2-benzthiazoleylthio), sulfonyl group (preferably the number of carbon atoms is 1 to 30, more preferably the number of carbon atoms is 1 to 20, and particularly preferably the number of carbon atoms is 1 to 12, and examples may include, for example, mesyl and tosyl), a sulfinyl group (preferably the number of carbon atoms is 1 to 30, more preferably the number of carbon atoms is 1 to 20, and particularly preferably the number of carbon atoms is 1 to 12, and examples may include, for example, methanesulfinyl and benzenesulfinyl), a ureido group (preferably the number of carbon atoms is 1 to 30, more preferably the number of carbon atoms is 1 to 20, and particularly preferably the number of carbon atoms is 1 to 12, and examples may include, for example, ureido, methylureido and phenylureido), a phosphoric acid amide group (preferably the number of carbon atoms is 1 to 30, more preferably the number of carbon atoms is 1 to 20, and particularly preferably the number of carbon atoms is 1 to 12, and examples may include, for example, diethylphosphoric acid amide and phenylphosphoric acid amide), a hydroxy group, a mercapto group, a halogen atom (examples may include, for example, a fluorine atom, a chlorine atom, a bromine atom and an iodine atom), a cyano group, a sulfo group, a carboxyl group, a nitro group, a hydroxamic acid group, a sulfino group, a hydrazino group, an imino group, a heterocyclic group (aromatic heterocyclic group is included, preferably the number of carbon atoms is 1 to 30, and more preferably the number of carbon atoms is 1 to 12, and examples of the heteroatom may include, for example, a nitrogen atom, an oxygen atom, a sulfur atom, a phosphorus atom, a silicon atom, a selenium atom and a tellurium atom, and specifically, examples may include pyridyl, pyrazynyl, pyrimidyl, pyridazynyl, pyrrolyl, pyrazolyl, triazolyl, imidazolyl, oxazolyl, thiazoleyl, isoxazolyl, isothiazoleyl, quinolyl, furyl, thienyl, selenophenyl, tellurophenyl, piperidyl, piperidino, morpholino, pyridyl, pyrrolidino, benzoxazoleyl, benzoimidazolyl, benzothiazoleyl, carbazolyl group, azepinyl group and silolyl group), a silyl group (preferably the number of carbon atoms is 3 to 40, more preferably the number of carbon atoms is 3 to 30, and particularly preferably the number of carbon atoms is 3 to 24, and examples may include, for example, trimethylsilyl and triphenylsilyl), a silyloxy group (preferably the number of carbon atoms is 3 to 40, more preferably the number of carbon atoms is 3 to 30, and particularly preferably the number of carbon atoms is 3 to 24, and examples may include, for example, trimethylsilyloxy and triphenylsilyloxy), and a phosphoryl group (examples may include, for example, diphenylphosphoryl group and dimethylphosphoryl group). These substituents may be further substituted, and as the further substituents, a group selected from the aforementioned group A of substituents can be exemplified.

(Group B of Substituents)

Examples may include an alkyl group (preferably the number of carbon atoms is 1 to 30, more preferably the number of carbon atoms is 1 to 20, and particularly preferably the number of carbon atoms is 1 to 10, and examples may include, for example, methyl, ethyl, isopropyl, tert-butyl, n-octyl, n-decyl, n-hexadecyl, cyclopropyl, cyclopentyl and cyclohexyl), an alkenyl group (preferably the number of carbon atoms is 2 to 30, more preferably the number of carbon atoms is 2 to 20, and particularly preferably the number of carbon atoms is 2 to 10, and examples may include, for example, vinyl, allyl, 2-buthenyl and 3-pentenyl), an alkynyl group (preferably the number of carbon atoms is 2 to 30, more preferably the number of carbon atoms is 2 to 20, and particularly preferably the number of carbon atoms is 2 to 10, and examples may include, for example propargyl and 3-pentynyl), an aryl group (preferably the number of carbon atoms is 6 to 30, more preferably the number of carbon atoms is 6 to 20, and particularly preferably the number of carbon atoms is 6 to 12, and examples may include, for example, phenyl, p-methylphenyl, naphthyl, and anthryl), a cyano group, and a heterocyclic group (aromatic heterocyclic group is included, preferably the number of carbon atoms is 1 to 30, and more preferably the number of carbon atoms is 1 to 12, and examples of the heteroatom may include, for example, a nitrogen atom, an oxygen atom, a sulfur atom, a phosphorus atom, a silicon atom, a selenium atom and a tellurium atom, and specifically, examples may include pyridyl, pyrazynyl, pyrimidyl, pyridazynyl, pyrrolyl, pyrazolyl, triazolyl, imidazolyl, oxazolyl, thiazoleyl, isoxazolyl, isothiazoleyl, quinolyl, furyl, thienyl, selenophenyl, tellurophenyl, piperidyl, piperidino, morpholino, pyrrolidyl, pyrrolidino, benzoxazoleyl, benzoimidazolyl, benzothiazoleyl, carbazolyl group, azepinyl group and silolyl group). These substituents may be further substituted, and as the further substituents, a group selected from the aforementioned group B of substituents can be exemplified.

A hydrogen atom in the descriptions of the following Formulas (1) to (3), Formulas (PQ-1) and (PQ-2), Formulas (C-1) to (C-6), and Formula (IV) also includes isotopes (a deuterium atom and the like), and furthermore, an atom constituting a substituent also includes isotopes thereof.

In the present invention, "the number of carbon atoms" of a substituent, such as the alkyl group, is used as a meaning to include the case where the substituent such as the alkyl group may be substituted with another substituent, and to include the number of carbon atoms of the another substituent as well.

Further, the "heteroalkyl" group refers to an alkyl group in which at least one carbon is substituted by O, NR or S.

The organic electroluminescence device of the present invention is an organic electroluminescence device that includes, on a substrate, a pair of electrodes and a light emitting layer between the electrodes, and contains a compound represented by the following Formula (1) and a compound represented by Formula (PQ-1) in the light emitting layer.

An organic electroluminescence device having high external quantum efficiency and excellent durability may be obtained by using the compound represented by Formula (1) and the compound represented by Formula (PQ-1) for the light emitting layer. Further, it is possible to provide the organic electroluminescence device having a small change in chromaticity when driving at a high temperature.

Hereinafter, the compound represented by Formula (1) will be described.

[Compound Represented by Formula (1)]

(Cz)$p$-L-(A)$q$           (1)

In Formula (1), Cz represents a substituted or unsubstituted arylcarbazolyl group or a substituted or unsubstituted carbazolylaryl group. L represents a single bond, a substituted or unsubstituted arylene group, a substituted or unsubstituted cycloalkylene group or a substituted or unsubstituted aromatic heterocyclic ring. A is a substituted or unsubstituted nitrogen-containing aromatic heterocyclic six-membered ring, and each of p and q independently represents an integer of 1 to 6.

Formula (1) will be described.

Cz is a substituted or unsubstituted arylcarbazolyl group or a substituted or unsubstituted carbazolylaryl group.

The aryl group in the arylcarbazolyl group, and carbazolylaryl group has preferably 6 to 30 carbon atoms, and may be, for example, a phenyl group, a naphthyl group, an anthryl group, a phenanthryl group, a naphthacenyl group, a pyrenyl group, a fluorenyl group, a biphenyl group, a terphenyl group, and among them, preferably phenyl group, naphthyl group, biphenyl group and terphenyl group, and more preferably a phenyl group and a biphenyl group.

The substitution position of the aryl group on the carbazole ring (carbazolyl group) in the arylcarbazolyl group and carbazolylaryl group is not particularly limited, but from the viewpoint of chemical stability or carrier transportability, it is preferable that the aryl group is substituted at the 2-, 3-, 6-, 7- or 9-position of the carbazole ring, it is more preferable that the aryl group is substituted at the 3-, 6- or 9-position of the carbazole ring, and it is most preferable that the aryl group is substituted at the 9-position (N-position) of the carbazole ring.

When Cz is the arylcarbazolyl group, the position is not particularly limited, but from the viewpoint of chemical stability or carrier transportability, it is preferable that the group is linked to L at the 2-, 3-, 6-, 7- or 9-position (N-position) of the carbazole ring of the arylcarbazolyl group, it is more preferable that the group is linked to L at the 3-, 6- or 9-position (N-position) of the carbazole ring, and it is most preferable that the group is linked to L at the 9-position (N-position) of the carbazole ring.

Further, it is preferable that Cz is a carbazolylaryl group which may be substituted with an alkyl group, a silyl group, an aryl group, a halogen atom, a cyano group or a carbazolyl group, and it is more preferable that Cz is a carbazolylaryl group which may be substituted with an ethyl group, a t-butyl group, a triphenylsilyl group, a phenyl group, a fluorine atom, a cyano group or a carbazolyl group.

A is a substituted or unsubstituted nitrogen-containing aromatic heterocyclic six-membered ring, and preferably a nitrogen-containing aromatic heterocyclic six-membered ring having 2 to 40 carbon atoms. A may have a plurality of substituents, and the substituents may be linked to each other to form a ring.

The nitrogen-containing aromatic heterocyclic six-membered ring or nitrogen-containing aromatic heterocyclic ring containing the nitrogen-containing aromatic heterocyclic six-membered ring may be pyridine, pyrimidine, pyrazine, pyridazine, triazine, azaindolizine, indolizine, purine, pteridine, β-carboline, naphthyridine, quinoxaline, terpyridine, bipyridine, acridine, phenanthroline, phenazine and imidazopyridine, and among them, more preferably pyridine, pyrimidine, pyrazine and triazine, even more preferably pyridine and pyrimidine, and most preferably pyrimidine.

L is a single bond, a substituted or unsubstituted arylene group, a substituted or unsubstituted cycloalkylene group and a substituted or unsubstituted aromatic heterocyclic ring.

Further, in Formula (1), when p+q is 3 or more, L represents a p+q valent group obtained by subtracting any p+q−2 hydrogen atoms from the arylene group, a p+q valent group obtained by subtracting any p+q−2 hydrogen atoms from the cycloalkylene group, or a p+q valent aromatic heterocyclic group.

As a substituent of L, those exemplified above for the group A of substituents may be applied, and the substituent may be preferably a methyl group, an ethyl group, a propyl group, a butyl group, a cyclohexyl group, a cyclopentyl group, a phenyl group, a tolyl group, a xylyl group, a pyridyl group, a pyrimidyl group, a thienyl group, a fluorine atom, a cyano group, a trifluoromethyl group, a pentafluorophenyl group, a triphenylsilyl group and a trimethylsilyl group, more preferably a methyl group, an ethyl group, a butyl group, a phenyl group, a pyridyl group, a pyrimidyl group, a fluorine atom, a cyano group and a trifluoromethyl group, and even more preferably a methyl group, a phenyl group and a fluorine atom.

The arylene group is preferably an arylene group having 6 to 30 carbon atoms, and may include, for example, a phenylene group, a biphenylene group, a terphenylene group, a naphthylene group, an anthracenylene group, a phenanthrene group, a vinylene group, a chrysenylene group, a fluoranthenylene group, and a perfluoroarylene group, and among them, preferably a phenylene group, a biphenylene group, a terphenylene group and a perfluoroarylene group, more preferably a phenylene group, a biphenylene group and a terphenylene group, and even more preferably a phenylene group and a biphenylene group.

The cycloalkylene group is preferably an cycloalkylene group having 5 to 30 carbon atoms, and may include, for example, a cyclopentylene group, a cyclohexylene group and a cycloheptylene group, and among them, preferably a cyclopentylene group and cyclohexylene group, and more preferably a cyclohexylene group.

The aromatic heterocyclic is preferably an aromatic heterocyclic having 2 to 30 carbon atoms and may include a 1-pyrrolyl group, a 2-pyrrolyl group, a 3-pyrrolyl group, a pyrazynyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrydinyl group, a 2-acrydinyl group, a 3-acrydinyl group, a 4-acrydinyl group, a 9-acrydinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group and a 4-t-butyl-3-indolyl group, and among them, preferably a pyridinyl group, a quinolyl group, an indolyl group and a carbazolyl group, and more preferably a pyridinyl group and a carbazolyl group.

L is preferably a single bond, a phenylene group, a biphenylene group, a cyclopentylene group, a cyclohexylene group, a pyridinyl group and a carbazolyl group, more preferably a single bond, a phenylene group and a biphenylene group, and even more preferably a single bond and a phenylene group.

Further, the substituents of Cz, A and L in Formula (1) may include a halogen atom such as fluorine, chlorine, bromine and iodine, a carbazolyl group, a hydroxyl group, a substituted or unsubstituted amino group, a nitro group, a cyano group, a silyl group, a trifluoromethyl group, a carbonyl group, a carboxyl group, a substituted or unsubstituted alkyl group, a substituted or unsubstituted alkenyl group, a substituted or unsubstituted arylalkyl group, a substituted or unsubstituted aromatic group, a substituted or unsubstituted aromatic heterocyclic group, a substituted or unsubstituted aralkyl group, a substituted or unsubstituted aryloxy group and a substituted or unsubstituted alkyloxy group. Among them, a fluorine atom, a methyl group, a perfluorophenylene group, a phenyl group, a naphthyl group, a pyridyl group, a pyrazyl group, a pyrimidyl group, an adamantyl group, a benzyl group, a nitro group, a cyano group, a silyl group, a trifluoromethyl group, a carbazolyl group and a group formed in combinations thereof are preferable, a fluorine atom, a methyl group, a phenyl group, a pyridyl group, a pyrimidyl group, a cyano group, a silyl group, a carbazolyl group and a group formed in combinations thereof are more preferable, a phenyl group, a pyridyl group, a pyrimidyl group, a carbazolyl group and a group formed in combinations thereof are even more preferable, and a phenyl group is most preferable. In addition, when a plurality of substituents are contained, these substituents may be bonded to each other to form a ring.

Each of p and q independently represents an integer of 1 to 6, preferably 1 to 4, more preferably 1 to 3, and even more preferably 1 or 2.

It is more preferable that the compound represented by Formula (1) is a compound represented by the following Formula (2).

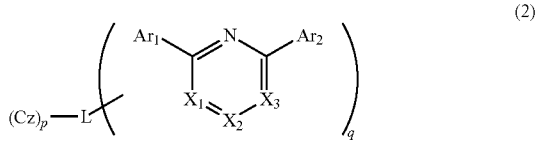

(2)

In Formula (2), Cz represents a substituted or unsubstituted arylcarbazolyl group or a substituted or unsubstituted carbazolylaryl group. L represents a single bond, a substituted or unsubstituted arylene group, a substituted or unsubstituted cycloalkylene group or a substituted or unsubstituted aromatic heterocyclic ring, and is linked to carbon atoms of $Ar_1$, $Ar_2$, $X_1$, $X_2$ or $X_3$. Each of $Ar_1$ and $Ar_2$ independently represents a substituted or unsubstituted aryl group or a substituted or unsubstituted aromatic heterocyclic group, each of $X_1$, $X_2$ and $X_3$ independently represents a nitrogen atom or a carbon atom to which a hydrogen atom or a substituent is bonded. Each of p and q independently represents an integer of 1 to 6.

Formula (2) will be described.

In Formula (2), definitions of Cz, L, p and q are the same as those of Cz, L, p and q in Formula (1), and preferable groups are the same, too.

Each of $Ar_1$ and $Ar_2$ independently represents a substituted or unsubstituted aryl group, a substituted or unsubstituted arylene group or a substituted or unsubstituted aromatic heterocyclic group.

The aryl group preferably has 6 to 30 substituted or unsubstituted carbon atoms and may include, for example, a phenyl group, a biphenyl group, a terphenyl group, a naphthyl group, an anthryl group, a phenanthryl group, a pyrenyl group, a chrysenyl group, a fluoranthenyl group and a perfluoroaryl group, and among them, preferably a phenyl group, a biphenyl group, a terphenyl group and a perfluoroaryl group, more preferably a phenyl group, a biphenyl group and a terphenyl group, and even more preferably a phenyl group and a biphenyl group.

The arylene group preferably has 6 to 30 substituted or unsubstituted carbon atoms and particular examples or preferable groups are the same as those in the description of L in the aforementioned Formula (1).

The aromatic heterocyclic group preferably has 2 to 30 substituted or unsubstituted carbon atoms, and particular examples or preferable groups are the same as those in the description of L in the aforementioned Formula (1). In the case where a substituent is bonded thereto, particular examples or preferable groups of the substituent are the same as the substituents of Cz, A and L in the aforementioned Formula (1).

Each of $Ar_1$ and $Ar_2$ preferably independently represents a phenyl group which may be substituted with a halogen atom or an unsubstituted terphenyl group, and more preferably a phenyl group which may be substituted with a fluorine atom.

Each of $X_1$, $X_2$ and $X_3$ independently represents a nitrogen atom or a carbon atom to which a hydrogen atom or a substituent is bonded. The case where 0 to 2 of $X_1$, $X_2$ and $X_3$ are a nitrogen atom is preferable, the case where 0 to 1 of $X_1$, $X_2$ and $X_3$ is a nitrogen atom is more preferable, and the case where 1 of $X_1$, $X_2$ and $X_3$ is a nitrogen atom is most preferable. In the case where a nitrogen atom is contained in any one of $X_1$, $X_2$ and $X_3$, it is preferable that either one of $X_1$ and $X_3$ is a nitrogen atom. In Formula (2), it is preferable that the ring containing $X_1$ to $X_3$ represents pyridine or pyrimidine, and it is more preferable that the ring containing $X_1$ to $X_3$ represents pyrimidine. Particular examples or preferable groups of the substituent bonded to a carbon atom are the same as the substituents of Cz, A and L in the aforementioned Formula (1). Further, the connection position of L in Formula (2) is not particularly limited, but from the viewpoint of chemical stability or carrier transportability, it is preferable that L is linked to a carbon atom of $Ar_1$.

The compound represented by Formula (2) is more preferably a compound represented by the following Formula (3).

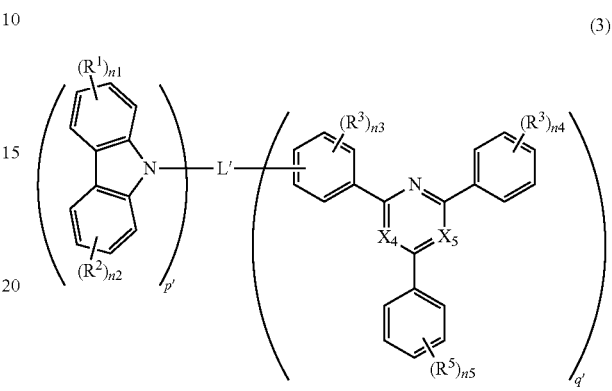

(3)

In Formula (3), each of $X_4$ and $X_5$ independently represents a nitrogen atom or a carbon atom to which a hydrogen atom or a substituent is bonded, and either one of $X_4$ and $X_5$ is a nitrogen atom, the other is a carbon atom to which a hydrogen atom or a substituent is bonded. L' represents a single bond, a substituted or unsubstituted arylene group, a substituted or unsubstituted cycloalkylene group or a substituted or unsubstituted aromatic heterocyclic ring. Each of $R^1$ to $R^5$ independently represents a substituent. Each of n1 to n5 independently represents an integer of 0 to 5. Each of p' and q' independently represents an integer of 1 to 4.

Formula (3) will be described.

Each of $X_4$ and $X_5$ independently represents a nitrogen atom or a carbon atom to which a hydrogen atom or a substituent is bonded. It is preferable that either one of $X_4$ and $X_5$ is a nitrogen atom, and the other is a carbon atom to which a hydrogen atom or a substituent is bonded. In Formula (3), it is preferable that the ring containing $X_4$ and $X_5$ represents pyridine or pyrimidine, and it is more preferable that the ring containing $X_4$ and $X_5$ represents pyrimidine. Particular examples or preferable groups of the substituent bonded to the carbon atom are the same as the substituents of Cz, A and L in the aforementioned Formula (1).

The definition of L' is the same as that of L in Formula (1), and the preferable group is the same as L. L' is linked to the benzene ring in the nitrogen-containing aromatic heterocyclic structure of Formula (3).

Each of $R^1$ to $R^5$ independently represents a substituent. The particular examples of the substituent are the same as examples of the substituents of Cz and A in Formula (1). $R^1$ to $R^5$ is preferably a fluorine atom, a methyl group, a t-butyl group, a phenyl group, a pyridyl group, a pyrazyl group, a pyrimidyl group, an adamantyl group, a cyano group, a trimethylsilyl group, a triphenylsilyl group, a trifluoromethyl group and a carbazolyl group, more preferably a fluorine atom, a methyl group, a t-butyl group, a phenyl group, a pyridyl group, a cyano group, a trimethylsilyl group, a triphenylsilyl group, a trifluoromethyl group and a carbazolyl group, even more preferably a fluorine atom, a methyl group, a t-butyl group, a phenyl group, a cyano group, a silyl group, a triphenylsilyl group, a trifluoromethyl group and a carbazolyl group, and still even more preferably a fluorine atom, a t-butyl group, a phenyl group, a cyano group, a triphenylsilyl group and a carbazolyl group. When there are a plurality of $R^1$ to $R^5$, each of $R^1$ to $R^5$ may be the same as or different from every other $R^1$ to $R^5$.

Each of n1 to n5 independently represents an integer of 0 to 5. The integer is preferably 0 to 2, more preferably 0 to 1, and even more preferably 0.

Each of p' and q' independently represents an integer of 1 to 4. The integer is preferably 1 to 3, and more preferably 1 or 2.

Preferably, in Formula (3), each of $X_4$ and $X_5$ independently represents a nitrogen atom or a carbon atom to which a hydrogen atom is bonded, the ring containing $X_4$ and $X_5$ is pyridine or pyrimidine, L' represents a single bond or a phenylene group, each of $R^1$ to $R^5$ independently represents a fluorine atom, a methyl group, a phenyl group, a cyano group, a pyridyl group, a pyrimidyl group, a silyl group, a carbazolyl group or a tert-butyl group, each of n1 to n5 independently represents 0 or 1, and each of p' and q' independently represents 1 or 2.

Further, in Formula (3), in the case where p'+q' is 3 or more, L' represents a p'+q' valent group obtained by subtracting any p'+q'−2 hydrogen atoms from the phenylene group.

The case where the compound represented by Formula (1) is formed of only carbon atoms, hydrogen atoms and nitrogen atoms is most preferable.

A molecular weight of the compound represented by Formula (1) is preferably 400 or more and 1,000 or less, more preferably 450 or more and 800 or less, and even more preferably 500 or more and 700 or less.

The lowermost triplet excited state ($T_1$) energy of the compound represented by Formula (1) in a film state is preferably 2.61 eV (62 kcal/mol) or more and 3.51 eV (80 kcal/mol) or less, more preferably 2.69 eV (63.5 kcal/mol) or more and 3.51 eV (80 kcal/mol) or less, and even more preferably 2.76 eV (65 kcal/mol) or more and 3.51 eV (80 kcal/mol).

A glass transition temperature (Tg) of the compound represented by Formula (1) is preferably 80° C. or more and 400° C. or less, more preferably 100° C. or more and 400° C. or less, and even more preferably 120° C. or more and 400° C. or less.

When Formula (1) has hydrogen atoms, isotopes (deuterium atom etc.) are also included. In this case, all hydrogen atoms of the compound may be substituted with an isotope, and may be a mixture in which a portion of the compound contains an isotope.

Hereinafter, particular examples of the compound represented by Formula (1) are exemplified, but the present invention is not limited thereto. Further, Ph in the following particular examples represents a phenyl group.

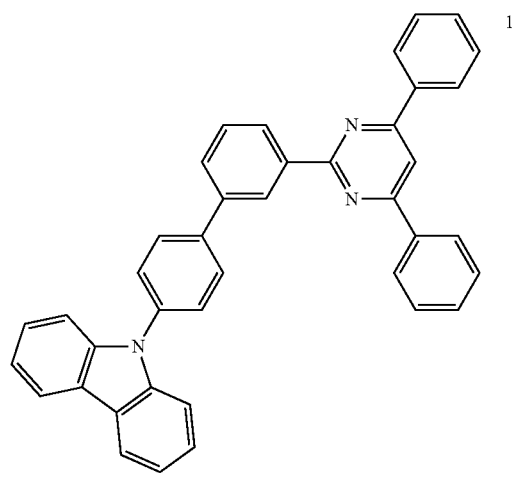

1

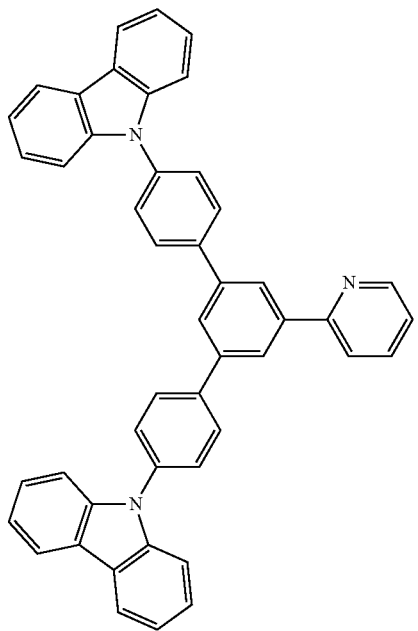

2

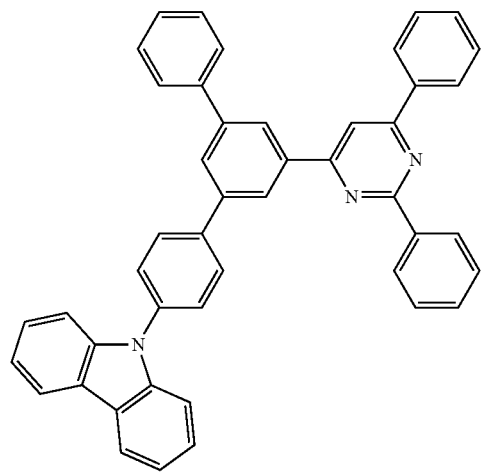

3

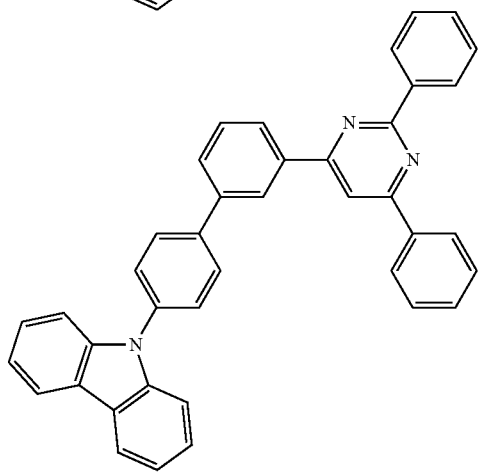

4

-continued
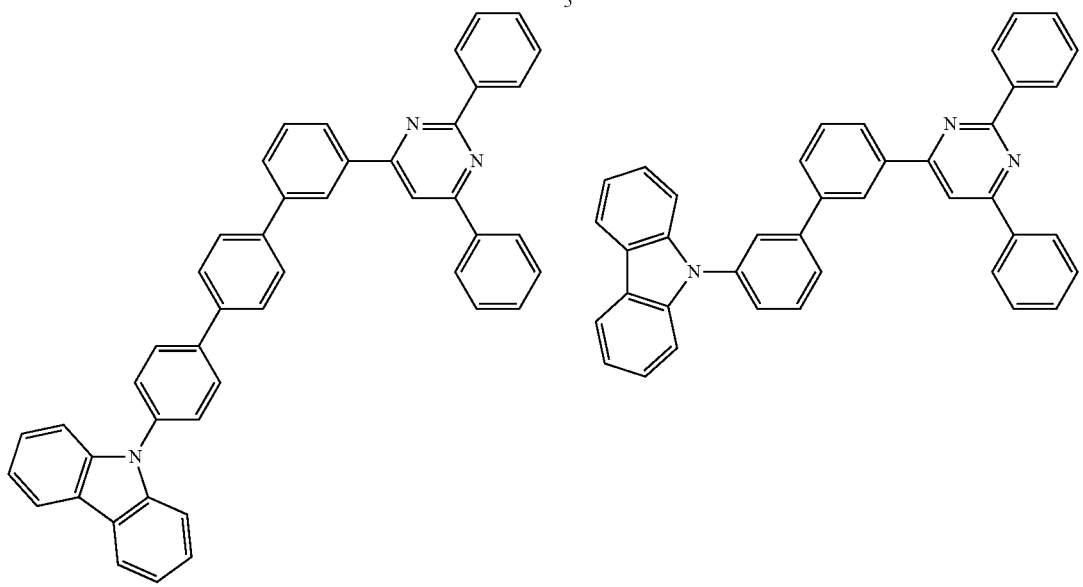
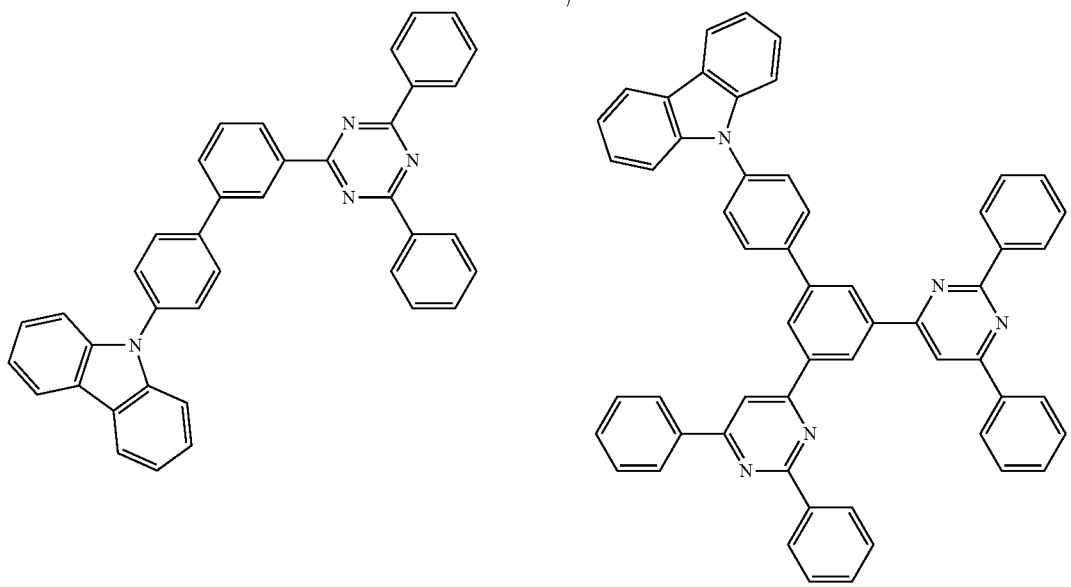
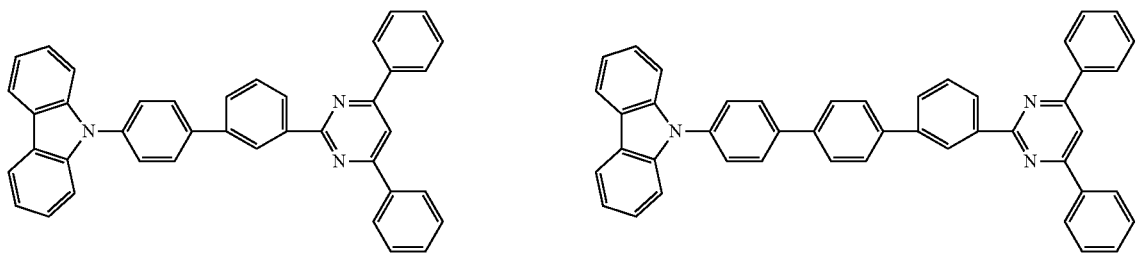

-continued
11
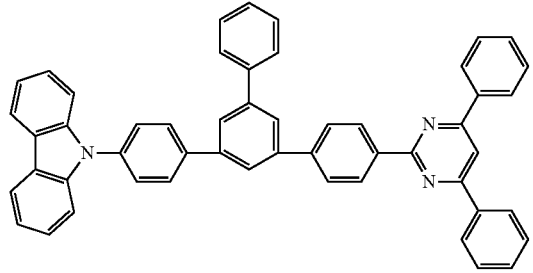
12
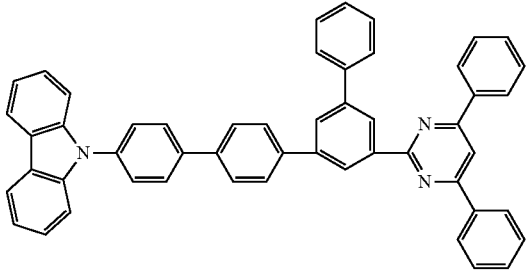
13
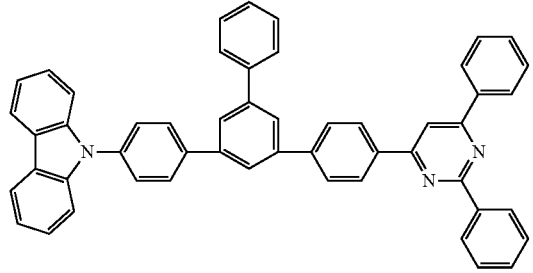
14
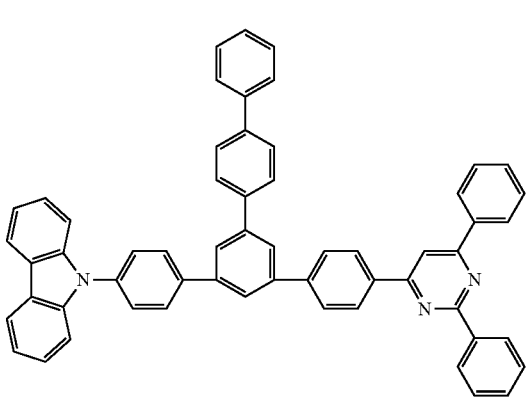
15
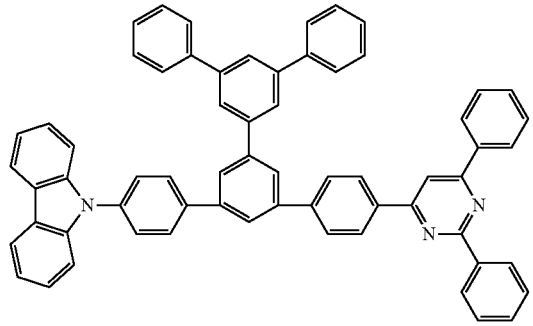
16
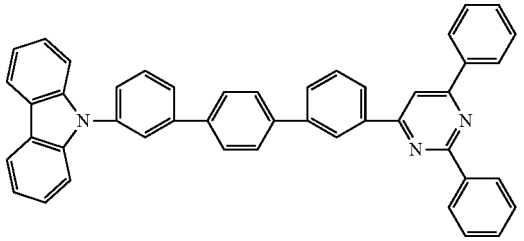
17
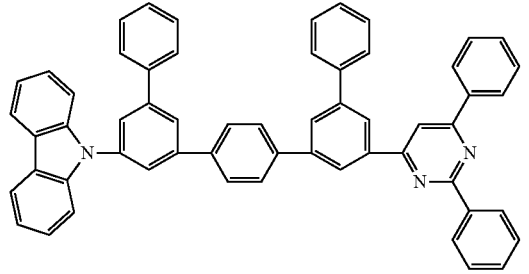
18
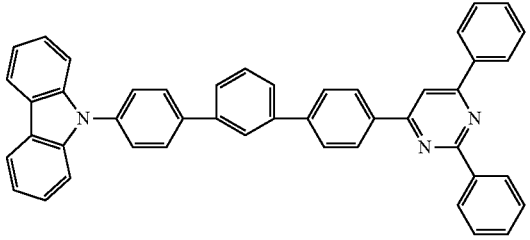
19
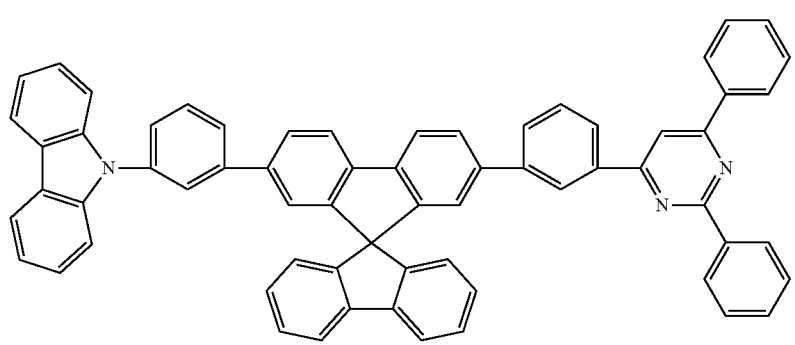

-continued
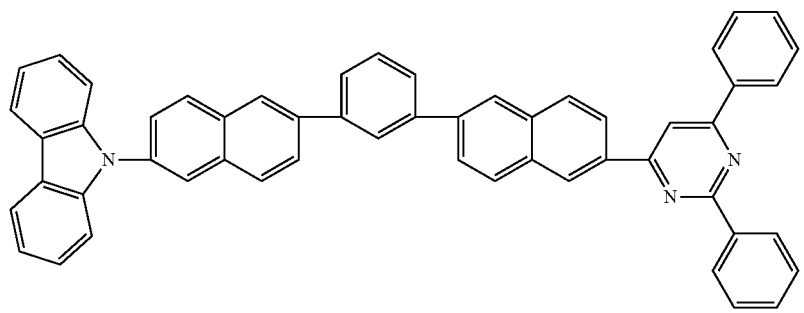
20
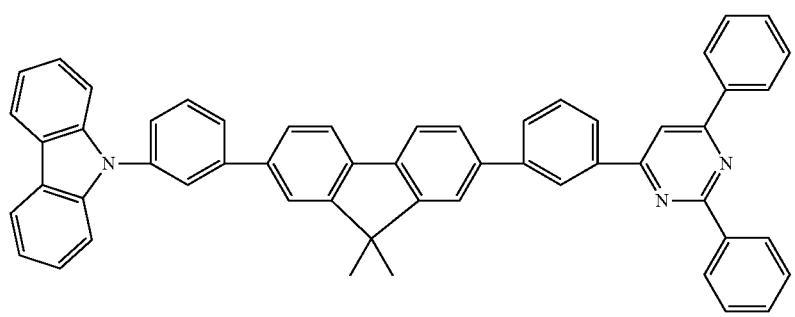
21
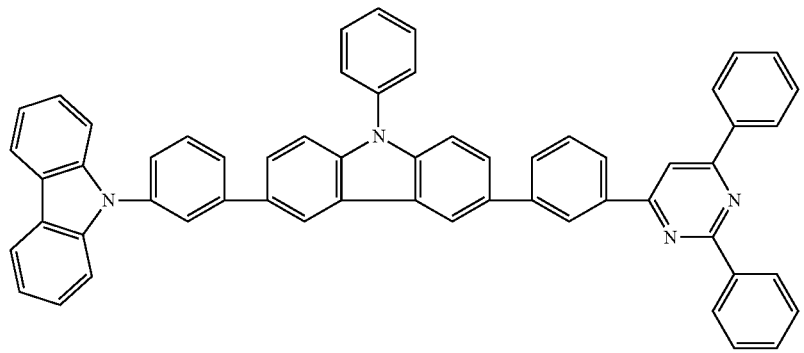
22
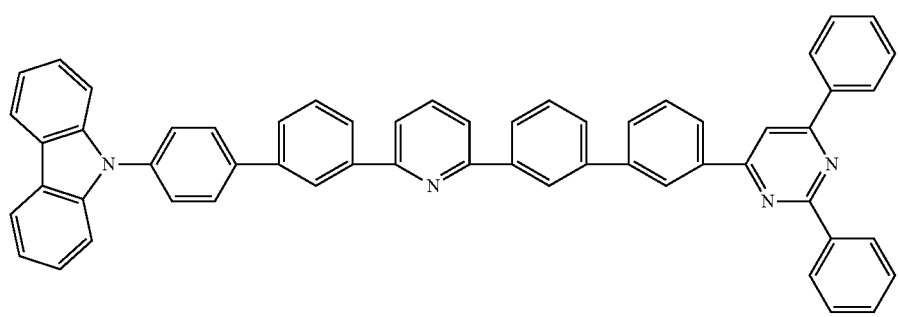
23

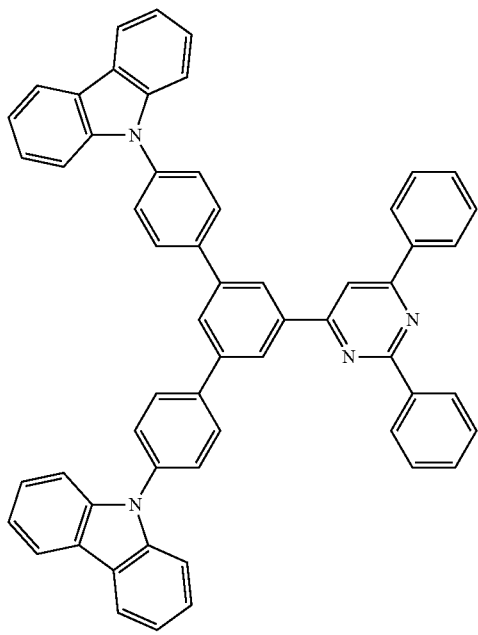
24
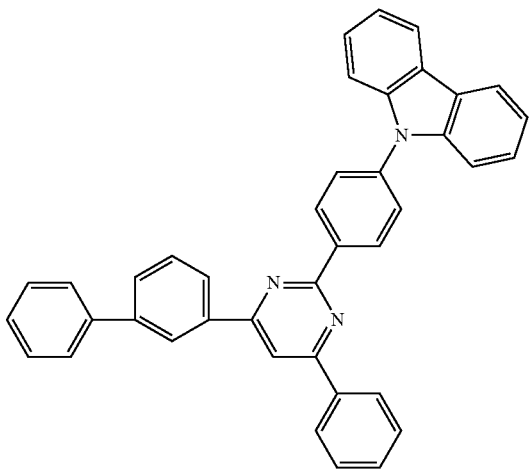
25
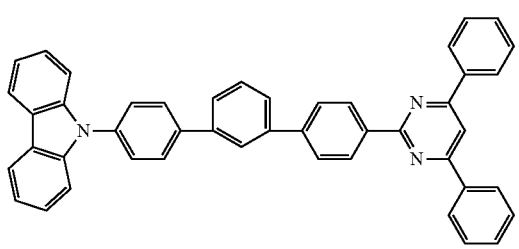
26
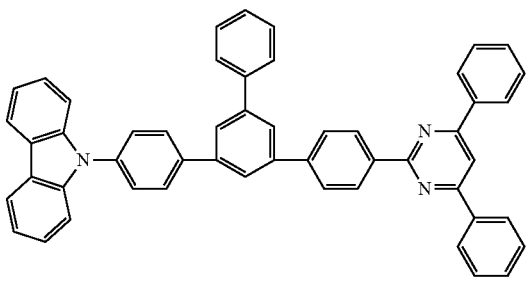
27
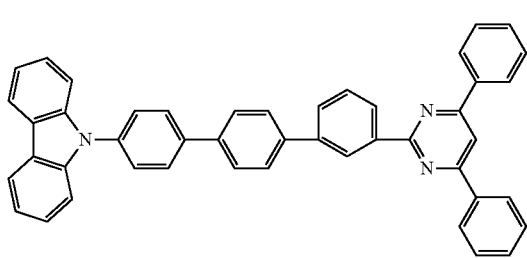
28
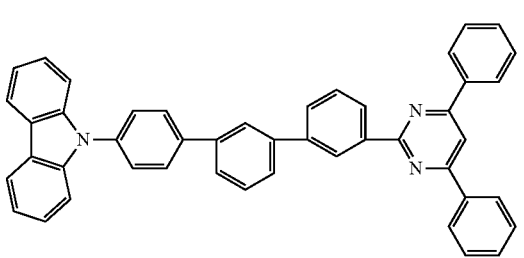
29
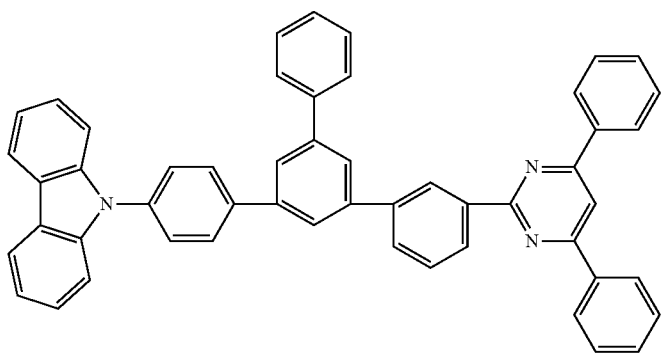
30

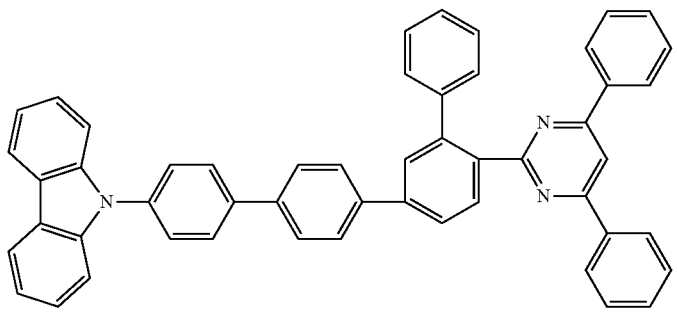
31
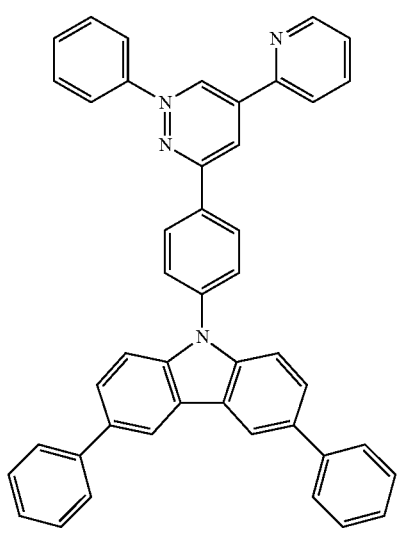
32
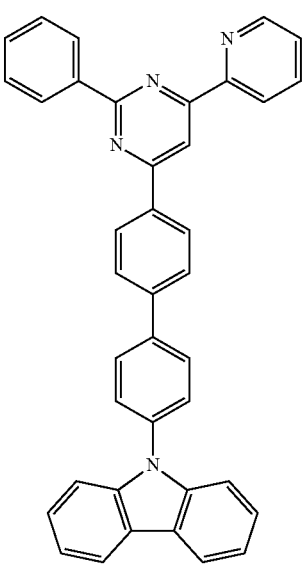
34
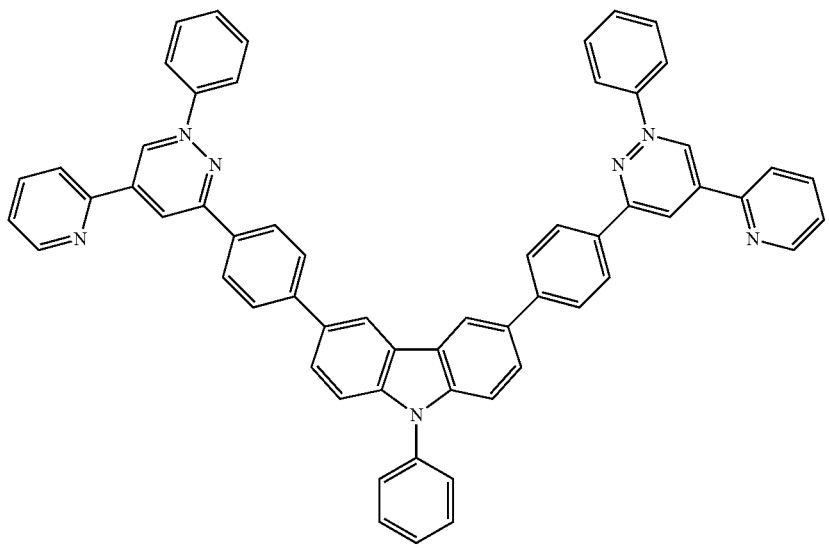
35

-continued
37
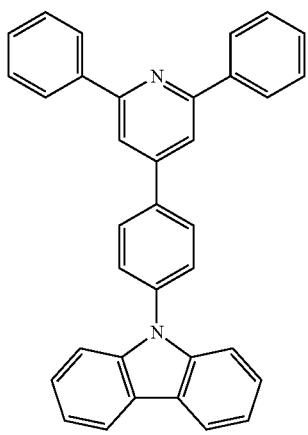
38
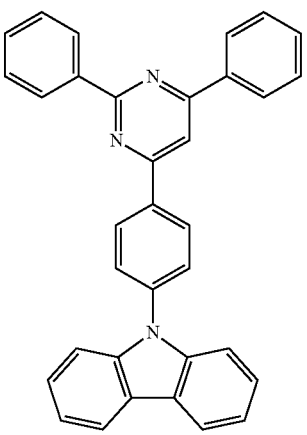
39
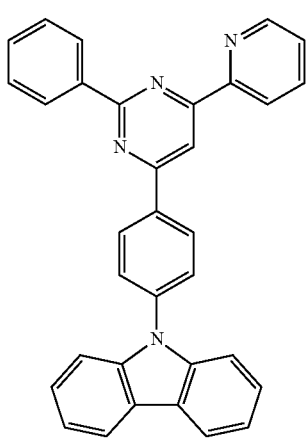
40
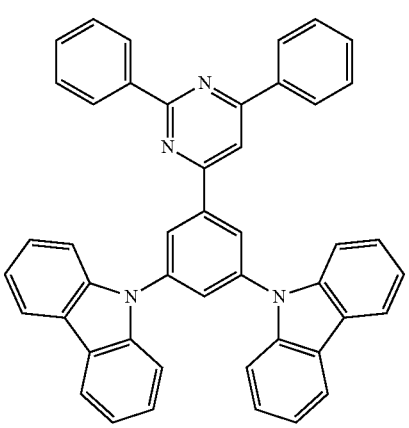
41
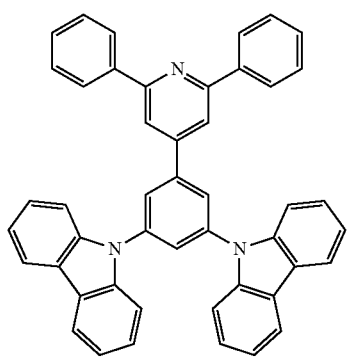
42
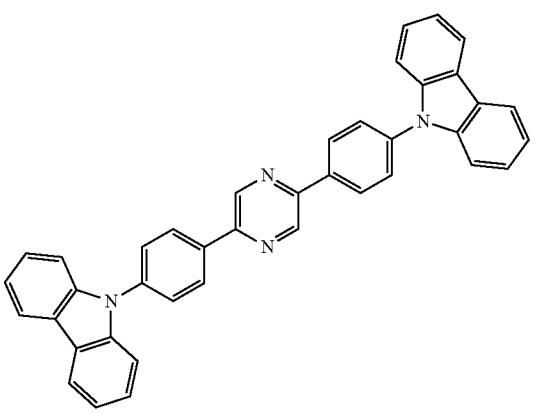

-continued
43
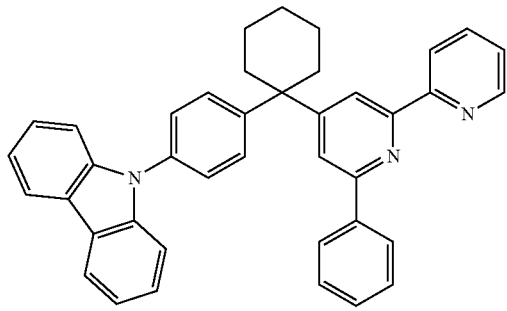
44
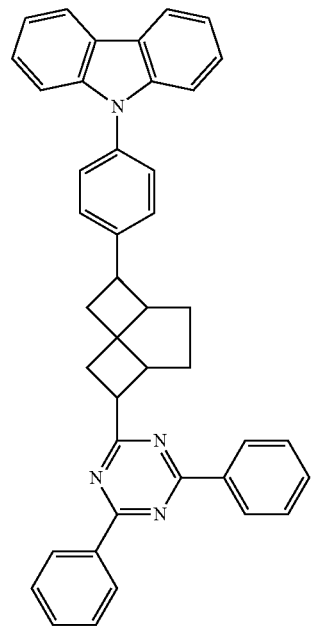
45
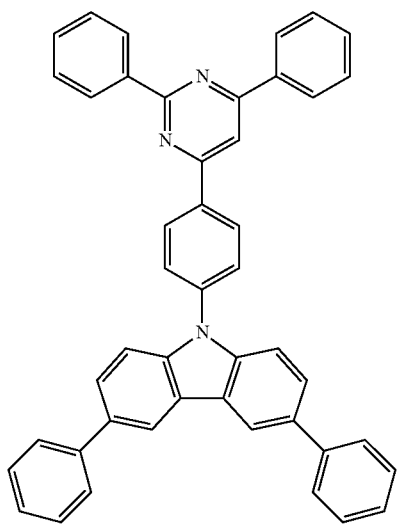
46
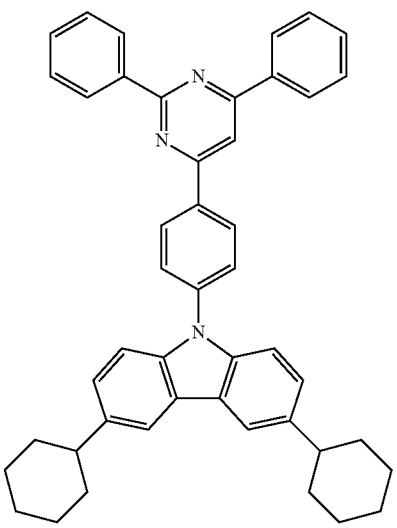
47
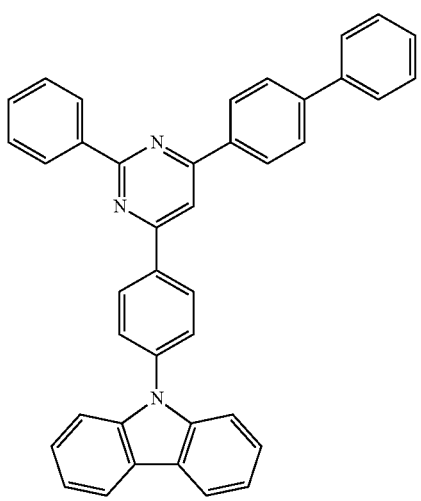
48
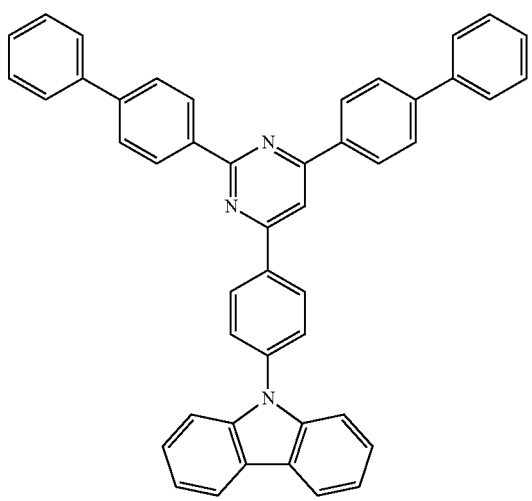

-continued
49
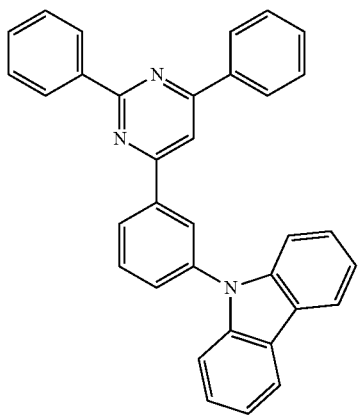
50
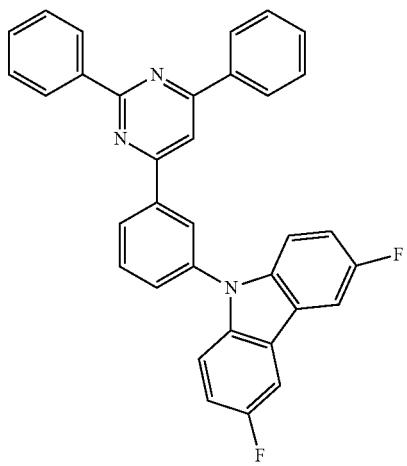
51
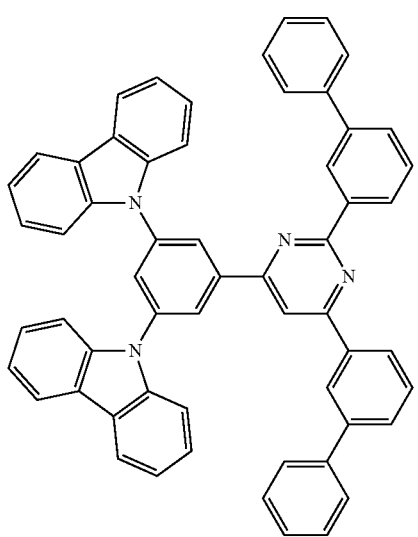
52
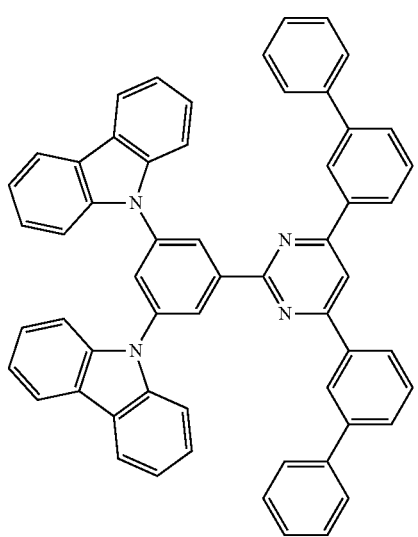
53
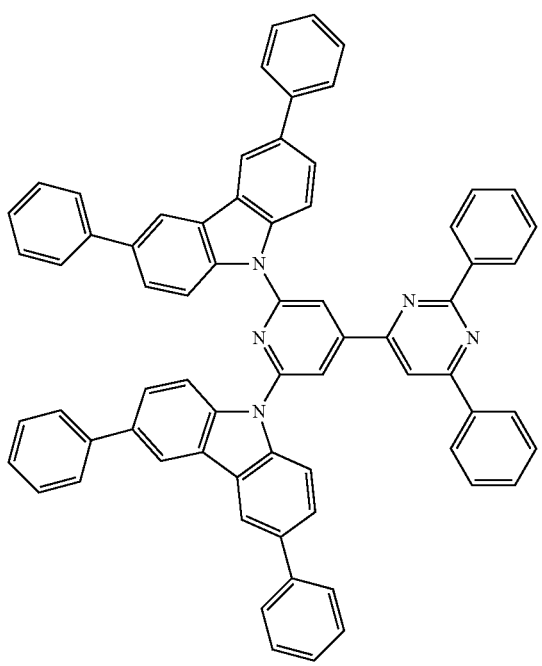
54
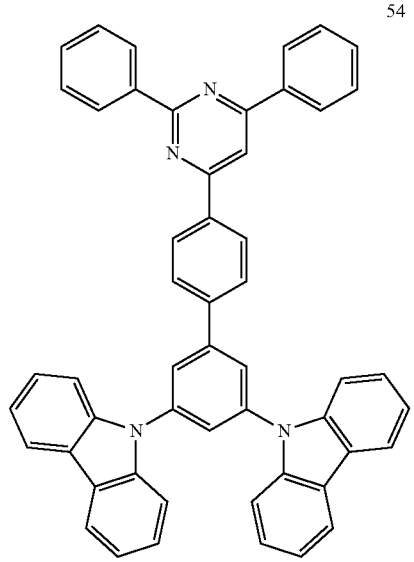

-continued
56
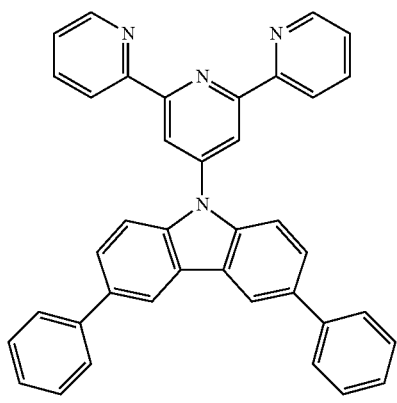
57
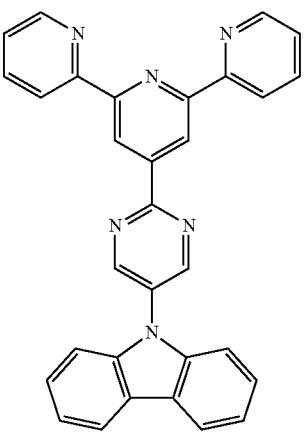
58
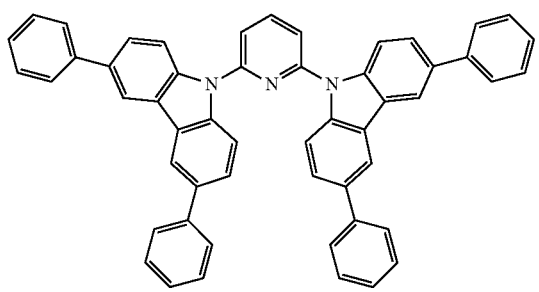
59
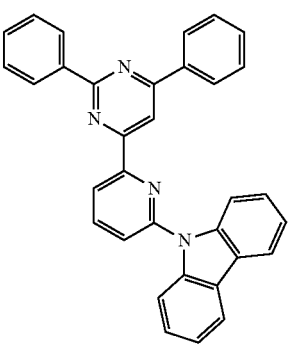
60
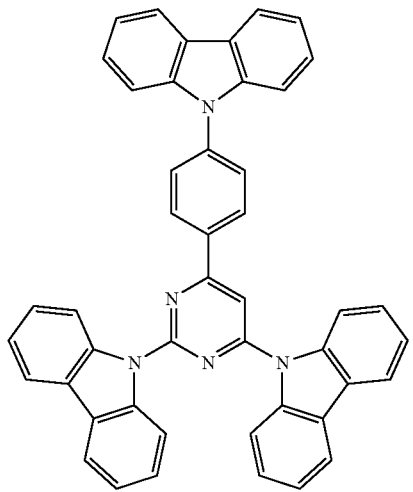
61
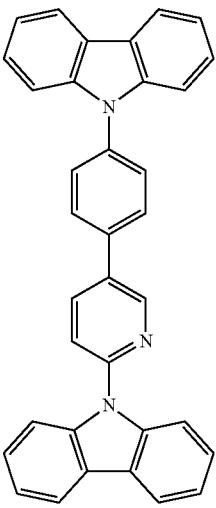

-continued
62
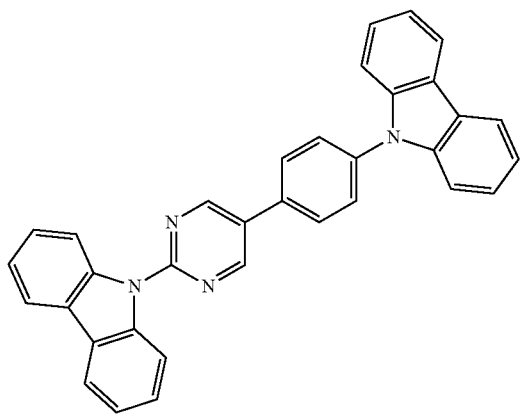
63
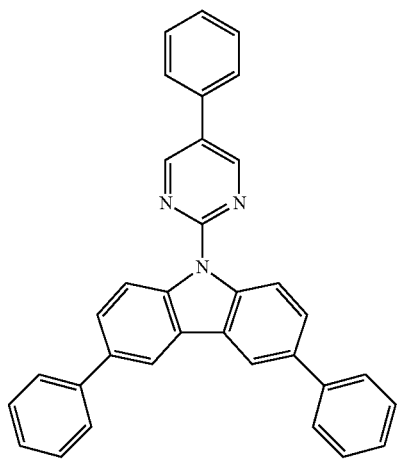
64
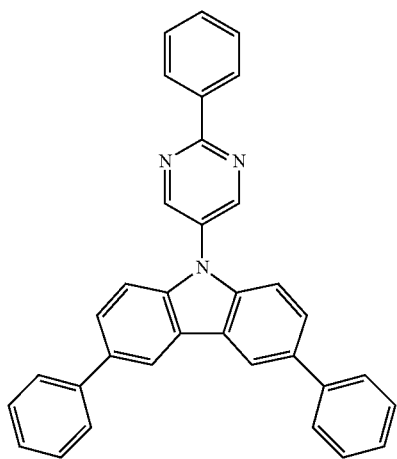
65
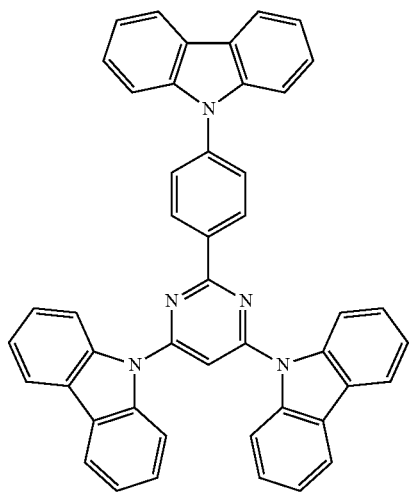
66
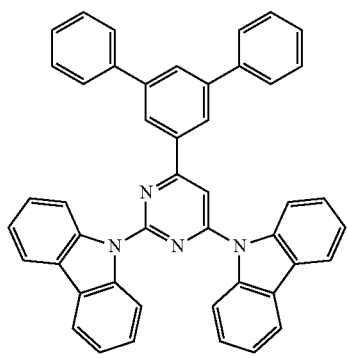
67
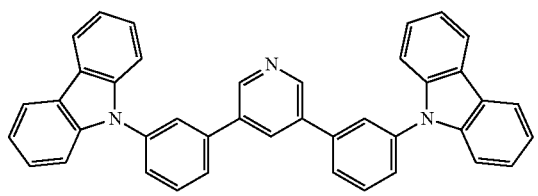

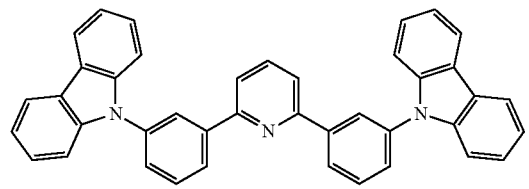
68
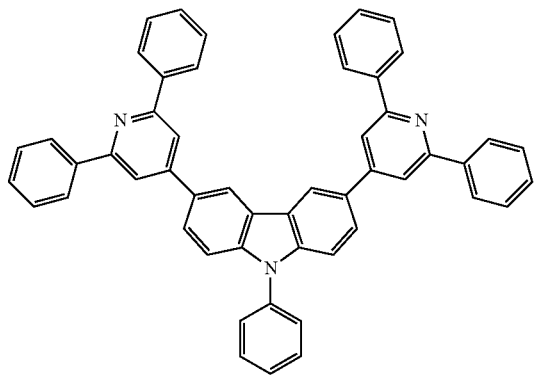
69
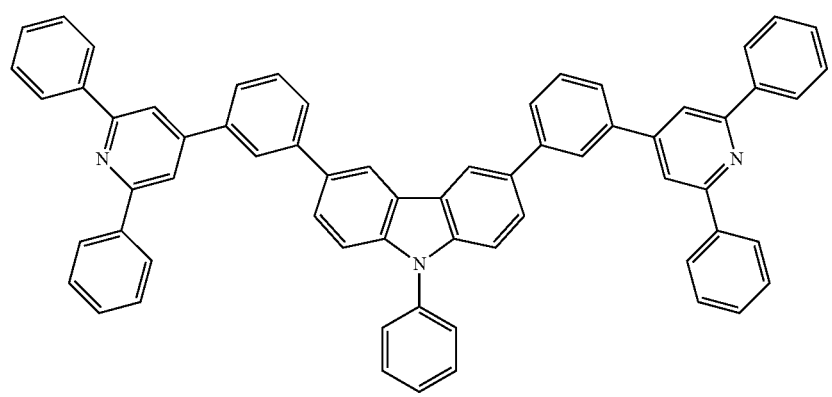
70
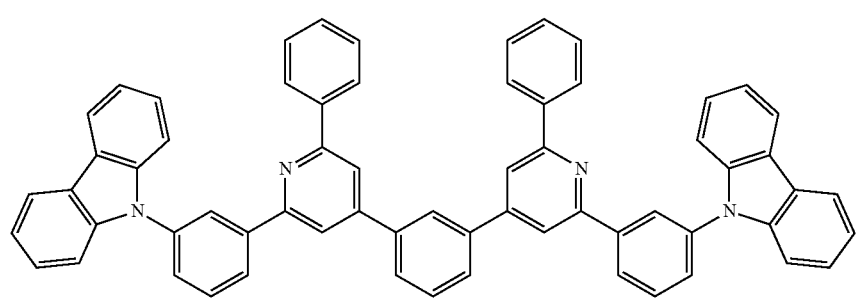
71
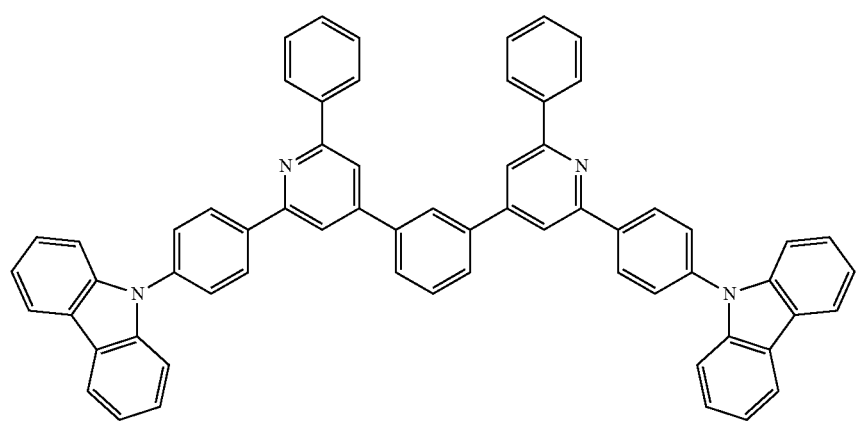
72

-continued
73
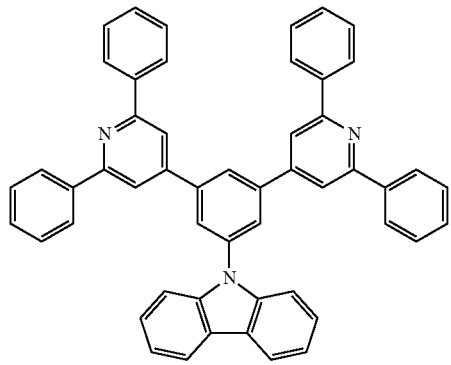
74
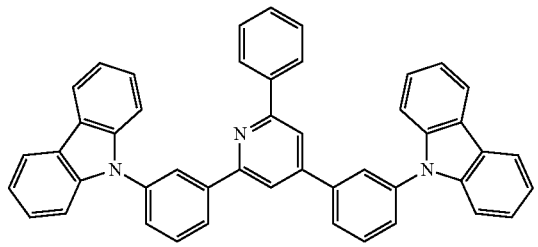
75
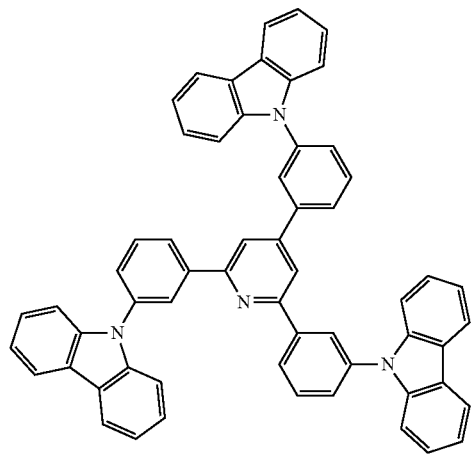
76
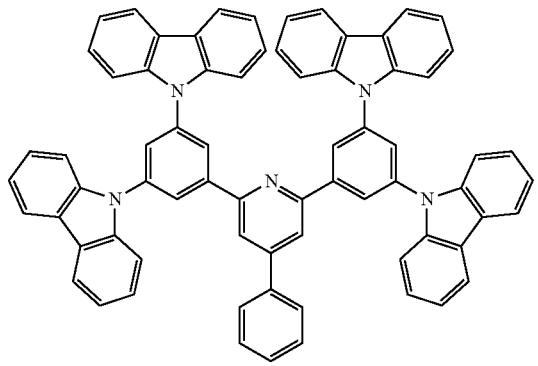
77
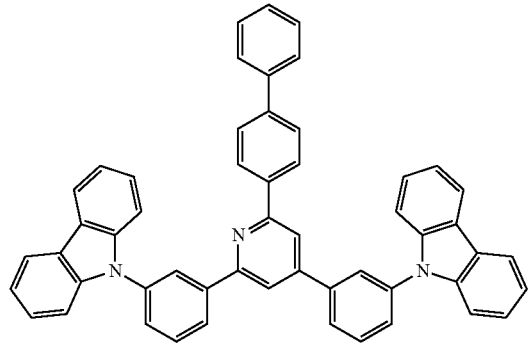
78
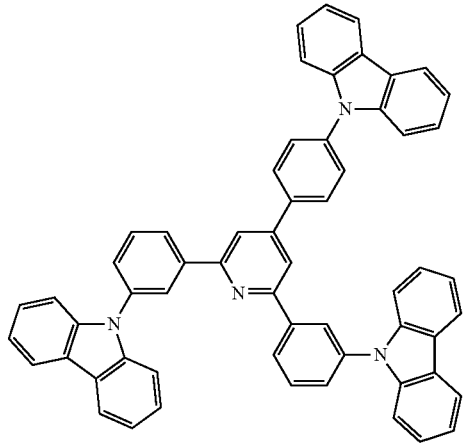
79
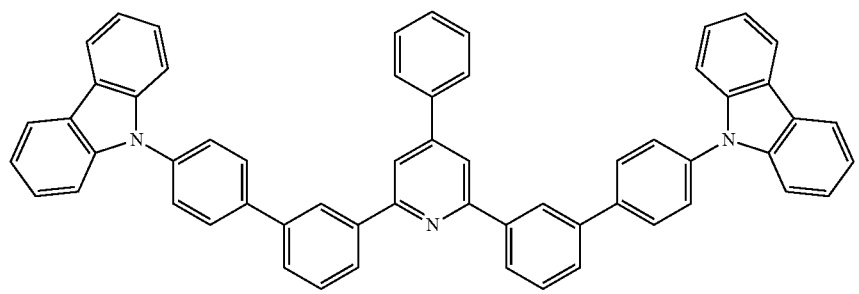

-continued
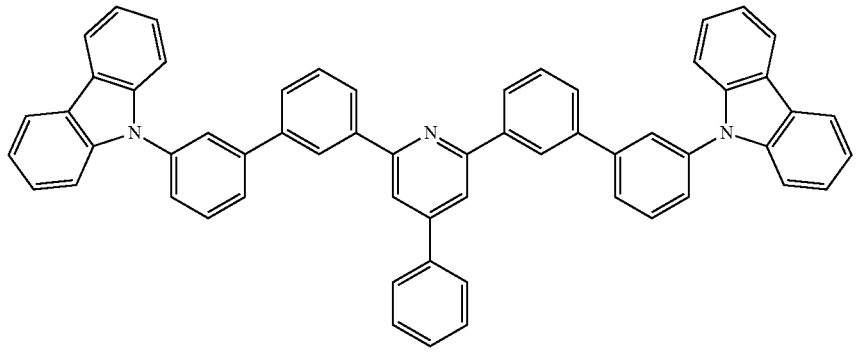
80
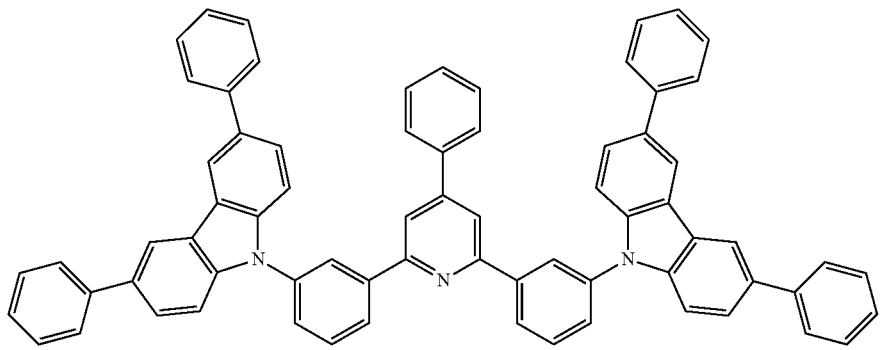
81
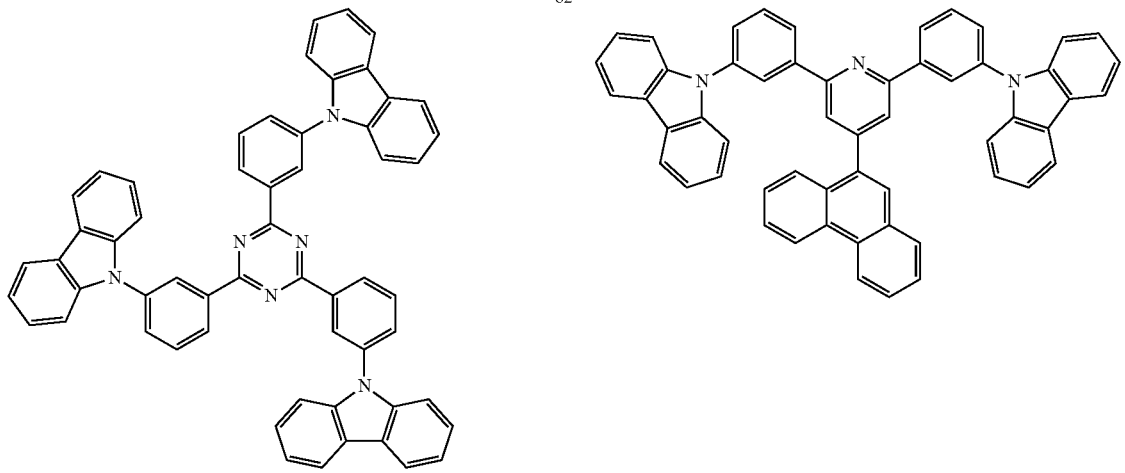
82 83
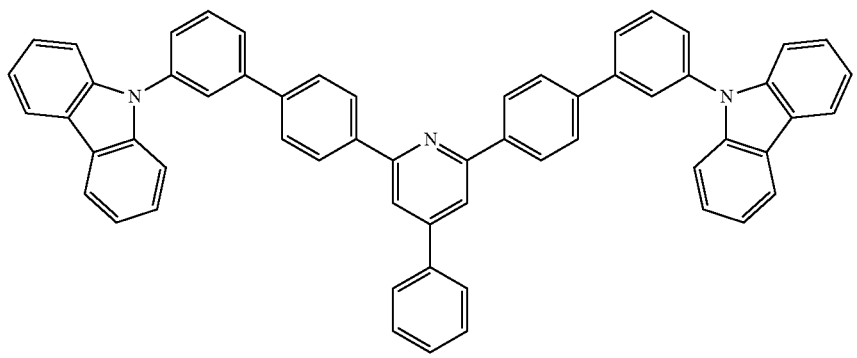
84

-continued
85
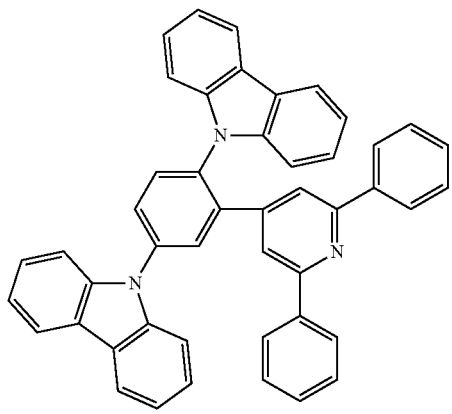
86
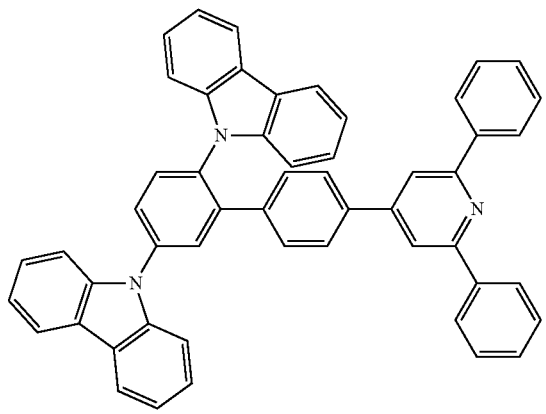
87
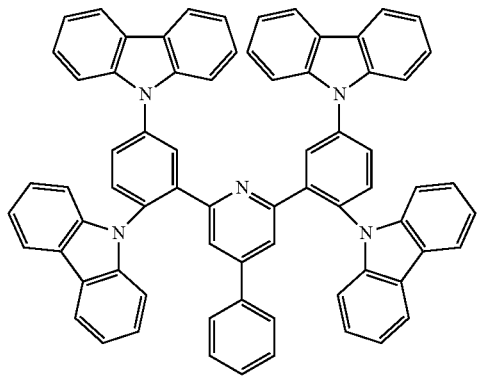
88
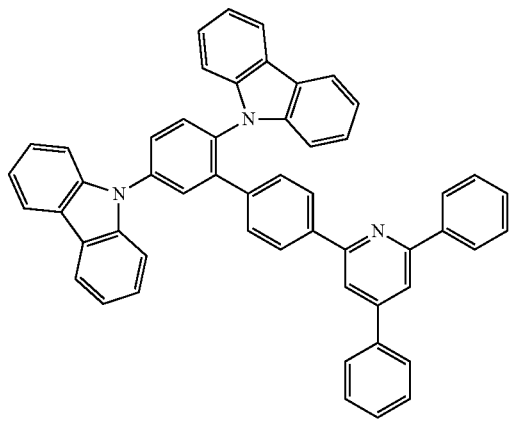
89
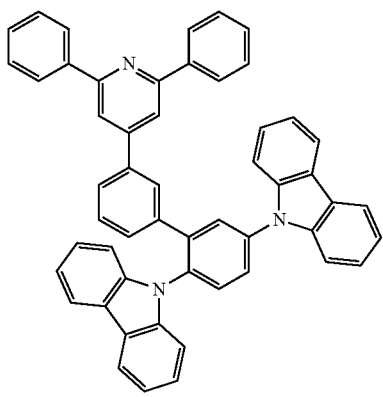
90
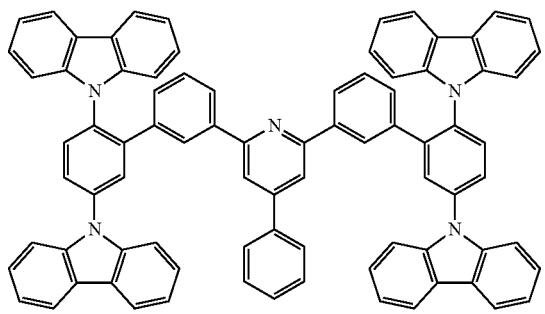

-continued
91
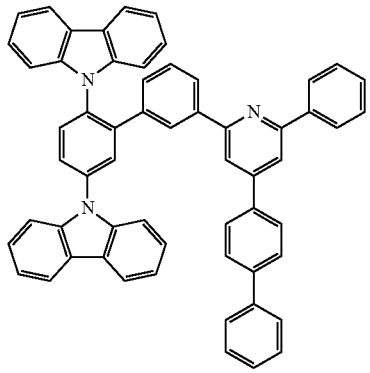
92
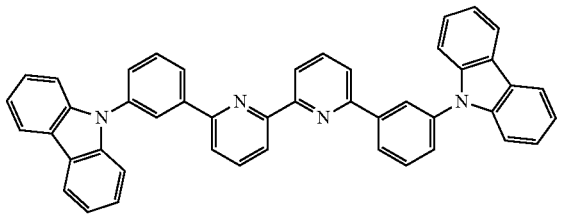
93
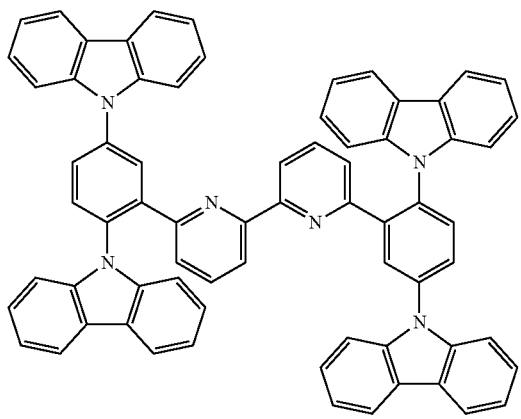
94
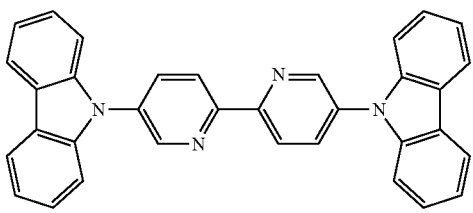
95
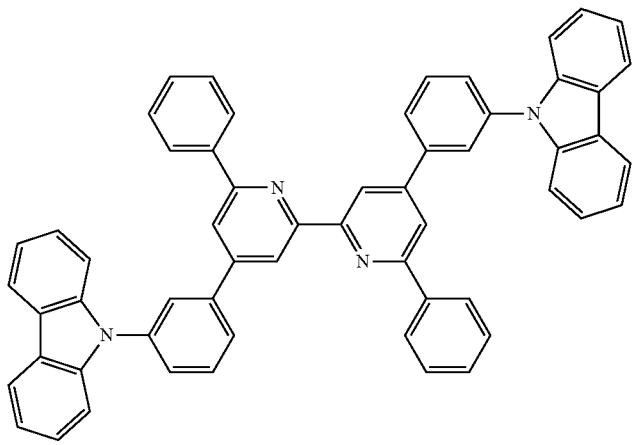
96
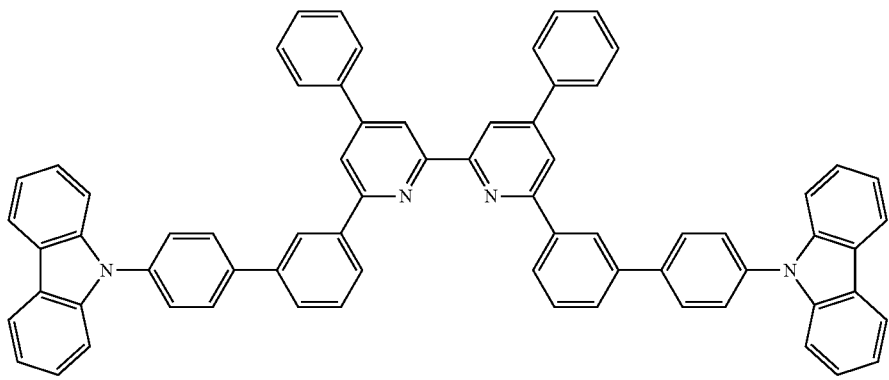

-continued
97
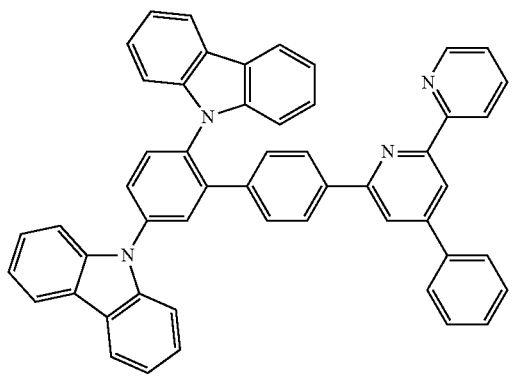
98
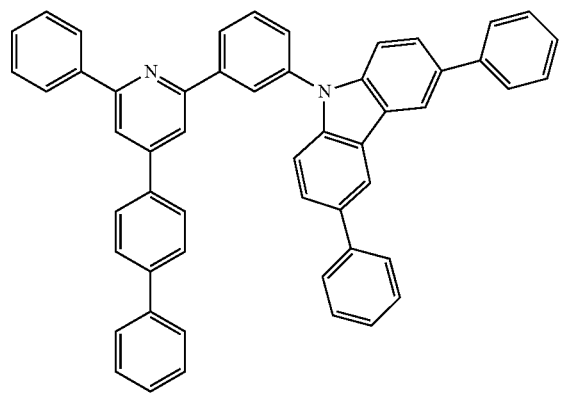
99
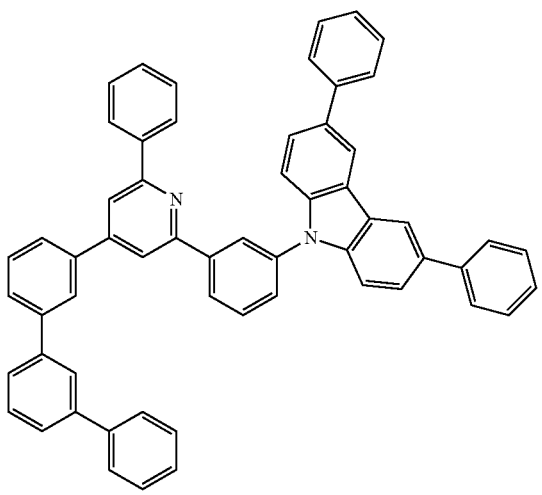
100
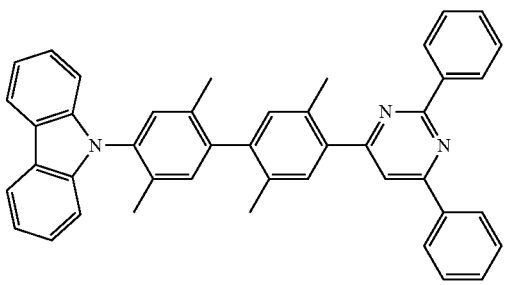
101
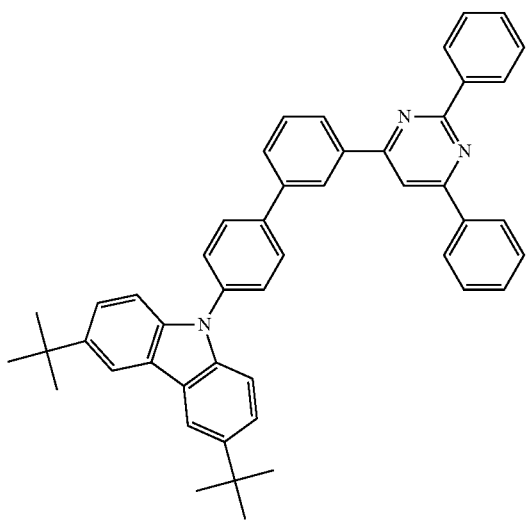
102
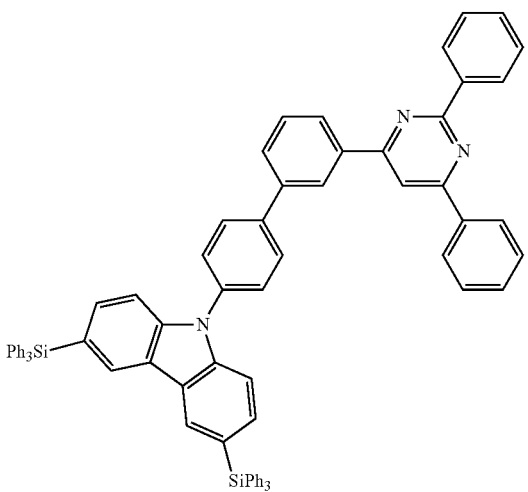

-continued
103
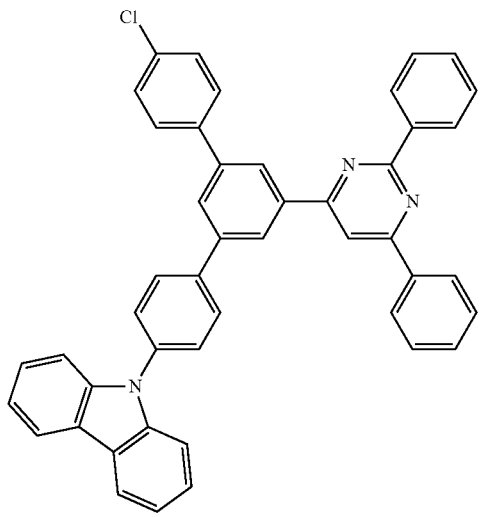
104
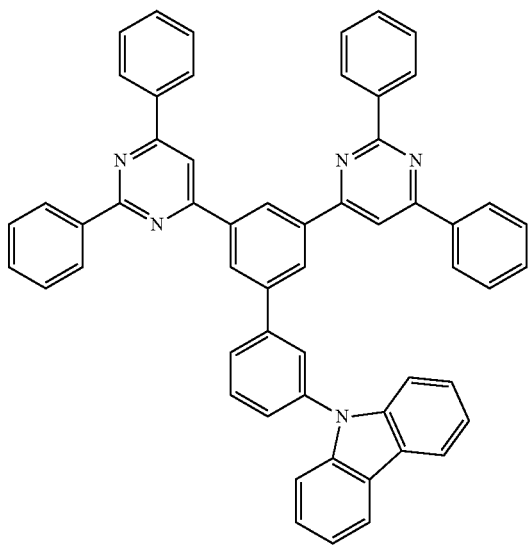
105
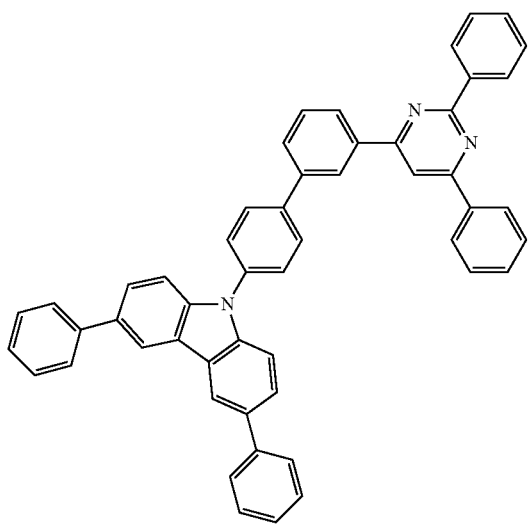
106
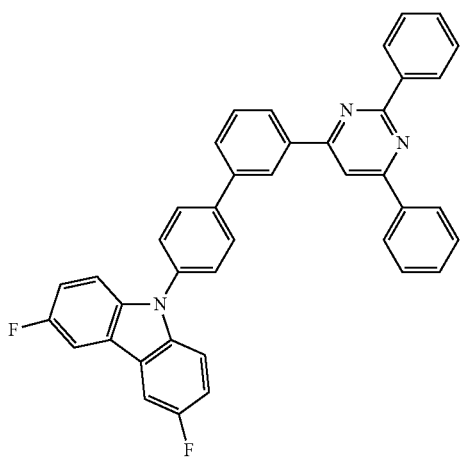
107
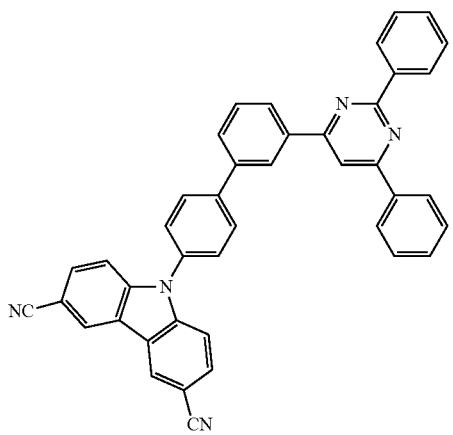
108
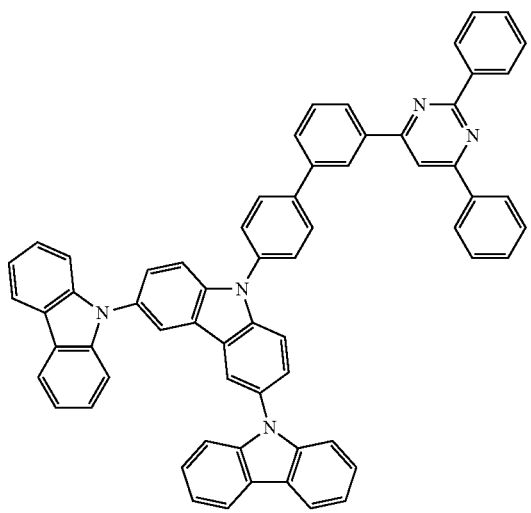

-continued
109
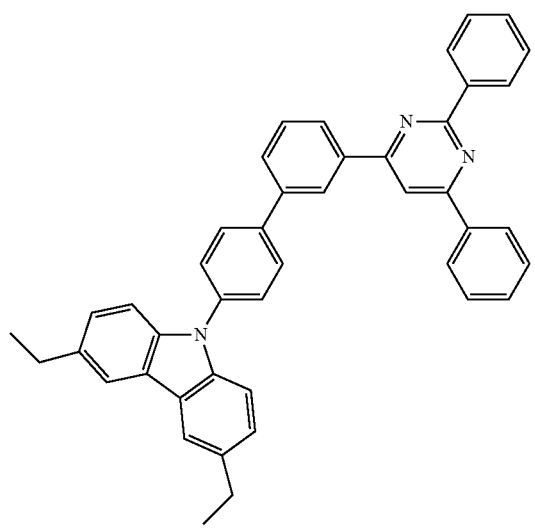
110
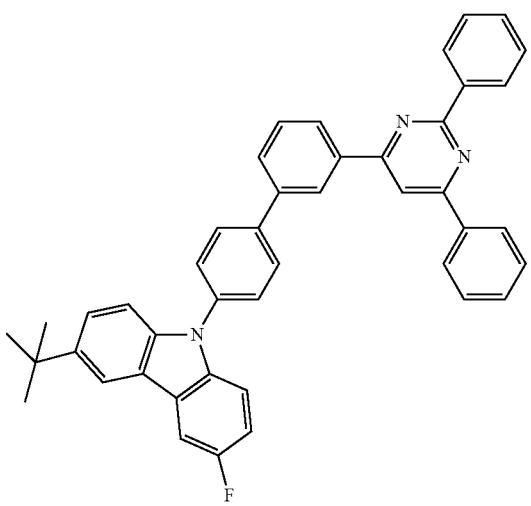
111
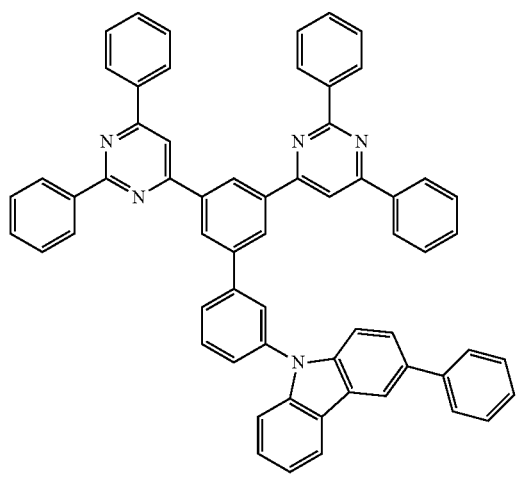
112
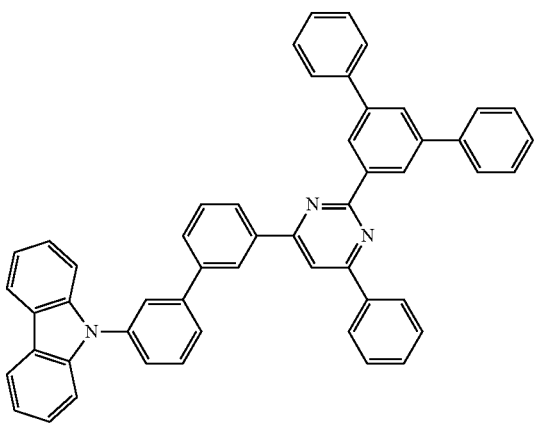
113
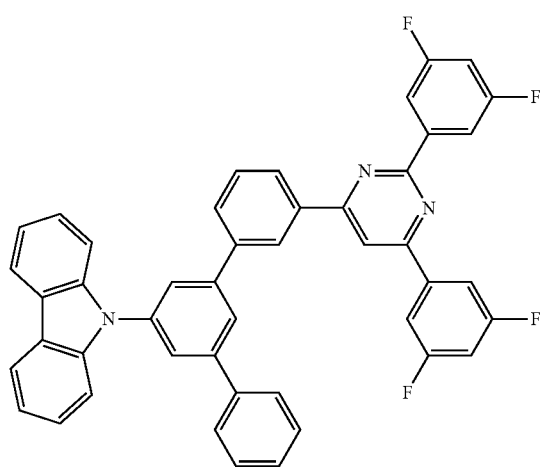

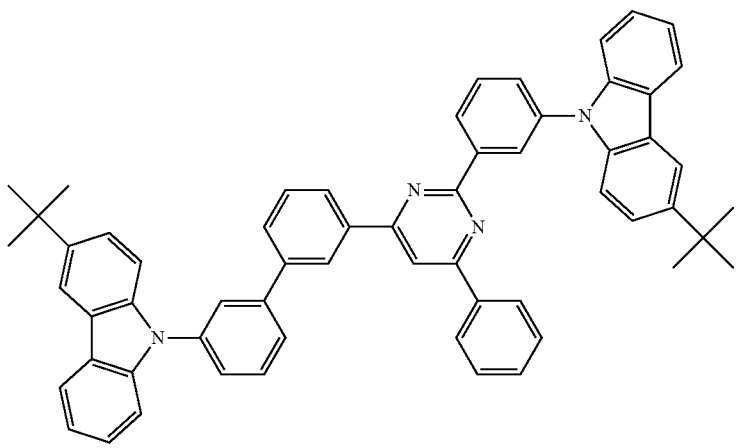

The compound exemplified as the compound represented by Formula (1) may be synthesized by various methods such as a method described in a pamphlet of International Publication No. WO03/080760, a method described in a pamphlet of International Publication No. WO03/078541, and a method described in a pamphlet of International Publication No. WO05/085387.

For example, the compound No. 4 may be synthesized by using m-bromobenzoaldehyde as a starting raw material by a method described in [0074] to [0075] of a pamphlet of International Publication No. WO05/085387 (page 45, line 11 to page 46, line 18). The compound No. 45 may be synthesized by using 3,5-dibromobenzoaldehyde as a starting raw material by a method described on page 46, line 9 to page 46, line 12 of a pamphlet of International Publication No. WO03/080760. The compound No. 77 may be synthesized by using N-phenylcarbazole as a starting raw material by a method described in on page 137, line 10 to page 139, line 9 of a pamphlet of International Publication No. WO05/022962.

In the present invention, the purpose of the compound represented by Formula (1) is not limited, and the compound may be contained in any layer of the organic layers other than the light emitting layer in addition to the light emitting layer. As a layer introducing the compound represented by Formula (1), in addition to the light emitting layer, it is preferable that the compound is contained in either any one or a plurality of a hole injection layer, a hole transporting layer, an electron transporting layer, an electron injection layer, an exciton blocking layer and a charge blocking layer.

In the present invention, in order to further suppress a change in chromaticity when driving at a high temperature, the compound represented by Formula (1) may be contained in both layers of the light emitting layer and the layer adjacent to the light emitting layer.

In the case where the compound represented by Formula (1) is contained in the light emitting layer, the compound represented by Formula (1) of the present invention is contained in an amount of preferably 0.1 to 99 mass %, more preferably 1 to 95 mass %, and more preferably 10 to 95 mass % on the basis of the total mass of the light emitting layer.

Further, in the case where the compound represented by Formula (1) is contained in a layer other than the light emitting layer, the compound is contained in an amount of preferably 10 to 100 mass %, more preferably 30 to 100 mass %, and more preferably 50 to 100 mass % on the basis of the total mass of the layer other than the light emitting layer.

In the present invention, a host material may be used in combination with the compound represented by Formula (1) and the compound represented by Formula (PQ-1). The host material in combination may be a hole transporting host material or an electron transporting host material.

In the present invention, it is preferable that the light emitting layer contains the compound represented by Formula (1), the compound represented by Formula (PQ-1), and the host material. The host material is preferably a compound represented by the following Formula (4-1) or (4-2).

In the present invention, it is more preferable that the light emitting layer contains the compound represented by Formula (1) and the compound represented by Formula (PQ-1), and further at least one of the compound represented by Formula (4-1) or (4-2).

In the present invention, in the case where the compound represented by Formula (4-1) or (4-2) is contained in the light emitting layer, the compound represented by Formula (4-1) or (4-2) is contained in the light emitting layer in an amount of preferably 1 to 90 mass %, more preferably 1 to 70 mass %, and particularly preferably 1 to 40 mass %. Further, in the case where the compound represented by Formula (4-1) or (4-2) is used in a plurality of organic layers, in the case where the compound is contained together with the compound represented by Formula (1), it is preferable that the compound is contained in the aforementioned range in each layer, and in the case where the compound represented by Formula (1) is not contained, the compound is contained in each layer in an amount of preferably 30 to 95 mass %, more preferably 40 to 95 mass %, and particularly preferably 60 to 95 mass %.

One kind of the compound represented by Formula (4-1) or (4-2) may be contained in any one organic layer, or a plurality of the compounds represented by Formula (4-1) or (4-2) may be contained in combination at any ratio.

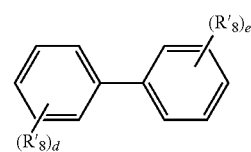

Formul (4-1)

Formul (4-2)

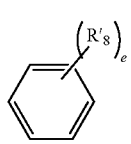

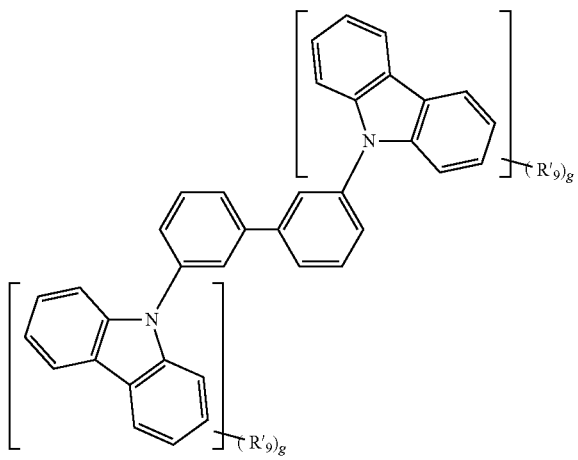

(In Formulas (4-1) and (4-2), each of d and e independently represents an integer of 0 to 3, and at least either one is 1 or more. f represents an integer of 1 to 4. $R'_8$ represents a substituent, and when d, e and f are 2 or more, $R'_8$ may be the same as or different from every other $R'_8$. Further, at least one of $R'_8$ represents a carbazole group represented by the following Formula (5))

(5)

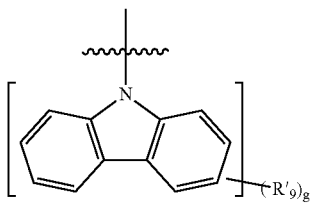

(In Formula (5), each of $R'_9$ independently represents a substituent. g represents an integer of 0 to 8)

Each of $R'_8$ independently represents a substituent, and specifically, is a halogen atom, an alkoxy group, a cyano group, a nitro group, an alkyl group, an aryl group, a heterocyclic group or a substituent represented by Formula (5). In the case where $R'_8$ does not represent Formula (5), $R'_8$ is preferably an alkyl group having 10 or less carbon atoms or a substituted or unsubstituted aryl group having 10 or less carbon atoms, and more preferably an alkyl group having 6 or less carbon atoms.

Each of $R'_9$ independently represents a substituent, and specifically, is a halogen atom, an alkoxy group, a cyano group, a nitro group, an alkyl group, an aryl group or a heterocyclic group, preferably an alkyl group having 10 or less carbon atoms and a substituted or unsubstituted aryl group having 10 or less carbon atoms, and more preferably an alkyl group having 6 or less carbon atoms.

g represents an integer of 0 to 8, and is preferably 0 to 4 from the viewpoint of not excessively shielding the carbazole structure transporting an electric charge. Further, from the viewpoint of easiness of synthesis, in the case where carbazole has a substituent, it is preferable that the carbazole has a substituent so as to be symmetrical with respect to the nitrogen atom.

In Formula (4-1), from the viewpoint of maintaining charge transportability, it is preferable that the sum of d and e is 2 or more. Further, it is preferable that $R'_8$ is meta-substituted with respect to the other benzene ring. The reason is deemed that, since a steric hindrance of the adjacent substituents is large in ortho-substitution, the bond is easily cleaved, and durability is decreased. In addition, in the para-substitution, since a molecular shape is close to substantially hard rod shape and crystallization is apt to occurs, deterioration of the device easily occurs under a high temperature condition. Specifically, the compound represented by the following structure is preferable. Moreover, $R'_9$ and g of the following compound are the same as $R'_9$ and g in Formula (5).

In Formula (4-2), it is preferable that f is 2 or more from the viewpoint of maintaining charge transportability. When f is 2 or 3, it is preferable that $R'_8$ is meta-substituted from the same viewpoint. In detail, the compound represented by the following structure is preferable. Further, $R'_9$ and g of the following compound are the same as $R'_9$ and g in Formula (5).

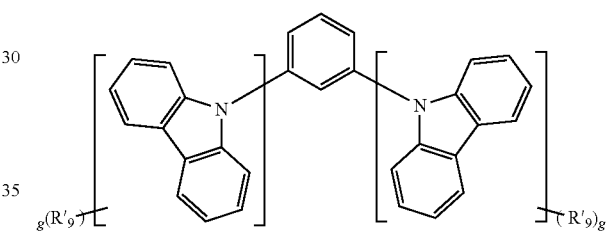

When Formulas (4-1) and (4-2) have a hydrogen atom, isotopes of hydrogen (deuterium atom etc.) are also included. In this case, all hydrogen atoms of the compound may be substituted with an isotope of hydrogen, and may be a mixture in which a portion of the compound contains an isotope of hydrogen. Preferably, $R'_9$, in Formula (5) is substituted with deuterium, and particularly preferably may have the following structure.

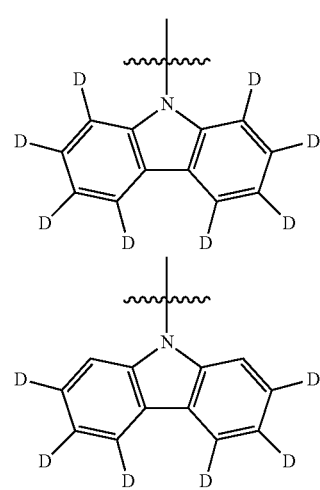

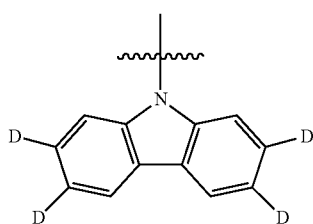

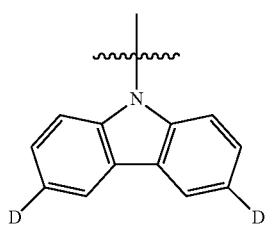

The atom further constituting a substituent includes the isotope thereof.

The compounds represented by Formula (4-1) and (4-2) may be synthesized by combining various known synthesis methods. Most generally, with respects to the carbazole compound, there may be a synthesis by dehydrogenation aromatization after Aza-Cope rearrangement reaction of arylhydrazine and a condensate with cyclohexane derivative (written by L. F. Tieze, and Th. Eicher, translated by Dakano, Ogasawara, Fine Organic Synthesis, p. 339 (published by Nankodo Co., Ltd.)). Further, with respects to the coupling reaction of the obtained carbazole compound and halogenated aryl compound using the palladium catalyst, there may be a method described in Tetrahedron Letters Vol. 39, p. 617 (1998), Vol. 39, p. 2367 (1998) and Vol. 40, p. 6393 (1999). The reaction temperature and reaction time are not particularly limited, and the condition described in the above document may be applied. In addition, several commercially available compounds such as mCP may be appropriately used.

In the present invention, it is preferable that the compounds represented by Formulas (4-1) and (4-2) form a thin layer by a vacuum deposition process, but a wet process such as solution coating may be appropriately used. The molecular weight of the compound is preferably 2,000 or less, more preferably 1,200 or less, and particularly preferably 800 or less from the viewpoint of deposition application or solubility. Further, from the viewpoint of deposition application, if the molecular weight is too small, since a vapor pressure is decreased and a change from a gas phase to a solid phase does not occur, it is difficult to form the organic layer, and therefore, the molecular weight is preferably 250 or more, and particularly preferably 300 or more.

It is preferable that Formulas (4-1) and (4-2) is the following structure or a compound in which the hydrogen atom is substituted by one or more deuterium atoms. Further, among the following compounds, R'$_8$ and R'$_9$ are the same meaning as R'$_8$ and R'$_9$ in Formulas (4-1), (4-2) and Formula (5).

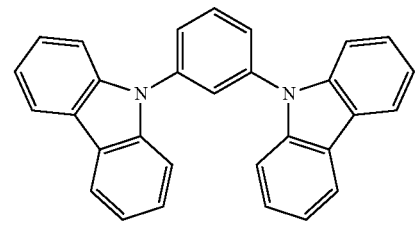

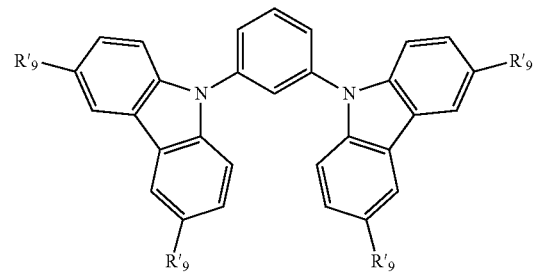

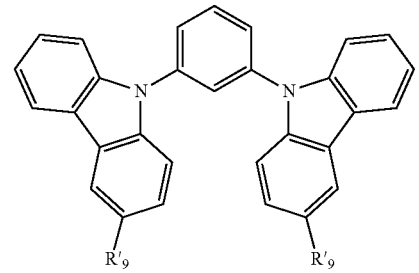

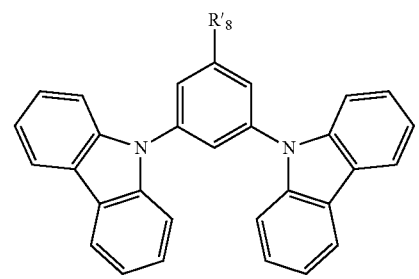

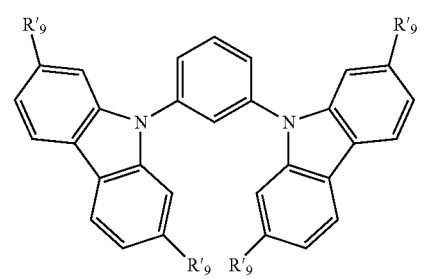

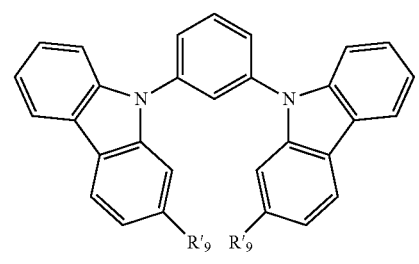

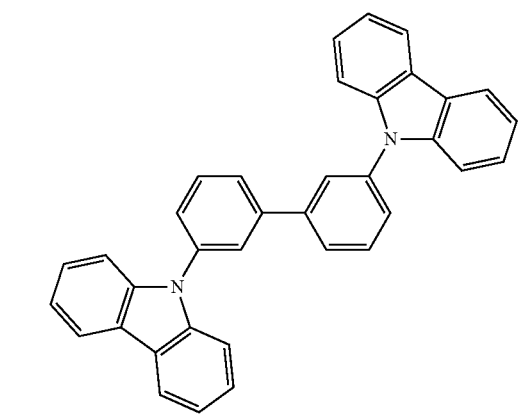
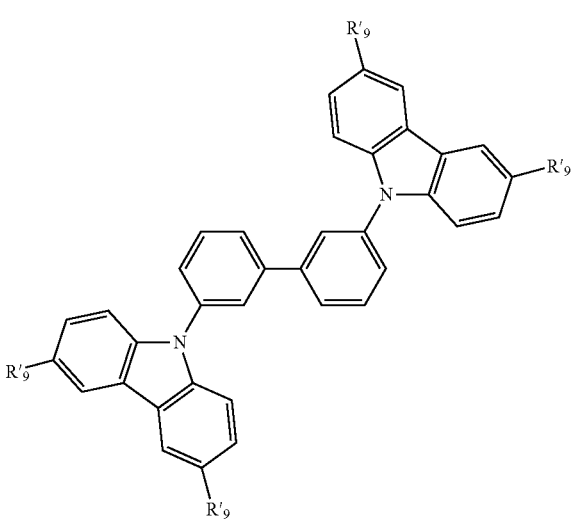
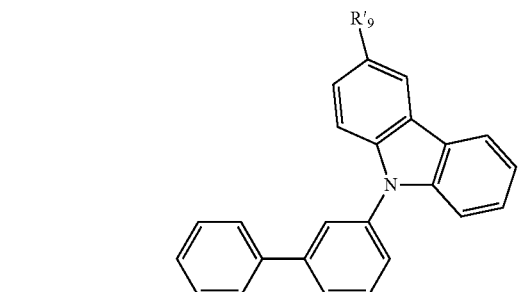
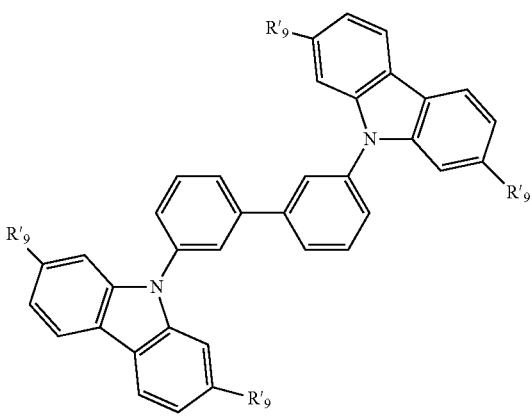
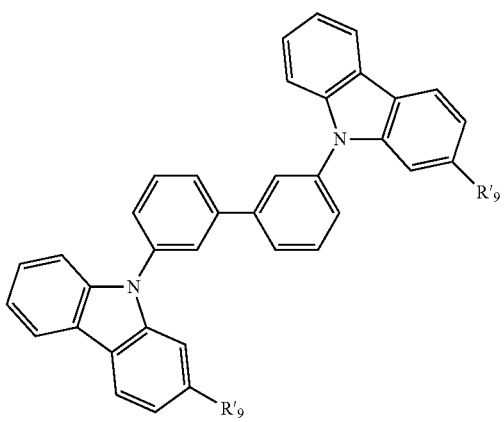
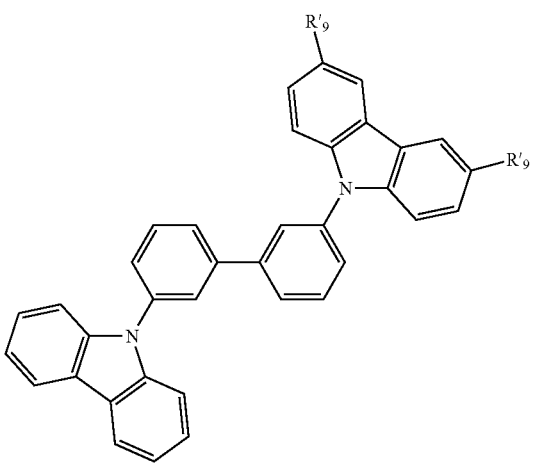
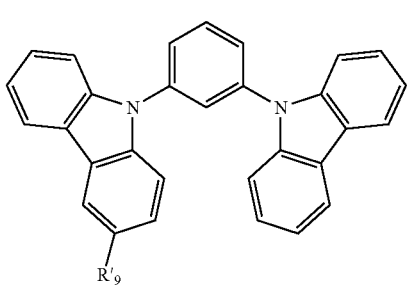

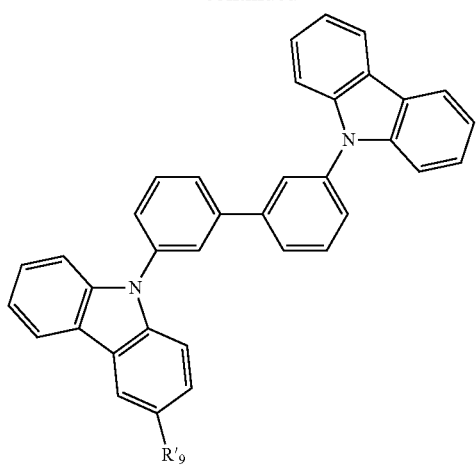
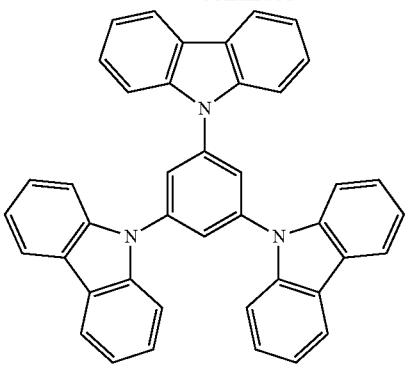
Hereinafter, particular examples of the compounds represented by Formula (4-1) and (4-2) in the present invention are described, but the present invention is not limited thereto.
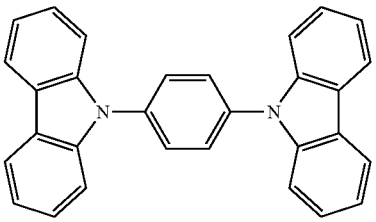
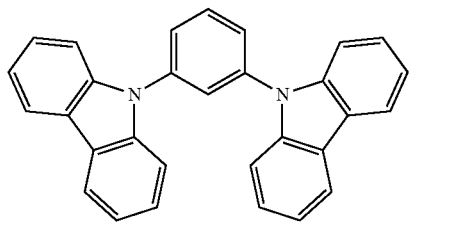
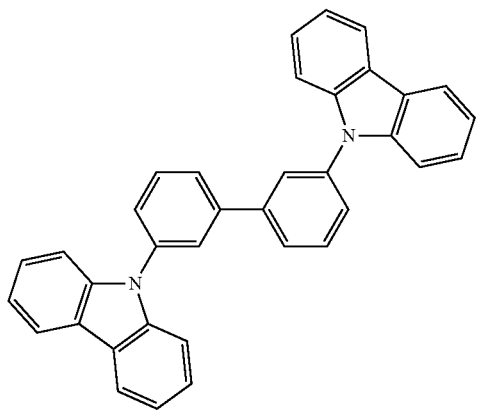
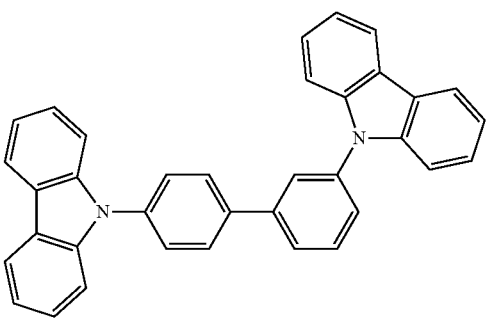
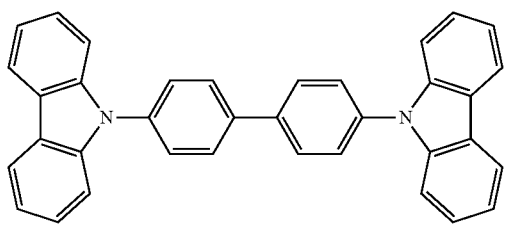
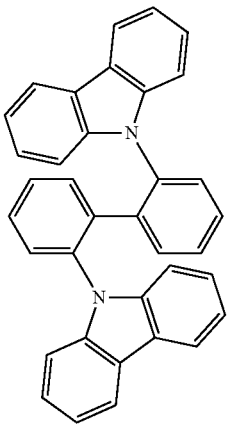

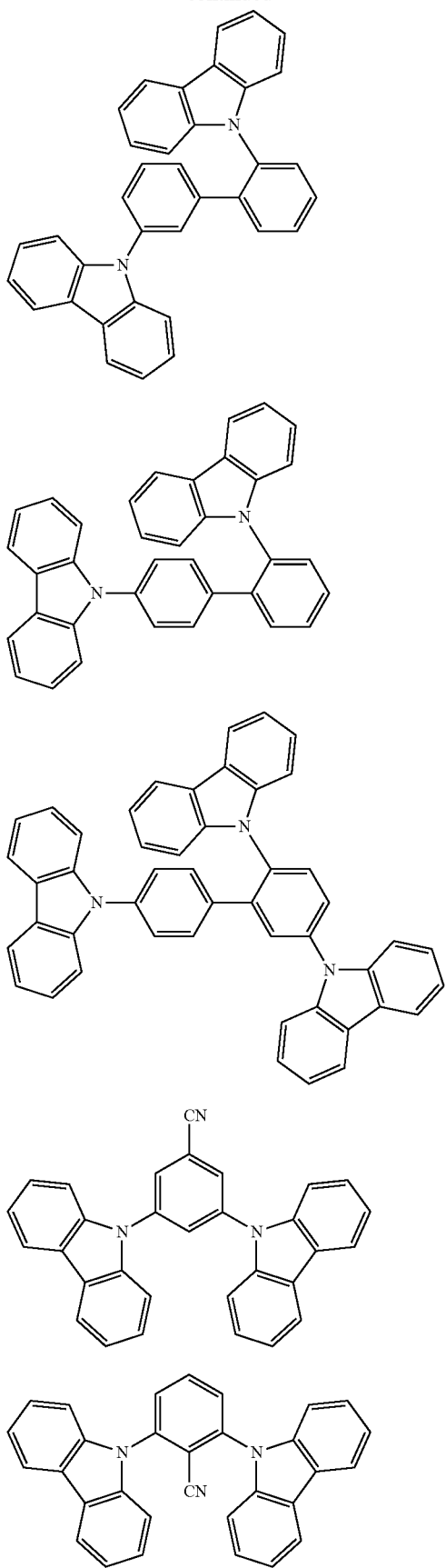
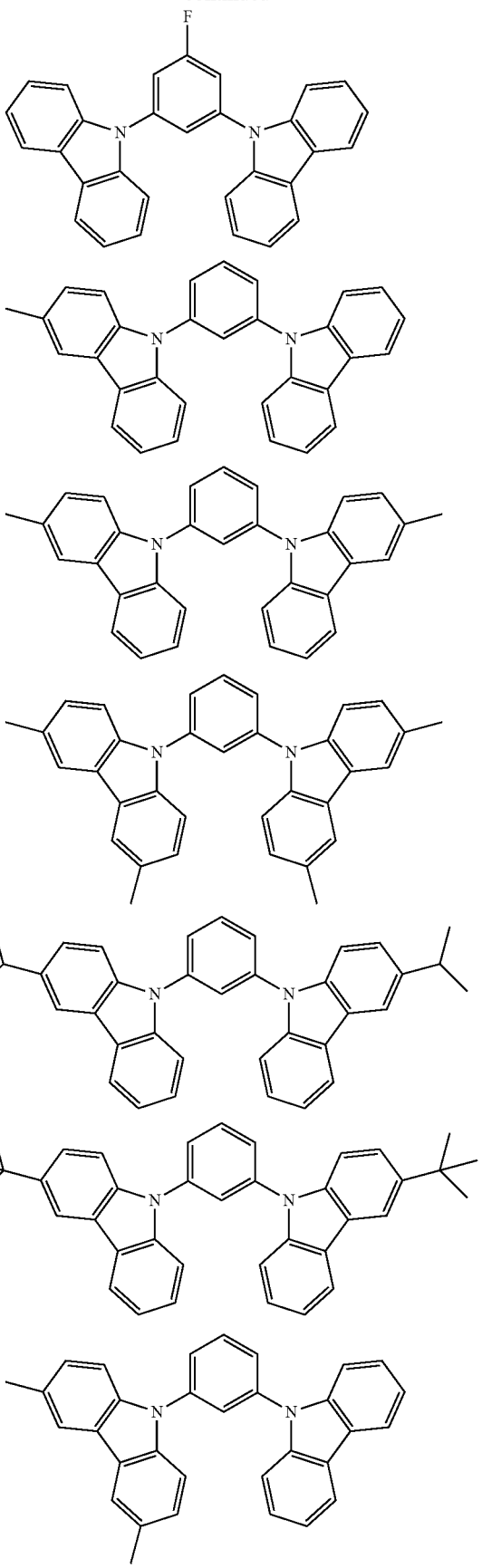

-continued
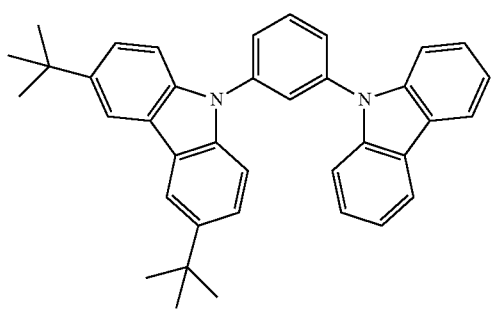
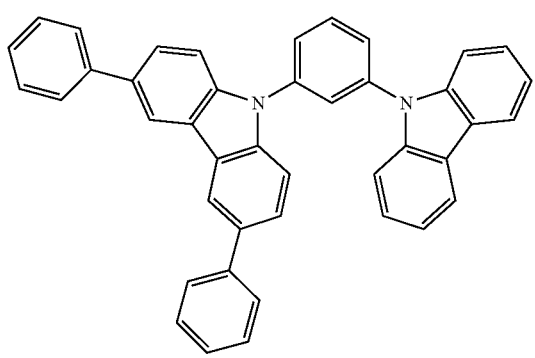
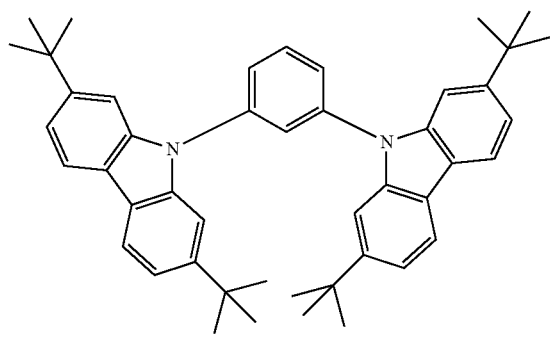
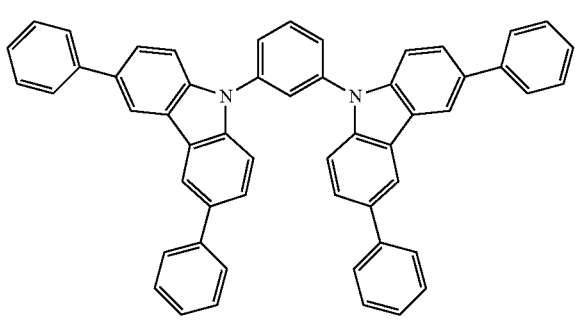
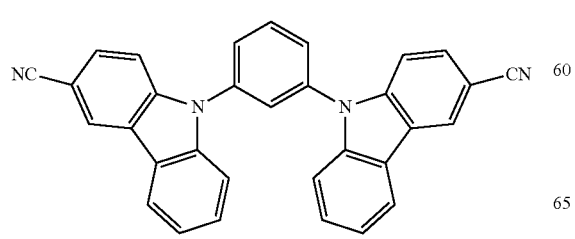
-continued
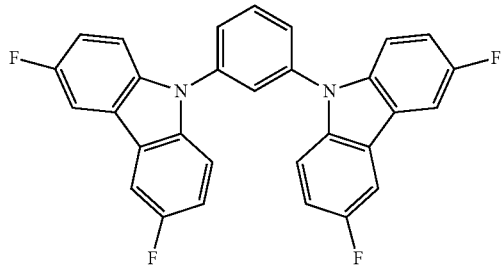
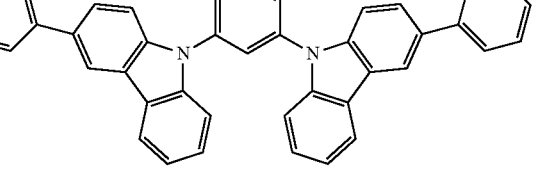
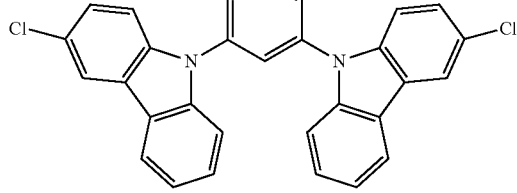
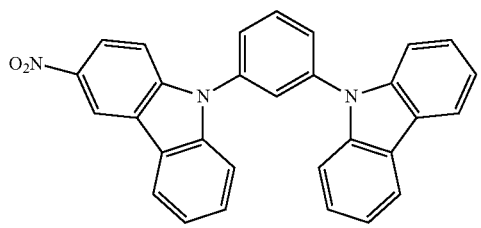
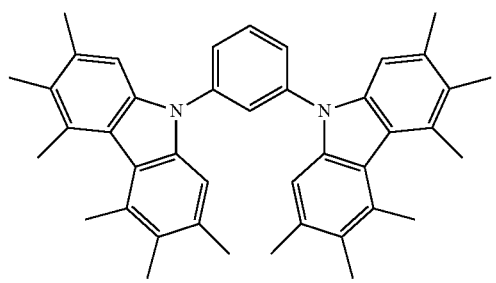
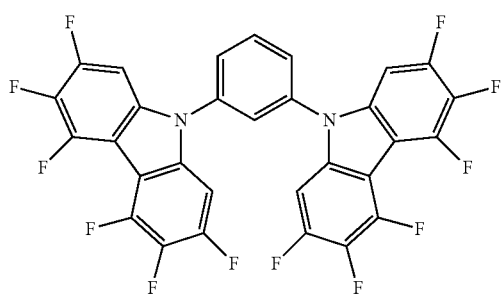

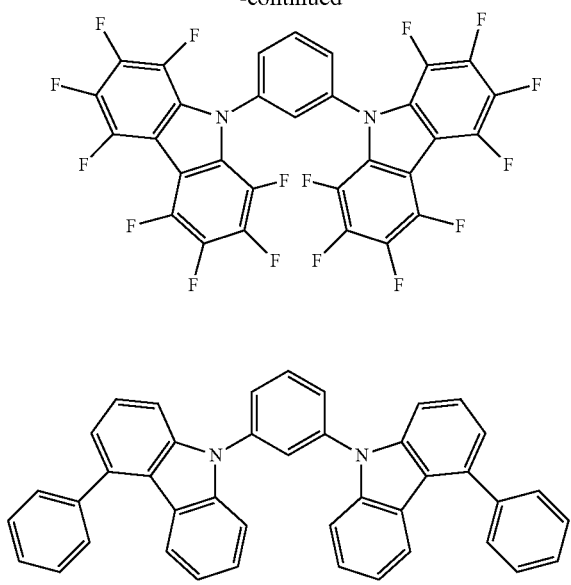
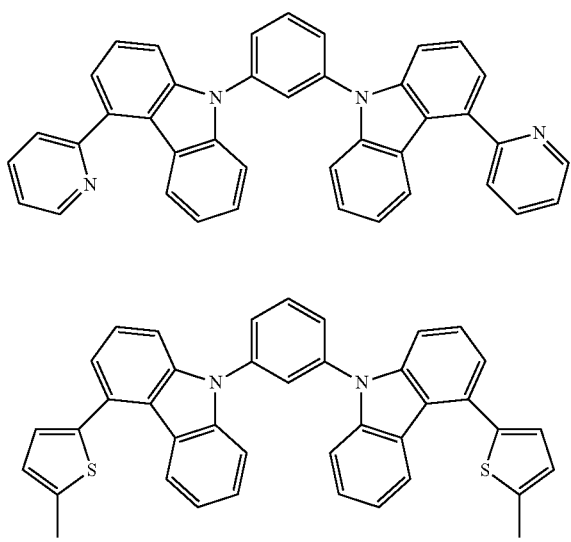
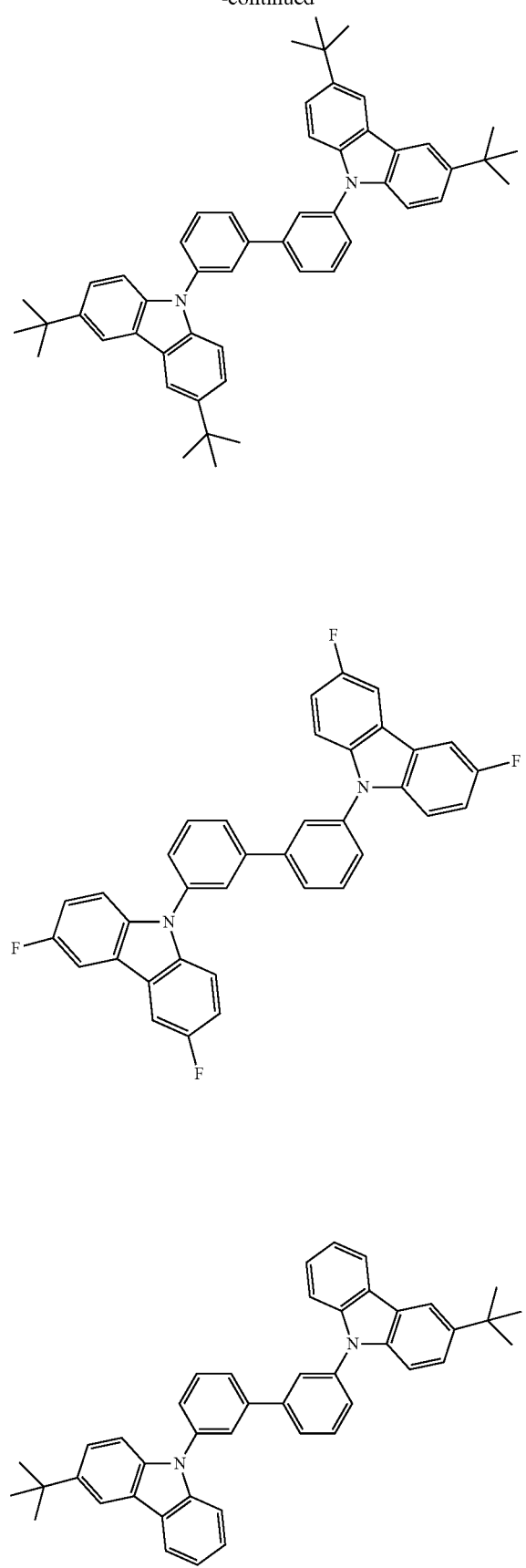

69
-continued
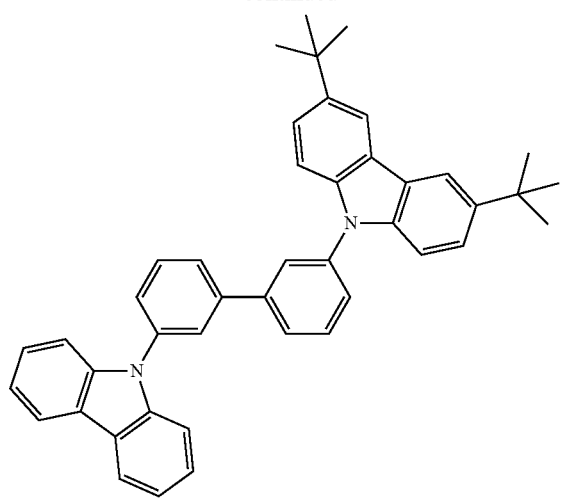
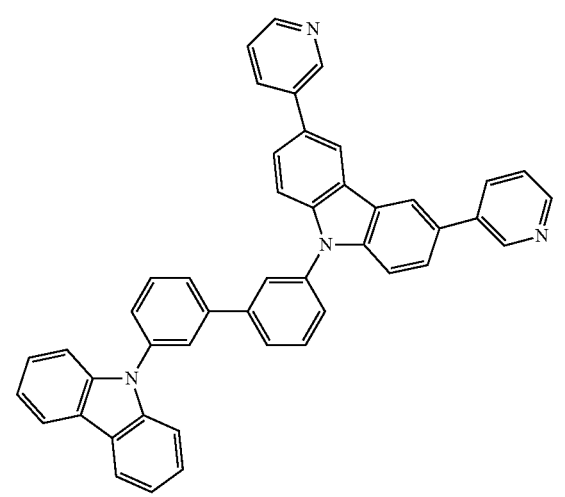
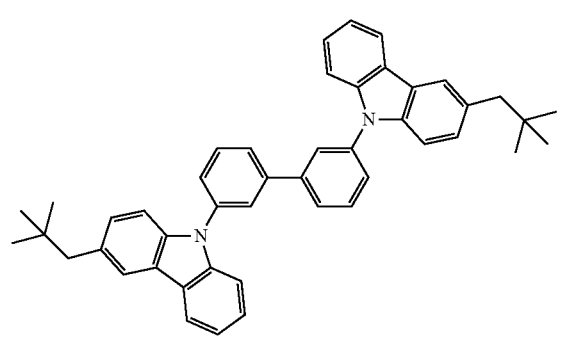
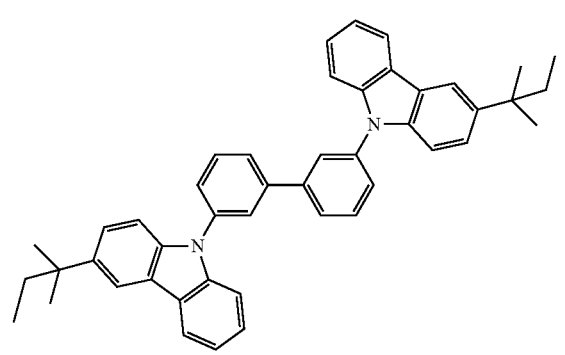
70
-continued
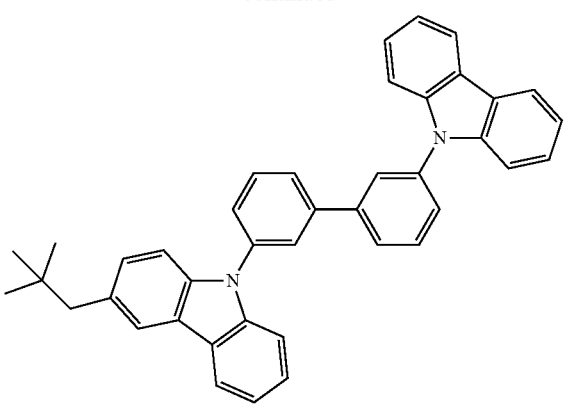
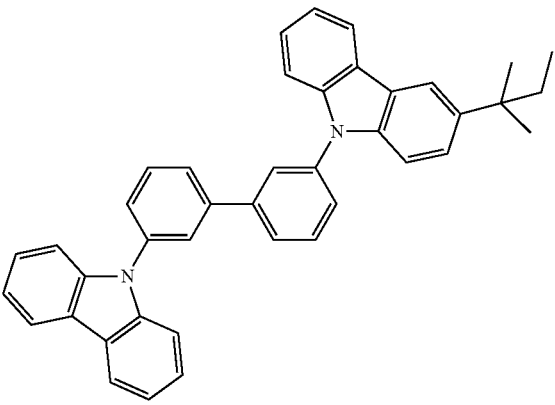
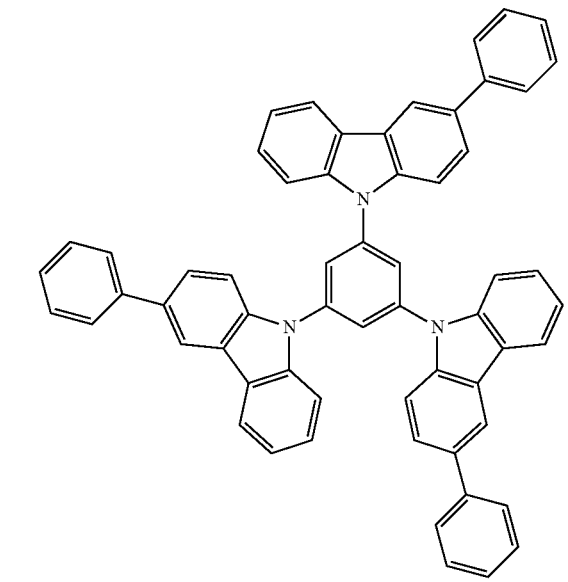

71
-continued
72
-continued
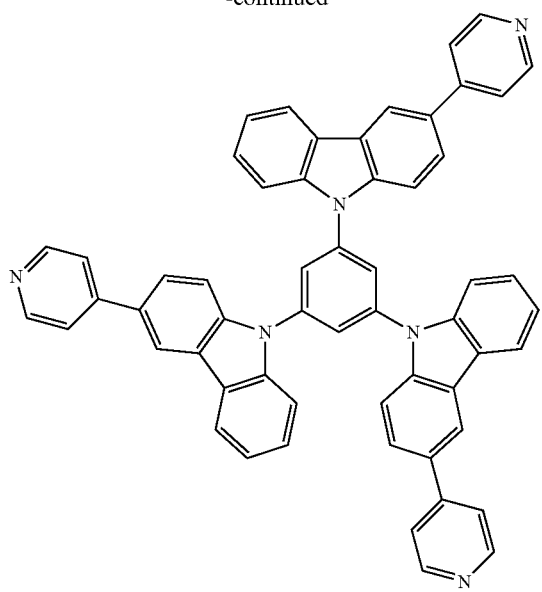
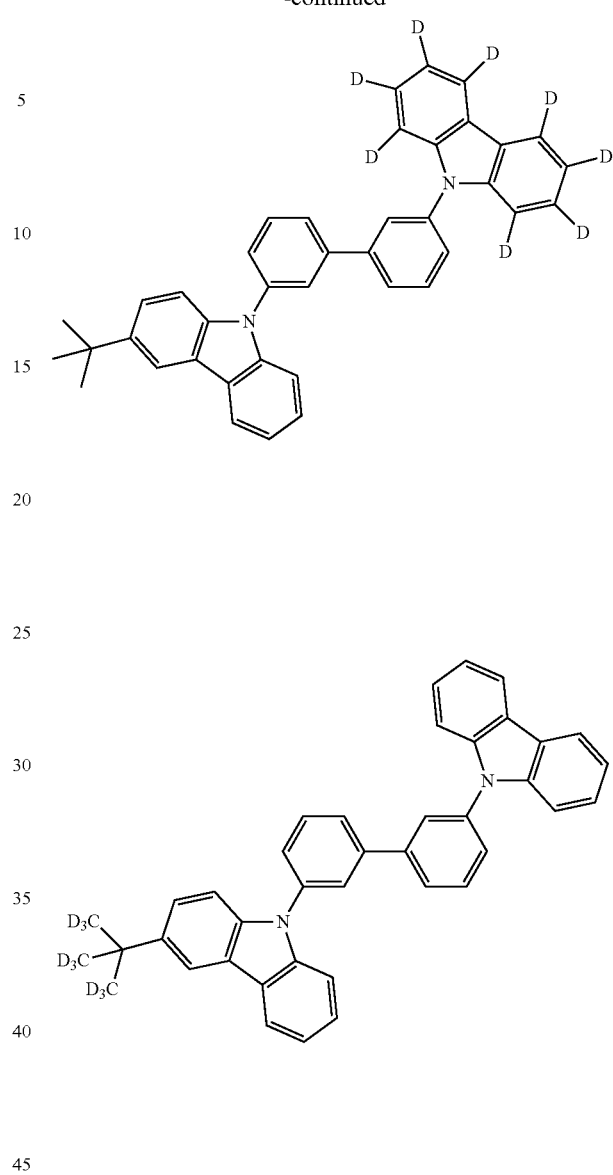
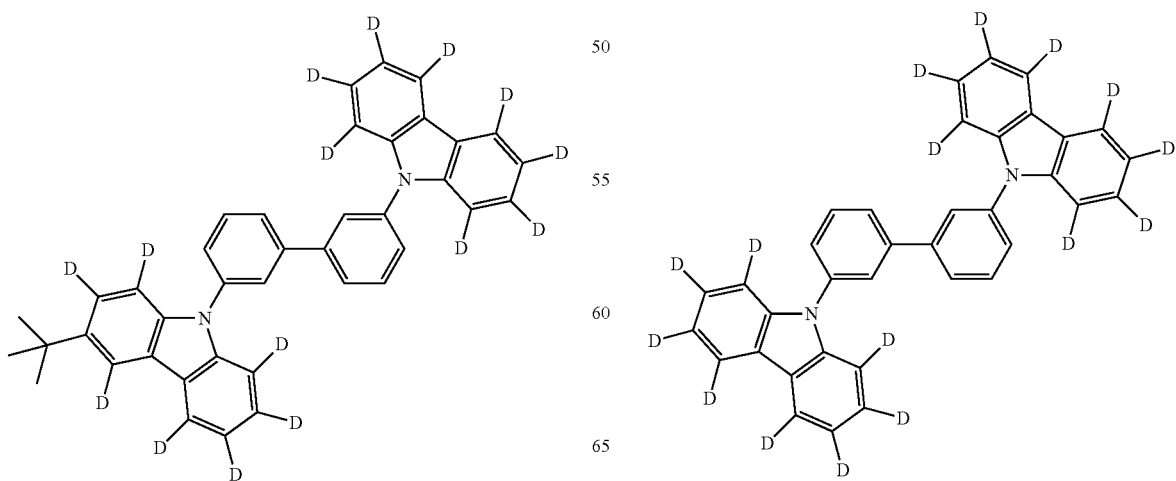

73
-continued
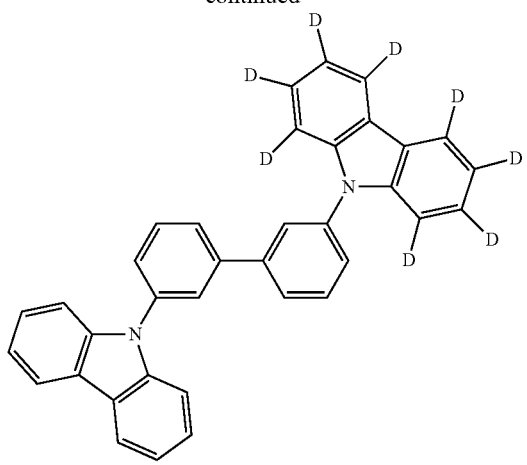
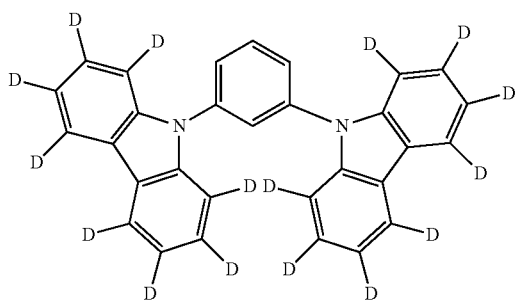
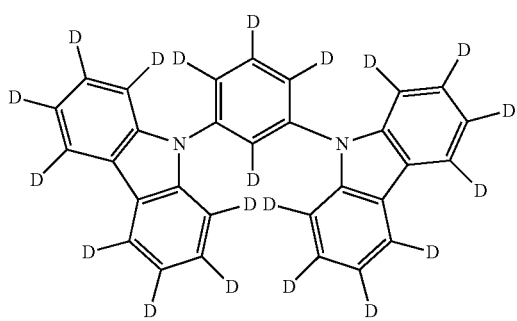
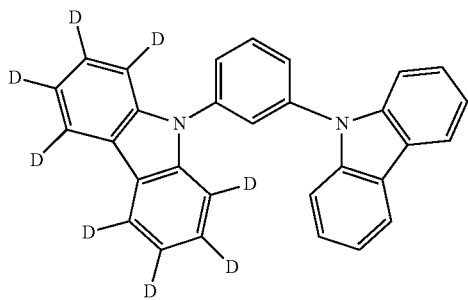
74
-continued
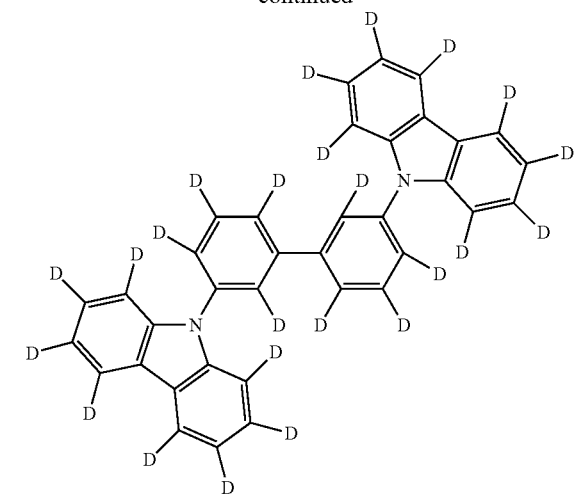
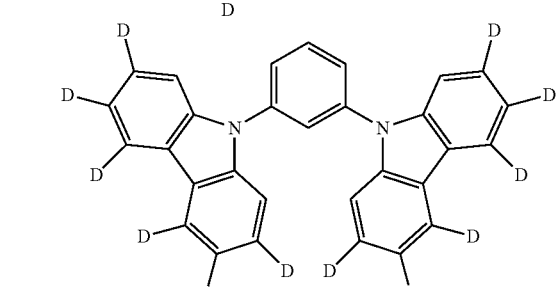
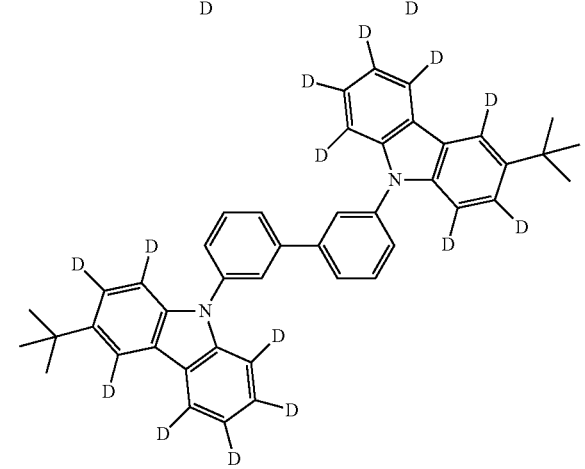
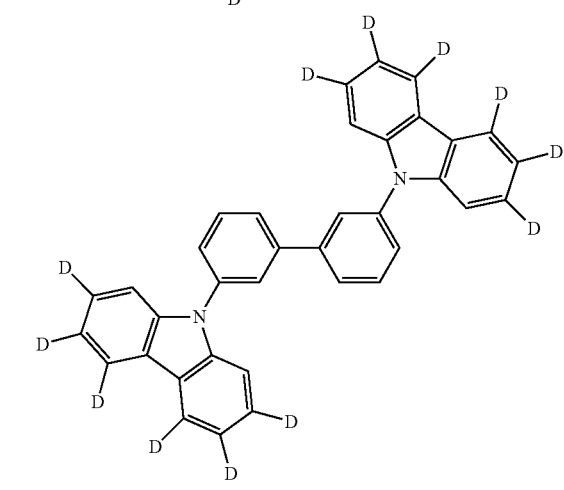

[Compound Represented by Formula (PQ-1)]

The compound represented by Formula (PQ-1) will be described.

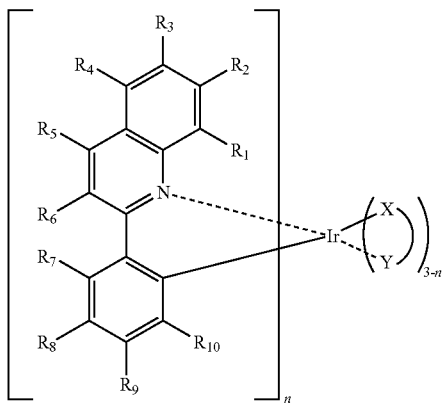

(PQ-1)

(In Formula (PQ-1), each of $R_1$ to $R_{10}$ independently represents a hydrogen atom or a substituent, and the substituents may be bonded to each other to form a ring if possible, X—Y represents a mono-anionic bidentate ligand, and n represents an integer of 1 to 3).

The substituents represented by $R_1$ to $R_{10}$ may include the above group A of substituents. $R_1$ to $R_{10}$ are preferably a hydrogen atom, an alkyl group (the alkyl group may have a fluorine atom, and preferably 1 to 8 carbon atoms, and more preferably 1 to 6 carbon atoms), a cycloalkyl group (preferably 3 to 20 carbon atoms, more preferably 3 to 10 carbon atoms, and even more preferably 5 to 10 carbon atoms), an aryl group (preferably 6 to 12 carbon atoms, and more preferably 6 to 10 carbon atoms), an amino group, an alkoxy group (preferably 1 to 8 carbon atoms, and more preferably 1 to 6 carbon atoms), an aryloxy group (preferably 6 to 12 carbon atoms, and more preferably 6 to 10 carbon atoms), a heterocyclic oxy group (preferably 2 to 12 carbon atoms, and more preferably 3 to 10 carbon atoms), a cyano group, a heterocyclic group (preferably 2 to 12 carbon atoms, and more preferably 3 to 10 carbon atoms), a silyl group, a silyloxy group and a fluorine atom, more preferably a hydrogen atom, an alkyl group, a cycloalkyl group, an aryl group, an amino group, an alkoxy group, a cyano group, a heterocyclic group, a silyl group and a fluorine atom, even more preferably a hydrogen atom, an alkyl group and an aryl group, even more preferably a hydrogen atom, a methyl group, an ethyl group, an isopropyl group, a t-butyl group, a neopentyl group, an isobutyl group, a phenyl group, a naphthyl group, a phenanthryl group and a tolyl group, and particularly more preferably a hydrogen atom, a methyl group and a phenyl group.

The substituents may be bonded to each other to form a ring if possible. In the case where the ring is formed, it is preferable that adjacent two of $R_1$ to $R_{10}$ are bonded to each other to form a ring, and it is more preferable that $R_7$ and $R_8$, $R_8$ and $R_9$, or $R_9$ and $R_{10}$ are bonded to each other to form a ring. In the case where $R_7$ and $R_8$, $R_8$ and $R_9$, or $R_9$ and $R_{10}$ are bonded to each other to form a ring, the ring that is simultaneously formed with the benzene ring with which $R_7$ to $R_{10}$ are substituted, may include an aryl ring which may be substituted with an alkyl group and an alkoxy group.

The aryl ring to be formed is preferably an aryl ring having 6 to 30 carbon atoms, and more preferably an aryl ring having 6 to 15 carbon atoms. The aryl ring to be formed may include, for example, a naphthalene ring, a phenanthrene ring and a fluorene ring, preferably, a naphthalene ring or a fluorene ring, and more preferably a naphthalene ring. These rings may have substituents such as an alkyl group and an alkoxy group, and a naphthalene ring or fluorene ring which may be substituted with an alkyl group or alkoxy group is preferable.

In Formula (PQ-1), it is preferable that each of 0 to 3 of $R_1$ to $R_6$ independently represents an alkyl group, a cycloalkyl group, an aryl group, a cyano group or a fluorine atom, and the remaining $R_1$ to $R_6$ are all a hydrogen atom, it is more preferable that 0 or 1 of $R_1$ to $R_6$ represents an alkyl group, a cycloalkyl group, an aryl group, a cyano group or a fluorine atom, and all of the remaining $R_1$ to $R_6$ are a hydrogen atom, and it is even more preferable that all of $R_1$ to $R_6$ are a hydrogen atom for enhancement of durability.

In Formula (PQ-1), it is preferable that each of 0 to 2 of $R_7$ to $R^{10}$ independently represents an alkyl group, an aryl group, a cyano group, a heterocyclic group or a fluorine atom and all of the remaining $R_7$ to $R_{10}$ are a hydrogen atom, it is more preferable that each of 0 to 2 of $R_7$ to $R_{10}$ independently represents an alkyl group, an aryl group, a cyano group or a fluorine atom, and all of the remaining $R_7$ to $R_{10}$ are a hydrogen atom, and it is even more preferable that $R_9$ represents an aryl group, and all of $R_7$, $R_8$ and $R_{10}$ are a hydrogen atom. Further, even though $R_7$ and $R_8$, $R_8$ and $R_9$, or $R_9$ and $R_{10}$ may be bonded to each other to form the above-described ring, and when a ring is formed, the above-described aryl ring is more preferably formed, and the benzene ring is even more preferably formed.

n is preferably 2 or 3, and more preferably 2.

(X—Y) represents a mono-anionic bidentate ligand. It is considered that these ligands may not contribute directly to light emission characteristics, and may control light emission characteristics of a molecule. The mono-anionic bidentate ligand to be used in a light emitting material may, be selected from those known in the art. Examples of the mono-anionic bidentate ligand include a ligand described on pages 89 and 90 of Lamansky, et al., the pamphlet of International Publication No. WO02/15645A, but the present invention is not limited thereto. Preferred mono-anionic bidentate ligands include acetylacetonate (acac) and picolinate (pic), and derivatives thereof. In the present invention, from the viewpoints of stability and high light emission quantum yield of the complex, the mono-anionic bidentate ligand is preferably acetylacetonate. In the following formula, M represents a metal atom.

$R_1$ to $R_6$ are preferably a hydrogen atom. Further, $R_9$ is preferably an aryl group.

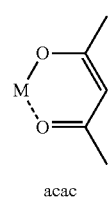

acac

The compound represented by Formula (PQ-1) is preferably a compound represented by the following Formula (PQ-2).

(PQ-2)

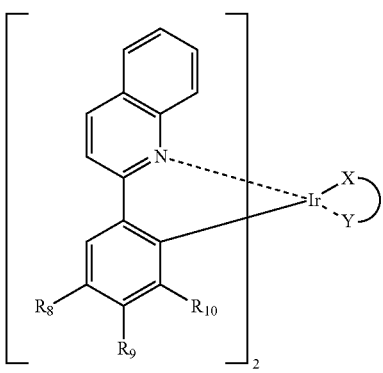

(In Formula (PQ-2), $R_8$ to $R_{10}$ represent a hydrogen atom or a substituent. If possible, substituents may be linked to each other to form a ring. X—Y represents a mono-anionic bidentate ligand)

$R_8$ to $R_{10}$ and X—Y have the same meaning as $R_8$ to $R_{10}$ and X—Y in Formula (PQ-1), and preferred ranges thereof are also the same.

Specific examples of the compound represented by Formula (PQ-1) are listed below, but are not limited to the following examples.

FR-1

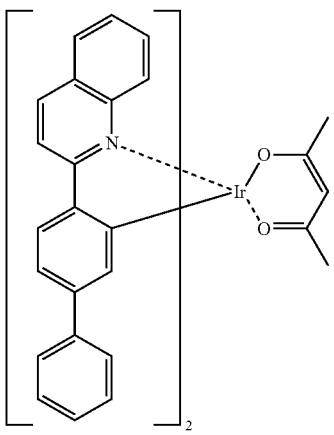

FR-2

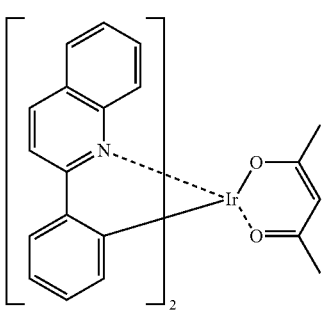

FR-3

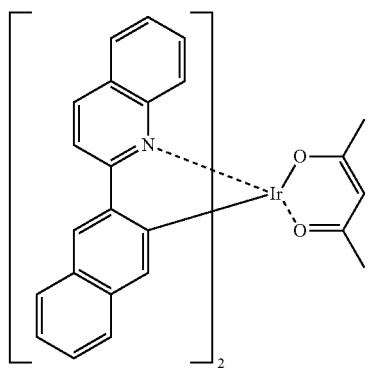

FR-4

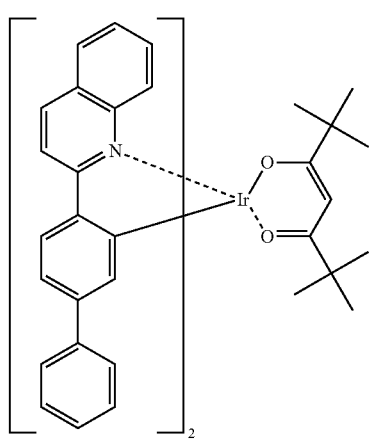

FR-5

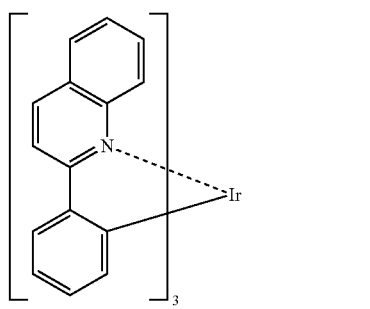

FR-6

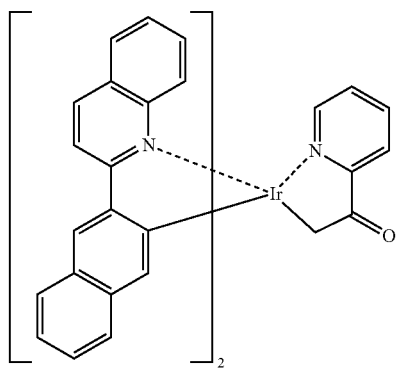

FR-7
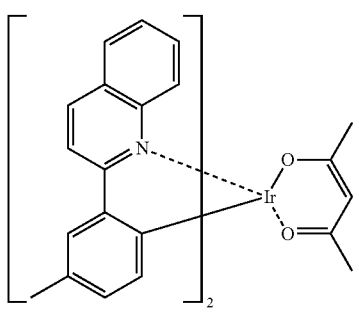
FR-8
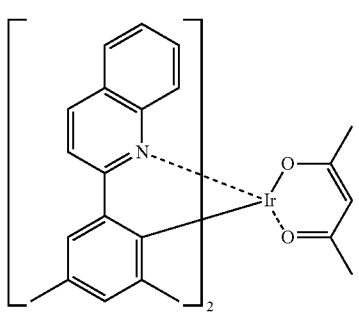
FR-9
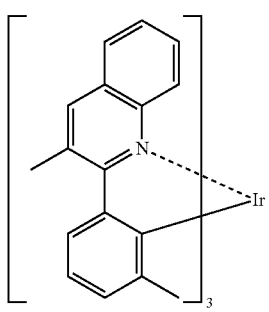
FR-10
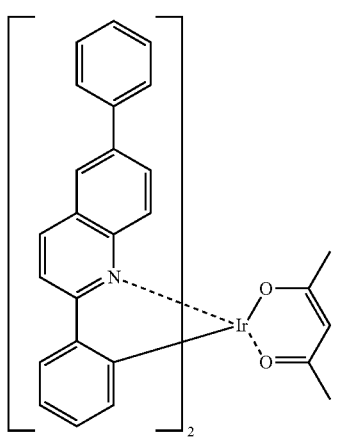
FR-11
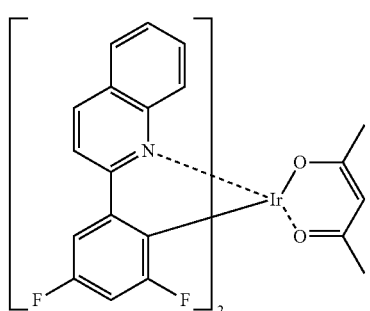
FR-12
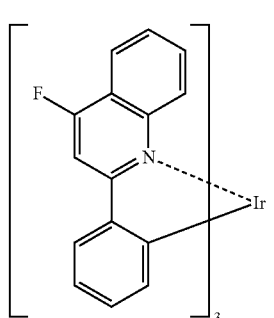
FR-13
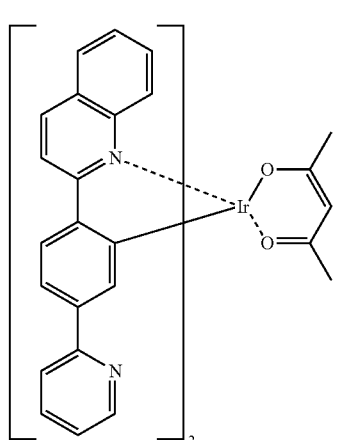
FR-14
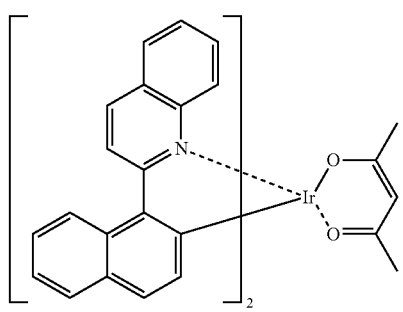

FR-15
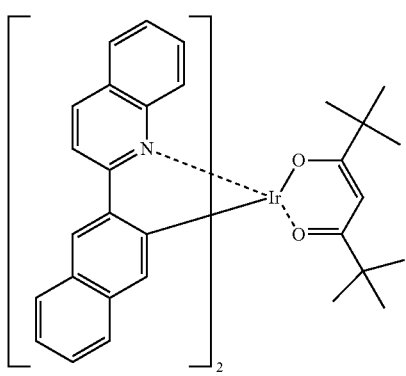
FR-16
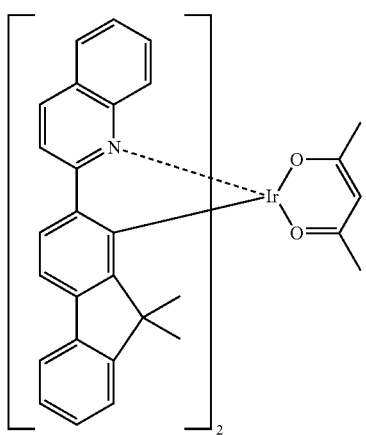
FR-17
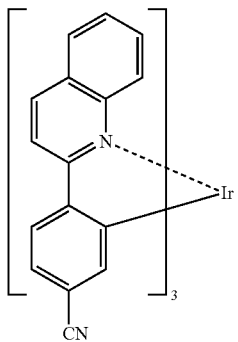
FR-18
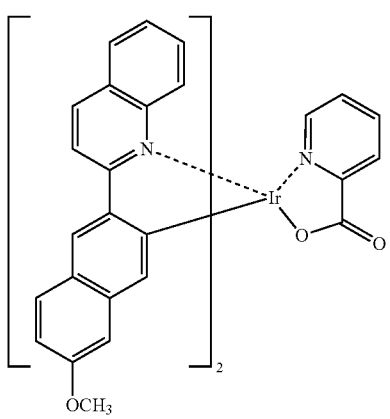
FR-19
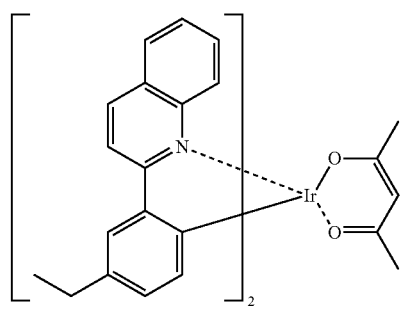
FR-20
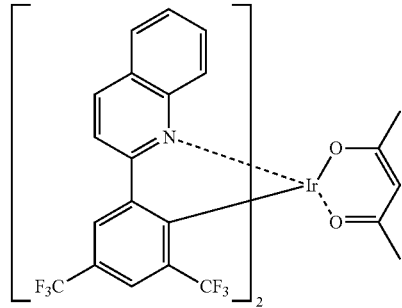
FR-21
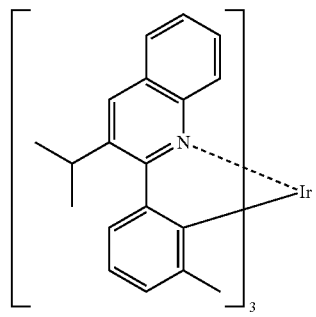
FR-22
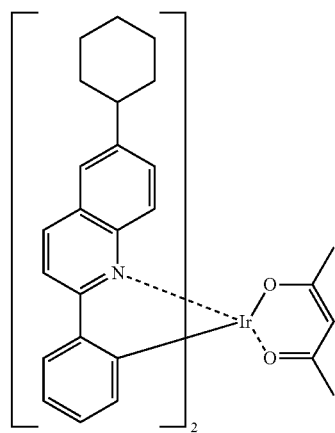

FR-23

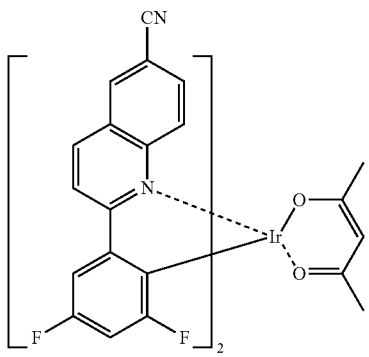

FR-24

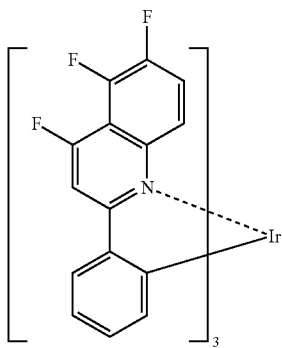

Compounds exemplified as the compounds represented by the above Formula (PQ-1) may be synthesized by various methods, for example, a method described in Japanese Patent No. 3929632, and the like. For example, FR-2 may be synthesized using 2-phenylquinoline as a starting raw material by a method described on page 18, lines 2 to 13 of Japanese Patent No. 3929632. Further, FR-3 may be synthesized using 2-(2-naphthyl)quinoline as a starting raw material by a method described on page 18, line 14 to page 19, line 8 of Japanese Patent No. 3929632.

In the present invention, when the compound represented by Formula (PQ-1) is contained in the light emitting layer, the content thereof is preferably 0.1 to 30 mass %, more preferably 2 to 20 mass %, and even more preferably 5 to 15 mass % in the light emitting layer.

In the present invention, although the compound represented by Formula (PQ-1) is contained in the light emitting layer, but the purpose of the compound represented by Formula (PQ-1) is not limited, and the compound may be further contained in any layer of the organic layers.

In the present invention, in order to further suppress a change in chromaticity when driving at a high temperature, the compound represented by Formula (1) and the compound represented by Formula (PQ-1) are contained in the light emitting layer.

It is preferable that the organic electroluminescence device according to the present invention further contains the compound represented by the following Formula (C-1) in the light emitting layer. By further containing the compound represented by the following Formula (C-1), a carrier balance becomes good, thereby improving efficiency and durability It is deemed that the hole transportable Ir complex and the electron transportable Pt complex coexist.

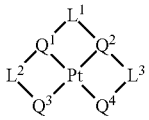

(C-1)

(In Formula (C-1), each of $Q^1$, $Q^2$, $Q^3$ and $Q^4$ independently represents a ligand which is coordinated to Pt. Each of $L^1$, $L^2$ and $L^3$ independently represents a single bond or divalent linking group.)

Formula (C-1) will be described. Each of $Q^1$, $Q^2$, $Q^3$ and $Q^4$ independently represents a ligand which is coordinated to Pt. Here, the bond of $Q^1$, $Q^2$, $Q^3$ and $Q^4$ to Pt may be any of a covalent bond, an ionic bond and a coordination bond. As an atom bound to Pt in each of $Q^1$, $Q^2$, $Q^3$ and $Q^4$, a carbon atom, a nitrogen atom, an oxygen atom, a sulfur atom and a phosphorus atom are preferable. Among the atoms bound to Pt in $Q^1$, $Q^2$, $Q^3$ and $Q^4$, it is preferable that at least one of the atoms is a carbon atom; it is more preferable that two of the atoms are a carbon atom; and it is particularly preferable that two of the atoms are a carbon atom and the other two are a nitrogen atom.

$Q^1$, $Q^2$, $Q^3$ and $Q^4$ bound to Pt with its carbon atom, may be an anionic ligand or a neutral ligand. Examples of the anionic ligand include a vinyl ligand, an aromatic hydrocarbon ring ligand (for example, a benzene ligand, a naphthalene ligand, an anthracene ligand, a phenanthrene ligand and the like), a heterocyclic ligand (for example, a furan ligand, a thiophene ligand, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, and a condensed ring including the same (for example, a quinoline ligand, a benzothiazole ligand and the like)). Examples of the neutral ligand include a carbene ligand.

$Q^1$, $Q^2$, $Q^3$ and $Q^4$ bound to Pt with its nitrogen atom, may be a neutral ligand or an anionic ligand. Examples of the neutral ligand include a nitrogen-containing aromatic heterocyclic ligand (a pyridine ligand, a pyrazine ligand, a pyrimidine ligand, a pyridazine ligand, a triazine ligand, an imidazole ligand, a pyrazole ligand, a triazole ligand, an oxazole ligand, a thiazole ligand, and a condensed ring including the same (for example, a quinoline ligand, a benzoimidazole ligand and the like)), an amine ligand, a nitrile ligand and an imine ligand. Examples of the anionic ligand include an amino ligand, an imino ligand, a nitrogen-containing aromatic heterocyclic ligand (a pyrrole ligand, an imidazole ligand, a triazole ligand, and a condensed ring including the same (for example, an indole ligand, a benzoimidazole ligand and the like)). $Q^1$, $Q^2$, $Q^3$ and $Q^4$ bound to Pt with its oxygen atom, may be a neutral ligand or an anionic ligand. Examples of the neutral ligand include an ether ligand, a ketone ligand, an ester ligand, an amide ligand and an oxygen-containing heterocyclic ligand (a furan ligand, an oxazole ligand, and a condensed ring including the same (a benzoxazole ligand and the like)). Examples of the anionic ligand include an alkoxy ligand, an aryloxy ligand, a heteroaryloxy ligand, an acyloxy ligand, a silyloxy ligand and the like.

$Q^1$, $Q^2$, $Q^3$ and $Q^4$ bound to Pt with its sulfur atom, may be a neutral ligand or an anionic ligand. Examples of the neutral ligand include a thioether ligand, a thioketone ligand, a thioester ligand, a thioamide ligand, a sulfur-containing heterocyclic ligand (a thiophene ligand, a thiazole ligand, and a condensed ring bodies (a benzothiazole ligand and the like)).

Examples of the anionic ligand include an alkyl mercapto ligand, an aryl mercapto ligand, a heteroaryl mercapto ligand and the like.

$Q^1$, $Q^2$, $Q^3$ and $Q^4$ bound to Pt with its phosphorus atom, may be a neutral ligand or an anionic ligand. Examples of the neutral ligand include a phosphine ligand, a phosphoric ester ligand, a phosphorous ester ligand and a phosphorus-containing heterocyclic ligand (a phosphinine ligand and the like). Examples of the anionic ligand include a phosphino ligand, a phosphinyl ligand, a phosphoryl ligand and the like.

The group represented by $Q^1$, $Q^2$, $Q^3$ and $Q^4$ may be substituted. As a substituent, those exemplified above for the group A of substituents may be appropriately applied. Also, the substituents may be linked to each other (when $Q^3$ and $Q^4$ are linked to each other, a Pt complex of a cyclic tetradentate ligand is formed).

The group represented by $Q^1$, $Q^2$, $Q^3$ and $Q^4$ is preferably an aromatic hydrocarbon ring ligand bound to Pt with its carbon atom, an aromatic heterocyclic ligand bound to Pt with its carbon atom, a nitrogen-containing aromatic heterocyclic ligand bound to Pt with its nitrogen atom, an acyloxy ligand, an alkyloxy ligand, an aryloxy ligand, a heteroaryloxy ligand and a silyloxy ligand, more preferably an aromatic hydrocarbon ring ligand bound to Pt with its carbon atom, an aromatic heterocyclic ligand bound to Pt with its carbon atom, a nitrogen-containing aromatic heterocyclic ligand bound to Pt with its nitrogen atom, an acyloxy ligand and an aryloxy ligand, and even more preferably an aromatic hydrocarbon ring ligand bound to Pt with its carbon atom, an aromatic heterocyclic ligand bound to Pt with its carbon atom, a nitrogen-containing aromatic heterocyclic ligand bound to Pt with its nitrogen atom and an acyloxy ligand.

$L^1$, $L^2$ and $L^3$ represent a single bond or a divalent linking group. Examples of the divalent linking group represented by $L^1$, $L^2$ and $L^3$ include an alkylene group (methylene, ethylene, propylene and the like), an arylene group (phenylene and naphthalenediyl), a heteroarylene group (pyridinediyl, thiophenediyl and the like), an imino group (—$NR_L$—) (a phenylimino group and the like), an oxy group (—O—), a thio group (—S—), a phosphinidene group (—$PR_L$—) (a phenylphosphinidene group and the like), a silylene group (—$SiR_L R_L'$—) (a dimethylsilylene group, a diphenylsilylene group and the like), or a combination thereof. Here, each of $R_L$ and $R_L'$ independently represents an alkyl group or an aryl group. These linking groups may further have a substituent.

From the viewpoints of stability and light emission quantum yield of the complex, each of $L^1$, $L^2$ and $L^3$ is preferably a single bond, an alkylene group, an arylene group, a heteroarylene group, an imino group, an oxy group, a thio group and a silylene group, more preferably a single bond, an alkylene group, an arylene group and an imino group, further preferably a single bond, an alkylene group and an arylene group, even further preferably a single bond, a methylene group and a phenylene group, even more preferably a single bond, and a di-substituted methylene group, even still further preferably a single bond, a dimethylmethylene group, a diethylmethylene group, a diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohexanediyl group, a cyclopentanediyl group, a fluorenediyl group and a fluoromethylmethylene group.

$L^1$ is particularly preferably a dimethylmethylene group, a diphenylmethylene group, and a cyclohexanediyl group, and most preferably a dimethylmethylene group.

$L^2$ and $L^3$ are most preferably a single bond.

The platinum complex represented by Formula (C-1) is more preferably a platinum complex represented by the following Formula (C-2).

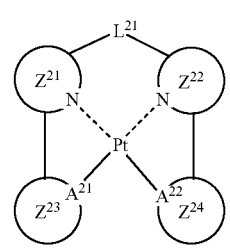

Formula (C-2)

(In the formula, $L^{21}$ represents a single bond or a divalent linking group. Each of $A^{21}$ and $A^{22}$ independently represents a carbon atom or a nitrogen atom. Each of $Z^{21}$ and $Z^{22}$ independently represents a nitrogen-containing aromatic heterocyclic ring. Each of $Z^{23}$ and $Z^{24}$ independently represents a benzene ring or an aromatic heterocyclic ring)

Formula (C-2) will be described. $L^{21}$ has the same meaning as $L^1$ in Formula (C-1), and the preferred ranges thereof are also the same.

Each of $A^{21}$ and $A^{22}$ independently represents a carbon atom or a nitrogen atom. It is preferable that at least either one of $A^{21}$ and $A^{22}$ is a carbon atom, and it is preferable that both of $A^{21}$ and $A^{22}$ are carbon atoms from the viewpoint of stability of the complex and light emission quantum yield of the complex.

Each of $Z^{21}$ and $Z^{22}$ independently represents a nitrogen-containing aromatic heterocyclic ring. Examples of the nitrogen-containing aromatic heterocyclic ring represented by $Z^{21}$ and $Z^{22}$ include a pyridine ring, a pyrimidine ring, a pyrazine ring, a triazine ring, an imidazole ring, a pyrazole ring, an oxazole ring, a thiazole ring, a triazole ring, an oxadiazole ring, a thiadiazole ring and the like. From the viewpoints of stability, control of light emission wavelength, and light emission quantum yield of the complex, the ring represented by $Z^{21}$ and $Z^{22}$ is preferably a pyridine ring, a pyrazine ring, an imidazole ring and a pyrazole ring, more preferably a pyridine ring, an imidazole ring and a pyrazole ring, even more preferably a pyridine ring and a pyrazole ring, and particularly preferably a pyridine ring.

The nitrogen-containing aromatic heterocyclic ring represented by $Z^{21}$ and $Z^{22}$ may be substituted. As a substituent on the carbon atom, the group A of substituents may be applied, and as a substituent on the nitrogen atom, the group B of substituents may be applied. The substituent on the carbon atom is preferably an alkyl group, a perfluoroalkyl group, an aryl group, an aromatic heterocyclic group, a dialkylamino group, a diarylamino group, an alkoxy group, a cyano group and a halogen atom. Although the substituent is appropriately selected for the purpose of controlling the light emission wavelength or potential, in the case of shortening the wavelength, the substituent is preferably an electron donating group, a fluorine atom and an aromatic ring group, and for example, an alkyl group, a dialkylamino group, an alkoxy group, a fluorine atom, an aryl group, an aromatic heterocyclic group and the like are selected. Also, in the case of lengthening the wavelength, the substituent is preferably an electron-withdrawing group, and for example, a cyano group, a perfluoroalkyl group and the like are selected. The substituent on the nitrogen atom is preferably an alkyl group, an aryl group and an aromatic heterocyclic group, and from the viewpoint of stability of the complex, an alkyl group and an aryl group are preferable. The substituents may be linked to each other to form a condensed ring, and examples of the ring to be formed include a benzene ring, a pyridine ring, a pyrazine ring, a pyridazine ring, a pyrimidine ring, an imidazole ring, an oxazole ring, a thiazole ring, a pyrazole ring, a thiophene ring, a furan ring and the like.

Each of $Z^{23}$ and $Z^{24}$ independently represents a benzene ring or an aromatic heterocyclic ring. Examples of the nitrogen-containing aromatic heterocyclic ring represented by $Z^{23}$ and $Z^{24}$ include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophene ring, a furan ring and the like. From the viewpoints of stability, control of light emission wavelength, and light emission quantum yield of the complex, the ring represented by $Z^{23}$ and $Z^{24}$ is preferably a benzene ring, a pyridine ring, a pyrazine ring, an imidazole ring, a pyrazole ring and a thiophene ring, more preferably a benzne ring, a pyridine ring and a pyrazole ring, and even more preferably a benzene ring and a pyridine ring.

The benzene ring and nitrogen-containing aromatic heterocyclic ring represented by $Z^{23}$ and $Z^{24}$ may be substituted. As a substituent on the carbon atom, the group A of substituents may be applied, and as a substituent on the nitrogen atom, the group B of substituents may be applied. The substituent on the carbon atom is preferably an alkyl group, a perfluoroalkyl group, an aryl group, an aromatic heterocyclic group, a dialkylamino group, a diarylamino group, an alkoxy group, a cyano group and a halogen atom. Although the substituent is appropriately selected for the purpose of controlling the light emission wavelength or potential, in the case of lengthen the wavelength, the substituent is preferably an electron donating group and an aromatic ring group, and for example, an alkyl group, a dialkylamino group, an alkoxy group, an aryl group, an aromatic heterocyclic group and the like are selected. Also, in the case of shortening the wavelength, the substituent is preferably an electron-withdrawing group, and for example, a fluorine group, a cyano group, a perfluoroalkyl group and the like are selected. The substituent on the nitrogen atom is preferably an alkyl group, an aryl group and an aromatic heterocyclic group, and from the viewpoint of stability of the complex, an alkyl group and an aryl group are preferable. The substituents may be linked to each other to form a condensed ring, and examples of the ring to be formed include a benzene ring, a pyridine ring, a pyrazine ring, a pyridazine ring, a pyrimidine ring, an imidazole ring, an oxazole ring, a thiazole ring, a pyrazole ring, a thiophene ring, a furan ring and the like.

Among platinum complexes represented by Formula (C-2), a more preferable aspect is a platinum complex represented by the following Formula (C-3).

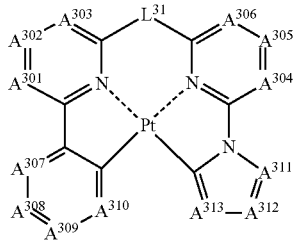

(C-3)

(In the formula, each of $A^{301}$ to $A^{313}$ independently represents C—R or a nitrogen atom. R represents a hydrogen atom or a substituent. $L^{31}$ represents a single bond or a divalent linking group)

Formula (C-3) will be described. $L^{31}$ has the same meaning as $L^{21}$ in Formula (C-2), and preferred ranges thereof are also the same. Each of $A^{301}$ to $A^{306}$ independently represents C—R or a nitrogen atom. R represents a hydrogen atom or a substituent. As a substituent represented by R, those exemplified above for the group A of substituents may be applied.

$A^{301}$ to $A^{306}$ are preferably C—R, and R groups may be linked to each other to form a ring. When $A^{301}$ to $A^{306}$ are C—R, the R groups of $A^{302}$ and $A^{305}$ are preferably a hydrogen atom, an alkyl group, an aryl group, an amino group, an alkoxy group, an aryloxy group, a fluorine group and a cyano group, more preferably a hydrogen atom, an amino group, an alkoxy group, an aryloxy group and a fluorine group, and particularly preferably a hydrogen atom and a fluorine group. The R groups of $A^{301}$, $A^{303}$, $A^{304}$ and $A^{306}$ are preferably a hydrogen atom, an alkyl group, an aryl group, an amino group, an alkoxy group, an aryloxy group, a fluorine group and a cyano group, more preferably a hydrogen atom, an amino group, an alkoxy group, an aryloxy group and a fluorine group, and particularly preferably a hydrogen atom. Each of $A^{307}$, $A^{308}$, $A^{309}$ and $A^{310}$ independently represents C—R or a nitrogen atom. R represents a hydrogen atom or a substituent. As a substituent represented by R, those exemplified above for the group A of substituents may be applied. When $A^{307}$, $A^{308}$, $A^{309}$ and $A^{310}$ are C—R, R is preferably a hydrogen atom, an alkyl group, a perfluoroalkyl group, an aryl group, an aromatic heterocyclic group, a dialkylamino group, a diarylamino group, an alkyloxy group, a cyano group and a halogen atom, more preferably a hydrogen atom, an alkyl group, a perfluoroalkyl group, an aryl group, a dialkylamino group, a cyano group and a fluorine group, and even more preferably a hydrogen atom, an alkyl group, a trifluoromethyl group and a fluorine atom. Also, if possible, the substituents may be linked to each other to form a condensed ring structure. When the light emission wavelength is shifted to the short wavelength side, $A^{308}$ is preferably a nitrogen atom.

When $A^{307}$ to $A^{310}$ are selected as described above, examples of a six-membered ring to be formed by two carbon atoms and $A^{307}$, $A^{308}$, $A^{309}$ and $A^{310}$ include a benzene ring, a pyridine ring, a pyrazine ring, a pyrimidine ring, a pyridazine ring and a triazine ring, more preferably a benzene ring, a pyridine ring, a pyrazine ring, a pyrimidine ring and a pyridazine ring, and particularly preferably a benzene ring and a pyridine ring. Since the six-membered ring is a pyridine ring, a pyrazine ring, a pyrimidine ring and a pyridazine ring (particularly preferably a pyridine ring), it is advantageous in that the acidity of a hydrogen atom existing at a position where a metal-carbon bond is formed is enhanced as compared to the case of a benzene ring, and thus, a metal complex is more easily formed.

Each of $A^{311}$, $A^{312}$ and $A^{313}$ independently represents C—R or a nitrogen atom. R represents a hydrogen atom or a substituent. As a substituent represented by R, those exemplified above for the group A of substituents may be applied. When $A^{311}$, $A^{312}$ and $A^{313}$ are C—R, R is preferably a hydrogen atom, an alkyl group, a perfluoroalkyl group, an aryl group, an aromatic heterocyclic group, a dialkylamino group, a diarylamino group, an alkyloxy group, a cyano group and a halogen atom, more preferably a hydrogen atom, an alkyl group, a perfluoroalkyl group, an aryl group, a dialkylamino group, a cyano group and a fluorine group, and even more preferably a hydrogen atom, an alkyl group, a trifluoromethyl group and a fluorine atom. Also, if possible, the substituents may be linked to each other to form a condensed ring structure. At least one of $A^{311}$, $A^{312}$ and $A^{313}$ is preferably a nitrogen atom, and $A^{311}$ is particularly preferably a nitrogen atom.

Among platinum complexes represented by Formula (C-2), a more preferable aspect is a platinum complex represented by the following Formula (C-4).

Formula (C-4)

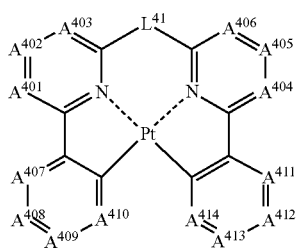

(In Formula (C-4), each of $A^{401}$ to $A^{414}$ independently represents C—R or a nitrogen atom. R represents a hydrogen atom or a substituent. $L^{41}$ represents a single bond or a divalent linking group.)

Formula (C-4) will be described.

Each of $A^{401}$ to $A^{414}$ independently represents C—R or a nitrogen atom. R represents a hydrogen atom or a substituent. $A^{401}$ to $A^{406}$ and $L^{41}$ have the same meaning as $A^{301}$ to $A^{306}$ and $L^{31}$ in Formula (C-3), and preferred ranges thereof are also the same.

For $A^{407}$ to $A^{414}$, the number of nitrogen atoms in each of $A^{407}$ to $A^{410}$ and $A^{411}$ to $A^{414}$ is preferably 0 to 2, and more preferably 0 or 1. When the light emission wavelength is shifted to the short wavelength side, $A^{408}$ or $A^{412}$ is preferably a nitrogen atom, and both of $A^{408}$ and $A^{412}$ are more preferably nitrogen atoms.

When $A^{407}$ to $A^{414}$ represent C—R, the Rs of $A^{408}$ and $A^{412}$ are preferably a hydrogen atom, an alkyl group, a perfluoroalkyl group, an aryl group, an amino group, an alkoxy group, an aryloxy group, a fluorine group and a cyano group, more preferably a hydrogen atom, a perfluoroalkyl group, an alkyl group, an aryl group, a fluorine group and a cyano group, and particularly preferably a hydrogen atom, a phenyl group, a perfluoroalkyl group and a cyano group. The R groups of $A^{407}$, $A^{409}$, $A^{411}$ and $A^{413}$ are preferably a hydrogen atom, an alkyl group, a perfluoroalkyl group, an aryl group, an amino group, an alkoxy group, an aryloxy group, a fluorine group and a cyano group, more preferably a hydrogen atom, a perfluoroalkyl group, a fluorine group and a cyano group, and particularly preferably a hydrogen atom, a phenyl group and a fluorine group. The R groups of $A^{410}$ and $A^{414}$ are preferably a hydrogen atom and a fluorine group, and more preferably a hydrogen atom. When any one of $A^{407}$ to $A^{409}$ and $A^{411}$ to $A^{413}$ represents C—R, R groups may be linked to each other to form a ring.

Among platinum complexes represented by Formula (C-2), a more preferable aspect is a platinum complex represented by the following Formula (C-5).

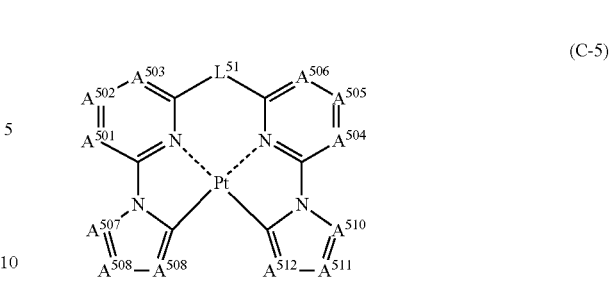

Formula (C-5)

(In Formula (C-5), each of $A^{501}$ to $A^{512}$ independently represents C—R or a nitrogen atom. R represents a hydrogen atom or a substituent. $L^{51}$ represents a single bond or a divalent linking group)

Formula (C-5) will be described. $A^{501}$ to $A^{506}$ and $L^{51}$ have the same meaning as $A^{301}$ to $A^{306}$ and $L^{31}$ in Formula (C-3), and preferred ranges thereof are also the same.

Each of $A^{507}$, $A^{508}$ and $A^{509}$, and $A^{510}$, $A^{511}$ and $A^{512}$ independently has the same meaning as $A^{311}$, $A^{312}$ and $A^{313}$ in Formula (C-3), and preferred ranges thereof are also the same.

Among platinum complexes represented by Formula (C-1), another more preferable aspect is a platinum complex represented by the following Formula (C-6).

Formula (C-6)

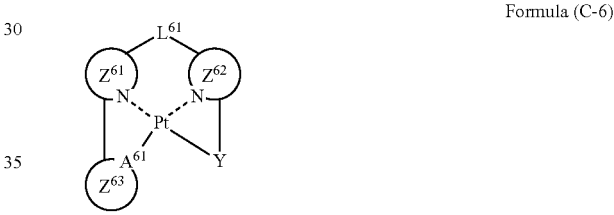

(In the formula, $L^{61}$ represents a single bond or a divalent linking group. Each of $A^{61}$ independently represents a carbon atom or a nitrogen atom. Each of $Z^{61}$ and $Z^{62}$ independently represents a nitrogen-containing aromatic heterocyclic ring. Each of $Z^{63}$ independently represents a benzene ring or an aromatic heterocyclic ring. Y is an anionic acyclic ligand bonded to Pt.)

Formula (C-6) will be described. $L^{61}$ has the same meaning as $L^1$ in Formula (C-1), and preferred ranges thereof are also the same.

$A^{61}$ represents a carbon atom or a nitrogen atom. From the viewpoint of stability of the complex and the viewpoint of light emission quantum yield of the complex, $A^{61}$ is preferably a carbon atom.

Each of $Z^{61}$ and $Z^{62}$ has the same meaning as $Z^{21}$ and $Z^{22}$ in Formula (C-2), respectively, and preferred ranges thereof are also the same. $Z^{63}$ has the same meaning as in $Z^{23}$ in Formula (C-2), and preferred ranges thereof are also the same.

Y is an anionic acyclic ligand bound to Pt. The acyclic ligand is one in which an atom bound to Pt does not form a ring in a ligand state. The atom bound to Pt in Y is preferably a carbon atom, a nitrogen atom, an oxygen atom and a sulfur atom, more preferably a nitrogen atom and an oxygen atom, and most preferably an oxygen atom. Examples of Y bound to Pt with a carbon atom include a vinyl ligand. Examples of Y bound to Pt with a nitrogen atom include an amino ligand and an imino ligand. Examples of Y bound to Pt with an oxygen atom include an alkoxy ligand, an aryloxy ligand, a heteroaryloxy ligand, an acyloxy ligand, a silyloxy ligand, a carboxyl ligand, a phosphate ligand, a sulfonate ligand and the like. Examples of Y bound to Pt with a sulfur atom include an alkyl mercapto ligand, an aryl mercapto ligand, a heteroaryl mercapto ligand, a thiocarboxylate ligand and the like.

The ligand represented by Y may be substituted. As a substituent, those exemplified above for the group A of substituents may be appropriately applied. Also, the substituents may be linked to each other.

The ligand represented by Y is preferably a ligand bonded to Pt as an oxygen atom, more preferably an acyloxy ligand, an alkyloxy ligand, an aryloxy ligand, a heteroaryloxy ligand and a silyloxy ligand, and even more preferably an acyloxy ligand.

Among platinum complexes represented by Formula (C-6), a more preferable aspect is a platinum complex represented by the following Formula (C-7).

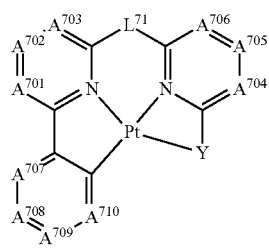

Formula (C-7)

(In the formula, each of $A^{701}$ to $A^{710}$ independently represents C—R or a nitrogen atom. R represents a hydrogen atom or a substituent. $L^{71}$ represents a single bond or a divalent linking group. Y is an anionic acyclic ligand bonded to Pt.)

Formula (C-7) will be described. $L^{71}$ has the same meaning as $L^{61}$ in Formula (C-6), and preferred ranges thereof are also the same. $A^{701}$ to $A^{710}$ have the same meaning as in $A^{301}$ to $A^{310}$ in Formula (C-3), and preferred ranges thereof are also the same. Y has the same meaning as that in Formula (C-6), and preferred ranges thereof are also the same.

Specific examples of the platinum complex represented by Formula (C-1) include compounds disclosed in [0143] to [0152], [0157] to [0158], and [0162] to [0168] of Japanese Patent Application Laid-Open No. 2005-310733, compounds disclosed in [0065] to [0083] of Japanese Patent Application Laid-Open No. 2006-256999, compounds disclosed in [0065] to [0090] of Japanese Patent Application Laid-Open No. 2006-93542, compounds disclosed in [0063] to [0071] of Japanese Patent Application Laid-Open No. 2007-73891, compounds disclosed in [0079] to [0083] of Japanese Patent Application. Laid-Open No. 2007-324309, compounds disclosed in [0055] to [0071] of Japanese Patent Application Laid-Open No. 2007-96255, and [0043] to [0046] of Japanese Patent Application Laid-Open No. 2006-313796, and other platinum complexes exemplified below.

1-1

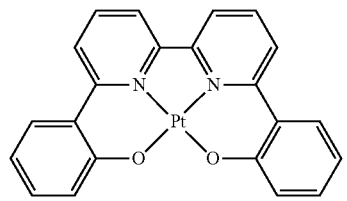

1-2

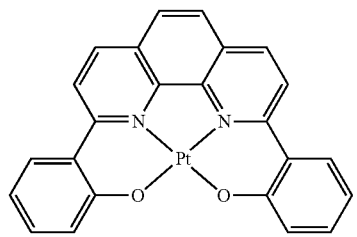

1-3

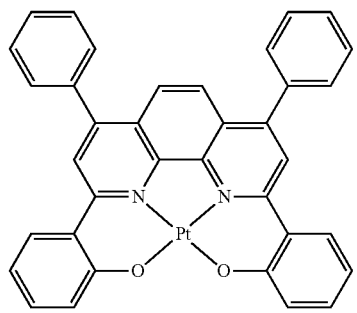

2-1

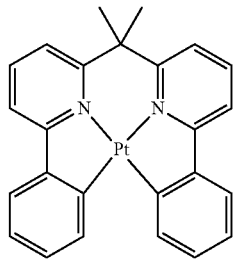

2-2

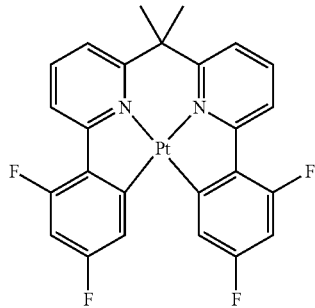

2-3

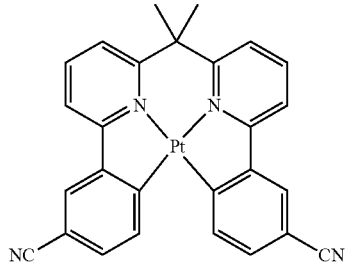

2-4
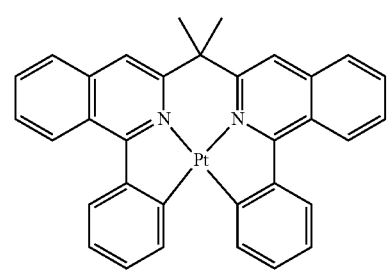
2-5
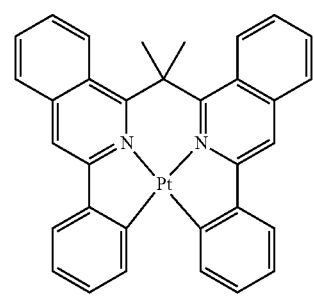
2-6
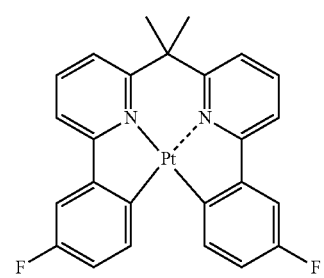
2-7
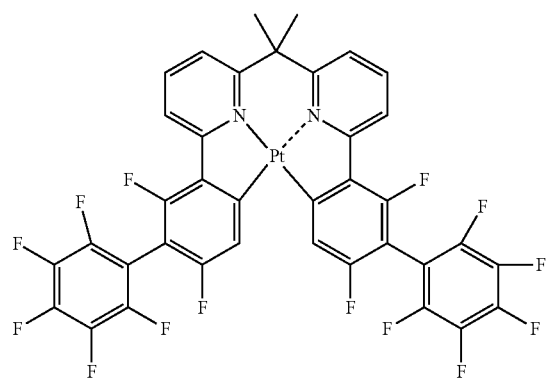
2-8
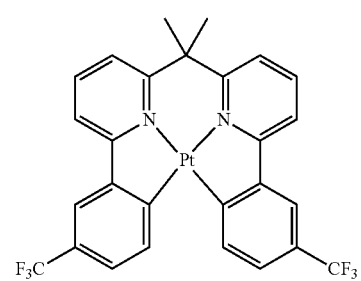
2-9
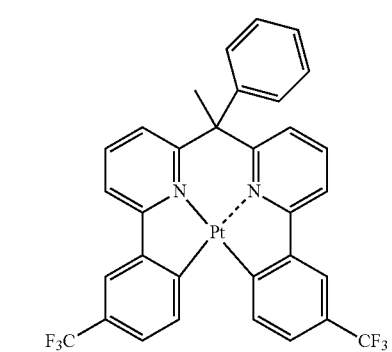
2-10
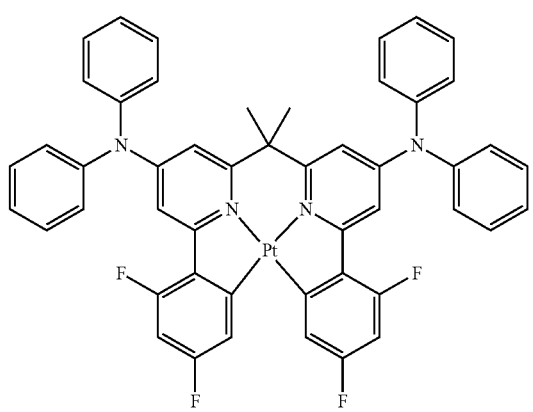
2-11
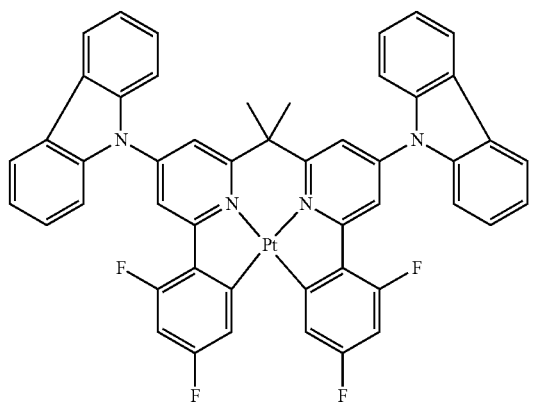
2-12
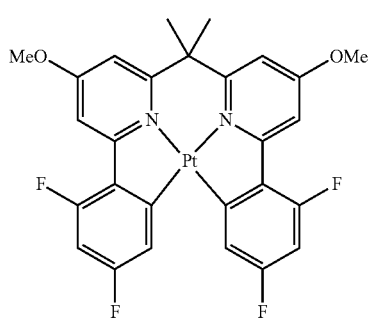

-continued
2-13
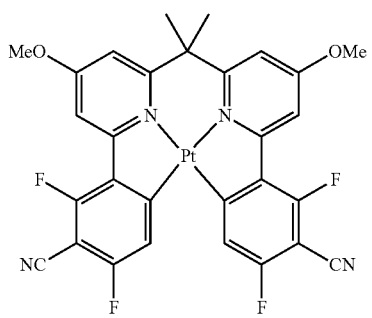
3-1
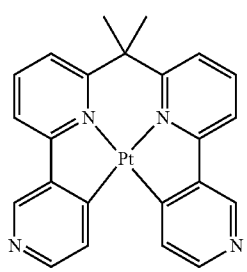
3-2
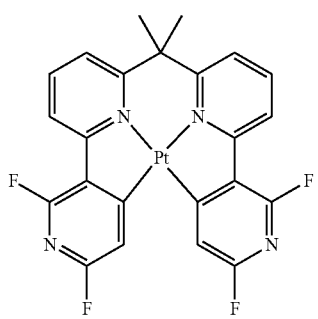
3-3
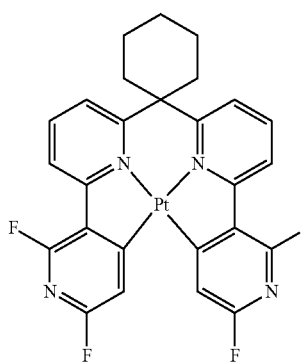
3-4
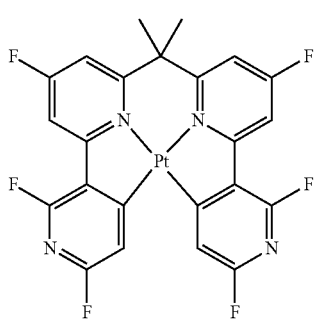
-continued
3-5
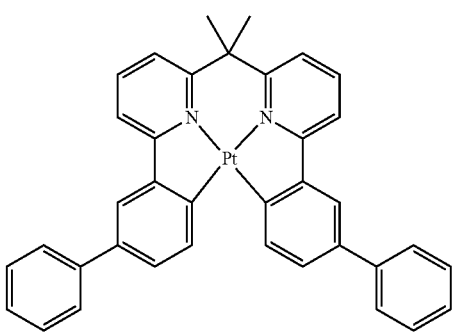
4-1
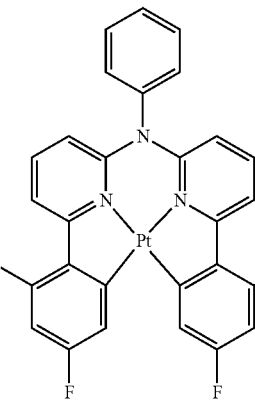
4-2
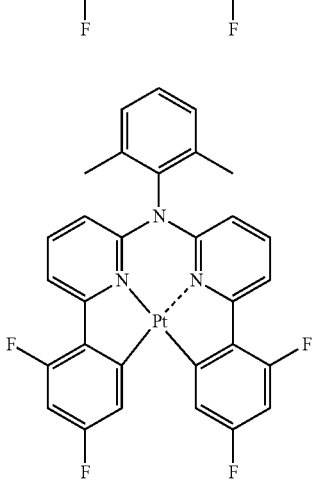
4-3
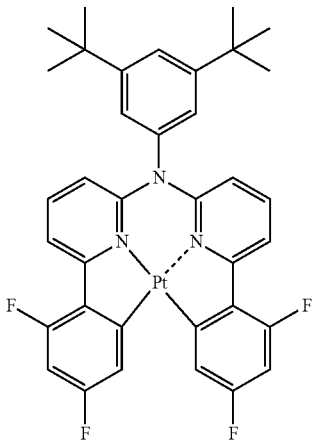

-continued
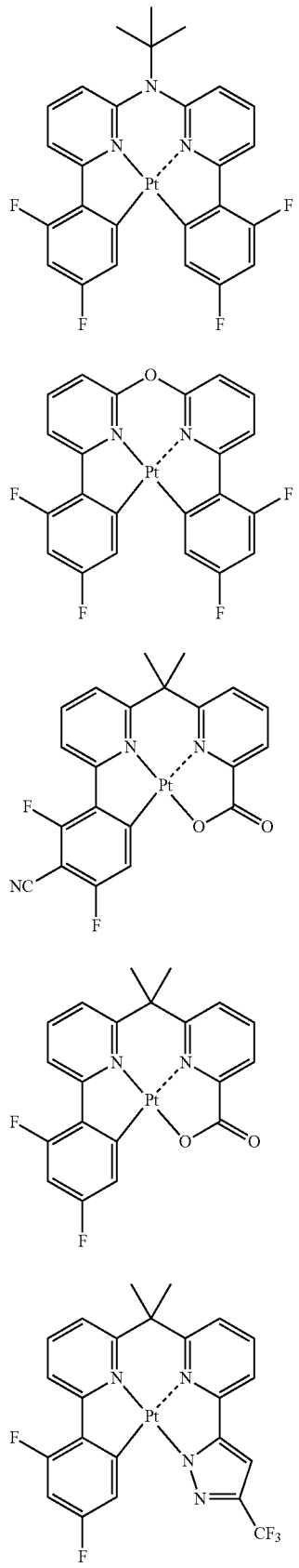
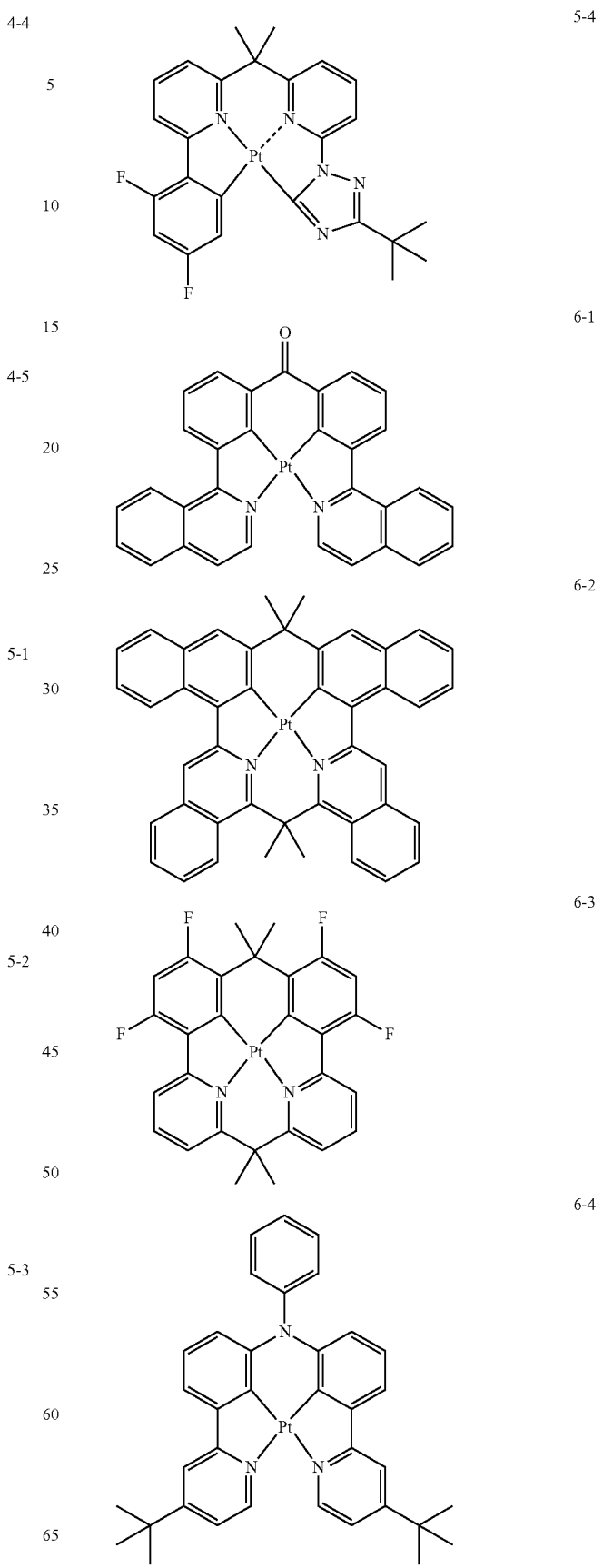

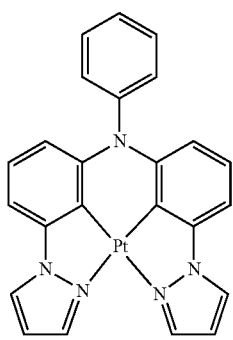
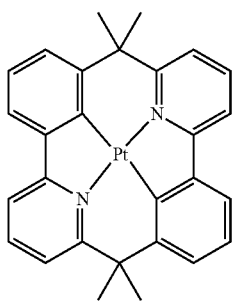
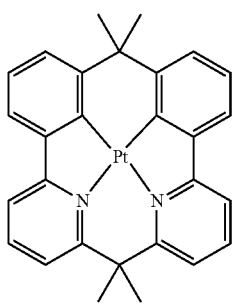
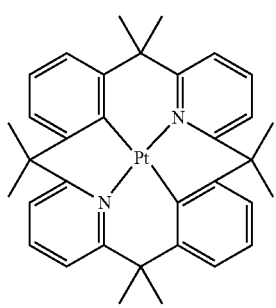
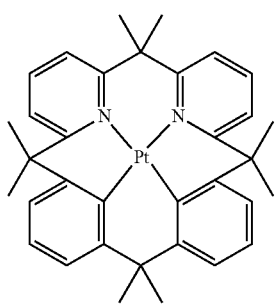
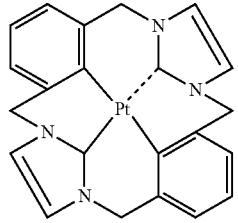
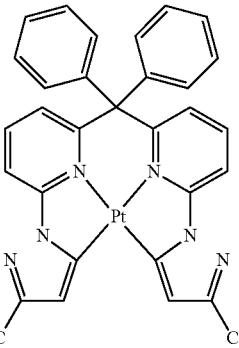
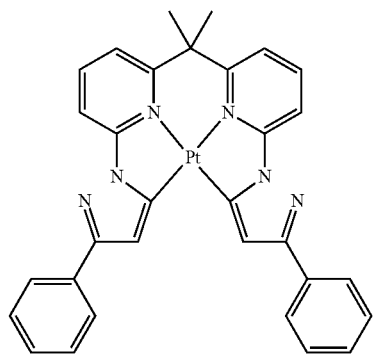
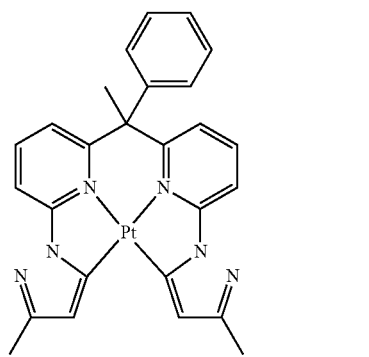
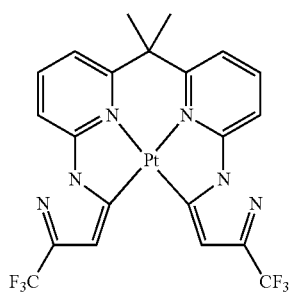

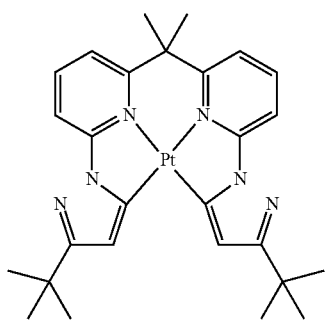
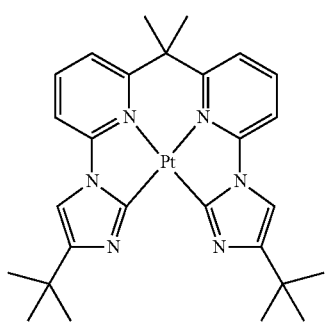
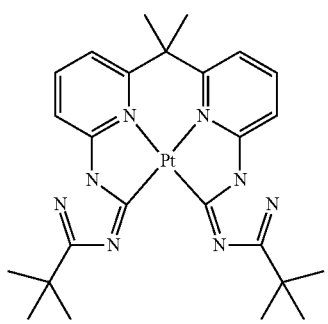
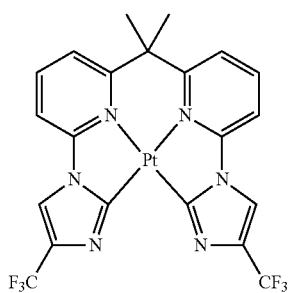
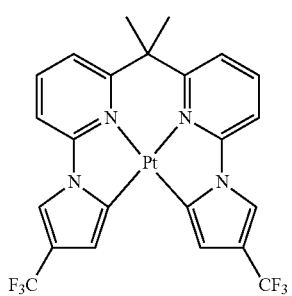
8-5
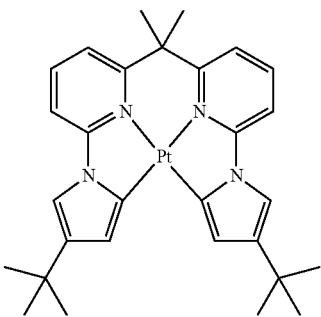
8-6
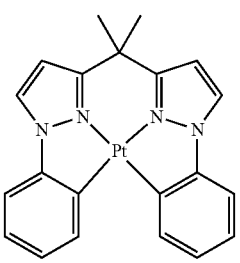
8-8
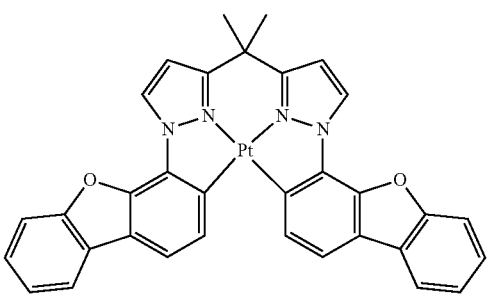
8-9
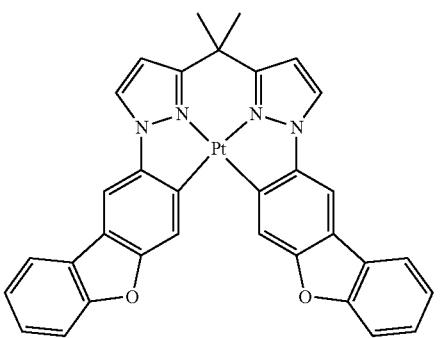
8-10
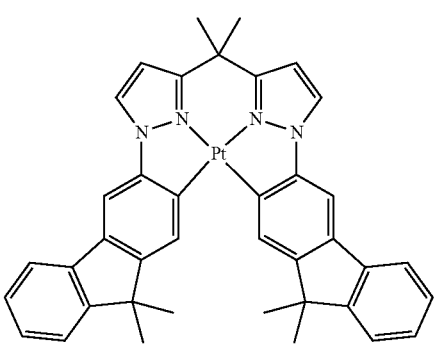
8-11
9-1
9-2
9-3
9-4

-continued
9-5
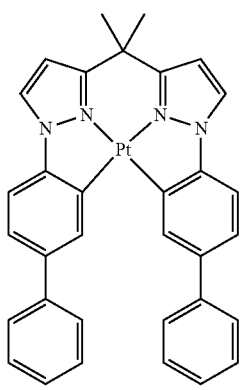
9-6
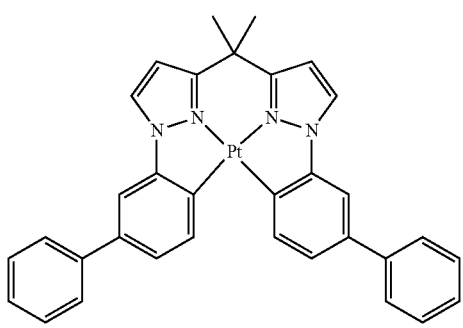
9-7
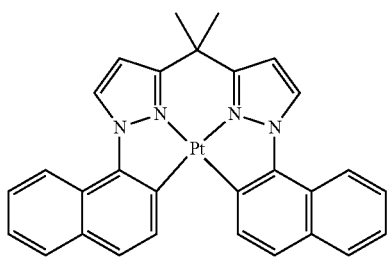
9-8
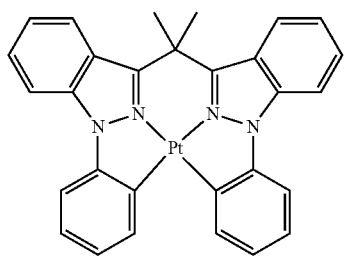
9-9
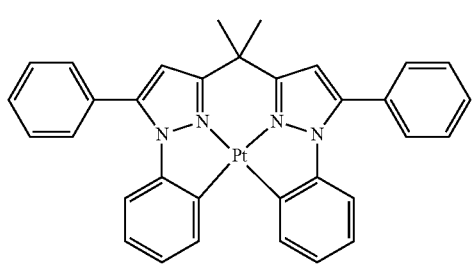
-continued
9-10
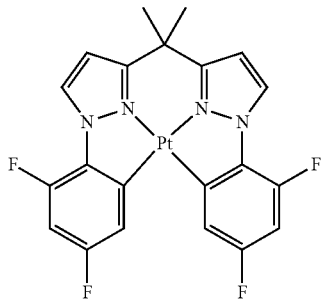
9-11
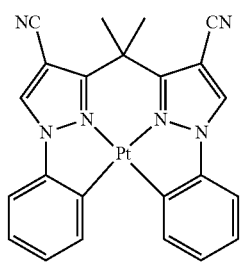
9-12
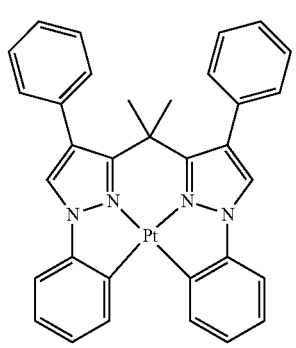
9-13
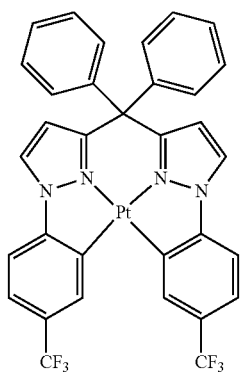

9-14 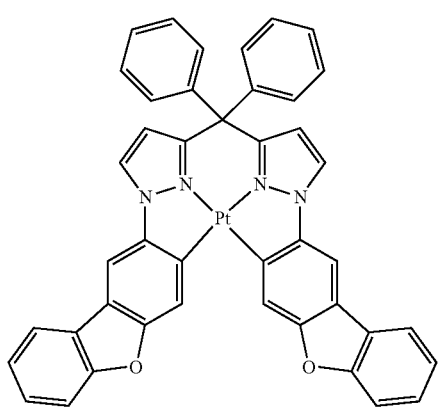

9-15 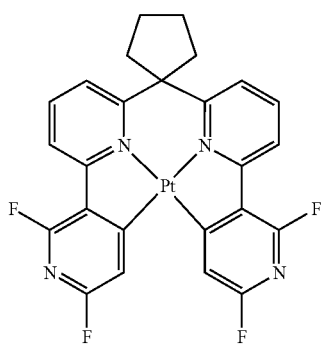

9-16 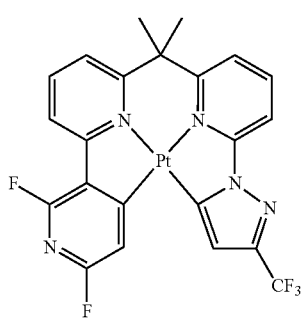

9-17 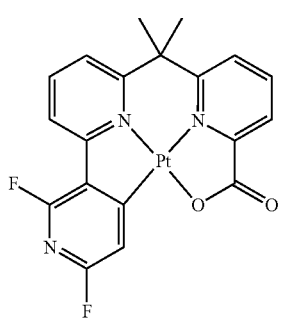

9-18 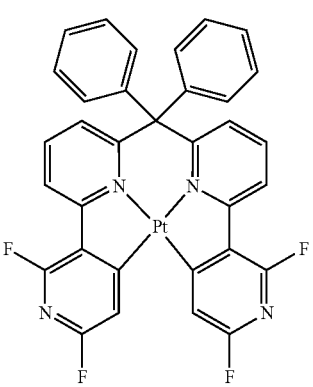

9-19 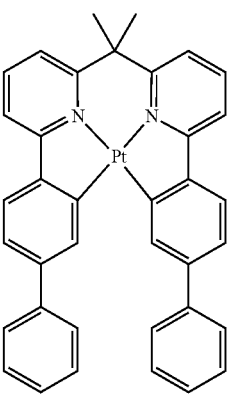

9-20 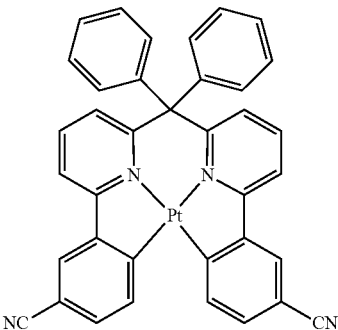

The platinum complex compound represented by Formula (C-1) may be synthesized by various techniques, for example, a method described on page 789, line 53 of the left-hand column to line 7 of the right-hand column, a method described on page 790, lines 18 to 38 of the left-hand column, a method described on page 790, lines 19 to 30 of the right-hand column in Journal of Organic Chemistry 53, 786, (1988), G. R. Newkome et al. and a combination thereof, a method described on page 2752, lines 26 to 35 in Chemische Berichte 113, 2749 (1980), H. Lexy et al., and the like.

For example, the platinum complex compound may be obtained by treating a ligand or a dissociate thereof and a metal compound in the presence or absence of a solvent (for example, a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent, water and the like) and in the presence or absence of a base (various inorganic or organic bases, for example, sodium methoxide, t-butoxy potassium, triethylamine, potassium carbonate and the like) at room temperature or a lower temperature, or by heating (in addition to typical heating, a technique of heating by microwaves is also effective).

In the present invention, when the compound represented by Formula (C-1) is contained in the light emitting layer, the content thereof is preferably 1 to 30 mass %, more preferably 3 to 25 mass %, and more preferably 5 to 20 mass % in the light emitting layer.

[Light Emitting Layer Containing the Compound Represented by Formula (1) and the Compound Represented by Formula (PQ-1)]

The present invention relates to a light emitting layer containing the compound represented by Formula (1) and the compound represented by Formula (PQ-1). The light emitting layer of the present invention may be used in an organic electroluminescence device.

It is preferable that the light emitting layer of the present invention further contains the compound represented by Formula (C-1).

By using the compound represented by Formula (C-1) in combination with the compound represented by Formula (1) and the compound represented by Formula (PQ-1), it is possible to provide an organic electroluminescence device having more excellent external quantum efficiency and driving durability. The content of the compound represented by Formula (C-1) in the light emitting layer of the present invention is preferably 1 to 30 mass %, and more preferably 3 to 20 mass % in the light emitting layer.

[Composition Containing the Compound Represented by Formula (1) and the Compound Represented by Formula (PQ-1)]

The present invention relates to a composition containing the compound represented by Formula (1) and the compound represented by Formula (PQ-1).

The content of the compound represented by Formula (1) in the composition of the present invention is preferably 50 to 95 mass %, and more preferably 70 to 90 mass %.

The content of the compound represented by Formula (PQ-1) in the composition of the present invention is preferably 1 to 40 mass %, and more preferably 5 to 20 mass %.

The other components that may be contained in the composition of the present invention may be an organic material or an inorganic material, and as an organic material, the following materials exemplified as a host material, a fluorescent light emitting material, a phosphorescent light emitting material and a hydrocarbon material may be applied, a host material and a hydrocarbon material are preferable, and a compound represented by Formula (VI) is more preferable.

The composition of the present invention may form an organic layer of the organic electroluminescence device by a dry film forming method such as a deposition method or a sputtering method, a transfer method, and a print method.

It is preferable that the composition of the present invention further contains the compound represented by Formula (C-1).

The content of the compound represented by Formula (C-1) in the composition of the present invention is preferably 1 to 30 mass %, and more preferably 3 to 20 mass % in the composition.

[Organic Electroluminescence Device]

The device of the present invention will be described in detail.

The organic electroluminescence device of the present invention is an organic electroluminescence device that includes, on a substrate, a pair of electrodes and a light emitting layer between the electrodes, and contains a compound represented by the following Formula (1) and a compound represented by Formula (PQ-1) in the light emitting layer. It is preferable that a layer containing the compound represented by Formula (1) is further contained between the light emitting layer and a cathode.

In the organic electroluminescence device of the present invention, the light emitting layer and the layer containing the compound represented by Formula (1) are organic layers, and a plurality of organic layers may be further contained.

Due to properties of the luminescence device, at least either one electrode of the anode and the cathode is preferably transparent or semi-transparent.

FIG. 1 shows an example of the configuration of an organic electroluminescence device according to the present invention. An organic electroluminescence device 10 according to the present invention as shown in FIG. 1 has a light emitting layer 6 interposed between an anode 3 and a cathode 9 on a substrate 2. Particularly, between the anode 3 and cathode 9, a hole injection layer 4, a hole transporting layer 5, a light emitting layer 6, a hole blocking layer 7 and an electron transporting layer 8 are laminated in this order.

<Configuration of the Organic Layer>

The configuration of the layer of the organic layer is not particularly limited, and may be appropriately selected according to the use and the purpose of the organic electroluminescence device, but it is preferable that the organic layer is formed on the transparent electrode or the rear surface electrode. In this case, the organic layer is formed on the transparent electrode or the front surface or one surface of the rear surface electrode.

The shape, size and thickness of the organic layer are not particularly limited, but may be appropriately selected depending on the purpose.

A particular layer configuration may be the followings, but the present invention is not limited to this configuration.

Anode/hole transporting layer/light emitting layer/electron transporting layer/cathode, Anode/hole transporting layer/light emitting layer/second electron transporting layer (hole blocking layer)/first electron transporting layer/cathode, Anode/hole transporting layer/light emitting layer/second electron transporting layer (hole blocking layer)/first electron transporting layer/electron injection layer/cathode, Anode/hole injection layer/hole transporting layer (electron blocking layer)/light emitting layer/second electron transporting layer (hole blocking layer)/first electron transporting layer/cathode, Anode/hole injection layer/first hole transporting layer/second hole transporting layer (electron blocking layer)/light emitting layer/second electron transporting layer (hole blocking layer)/first electron transporting layer/electron injection layer/cathode.

The device configuration, substrate, cathode and anode of the organic electroluminescence device are described in detail, for example, in Japanese Patent Application Laid-Open No. 2008-270736, and a matter described in the publication may be applied to the present invention.

<Substrate>

The substrate used in the present invention is preferably a substrate that does not scatter or attenuate light generated from the organic layer. In the case of the organic material, those having excellent heat resistance, dimensional stability, solvent resistance, electric insulating property and processability are preferable.

<Anode>

The anode may generally have a function as an electrode providing a hole to the organic layer, the shape, structure and size thereof are not particularly limited, and the anode may be appropriately selected from known electrode materials depending on the use and the purpose of the luminescence device. As described above, the anode is generally installed as a transparent anode.

<Cathode>

The cathode may generally have a function as an electrode providing an electron to the organic layer, the shape, structure and size thereof are not particularly limited, and the anode may be appropriately selected from known electrode materials depending on the use and the purpose of the luminescence device.

With respect to the substrate, anode and cathode, the subject matters described in [0070] to [0089] of Japanese Patent Application Laid-Open No. 2008-270736 may be applied to the present invention.

<Organic Layer>

The organic layer of the present invention will be described.

—Formation of the Organic Layer—

In the organic electroluminescence device of the present invention, each organic layer may be appropriately formed by any of a dry film forming method such as a deposition method or a sputtering method, a transfer method, and a print method.

(Light Emitting Layer)

<Light Emitting Material>

The light emitting material of the present invention is preferably a compound represented by Formula (PQ-1).

The light emitting material in the light emitting layer is contained in an amount of 0.1 mass % to 50 mass % with respect to the total mass of the compound generally forming the light emitting layer in the light emitting layer, but from the viewpoint of durability and external quantum efficiency, the material is contained in an amount of preferably 1 mass % to 50 mass %, and more preferably 2 mass % to 40 mass %.

The thickness of the light emitting layer is not particularly limited, but, generally, preferably 2 nm to 500 nm, and among them, from the viewpoint of external quantum efficiency, the thickness is more preferably 3 nm to 200 nm, and even more preferably 5 nm to 100 nm.

The light emitting layer in the device of the present invention may be configured by only a light emitting material, or by a mixed layer of a host material and a light emitting material. The light emitting material may be a fluorescent light emitting material or a phosphorescent light emitting material, and a dopant may be one or two or more kinds. The host material is preferably a charge transporting material. The host material may be one or two or more kinds, and may have, for example, a configuration in which an electron transporting host material and a hole transporting host material are mixed. Further, the host material may contain a material that does not have charge transportability and does not emit light in the light emitting layer. It is preferable that, as the light emitting layer in the device of the present invention, the compound represented by Formula (1) as a host material and the compound represented by Formula (PQ-1) as a light emitting material are used.

In addition, the light emitting layer may be one layer or a multilayer such as two or more layers. In the case of a plurality of light emitting layers, the compound represented by Formula (1) and the compound represented by (PQ-1) may be contained in two or more light emitting layers. Moreover, each light emitting layer may emit light in different colors.

<Host Material>

It is preferable that the host material used in the present invention is the compound represented by Formula (1).

The compound represented by Formula (1) has charge transportability in both of holes and electrons, and may make a carrier balance of the holes and the electrons better by combining with the compound represented by Formula (PQ-1). Accordingly, although the compound has a carbazole group, driving durability may be improved. Further, a color change may be suppressed when driving at a high temperature.

The host material used in the present invention may further contain the following compound. Examples may include, for example, pyrrole, indole, carbazole, CBP (4,4'-di(9-carbazolyl)biphenyl), azaindole, azacarbazole, triazole, oxazole, oxadiazole, pyrazole, imidazole, thiophene, polyarylalkane, pyrazoline, pyrazolone, phenylenediamine, arylamine, amino substituted carcone, styrylanthracene, fluorenone, hydrazone, stilbene, silazane, aromatic tertiary amine compound, a styrylamine compound, a porphyrin-based compound, a conductive polymer oligomers such as a polysilane-based compound, poly(N-vinylcarbazole), an aniline-based copolymer, thiophene oligomer and polythiophene, organic silane, a carbon film, pyridine, pyrimidine, triazine, imidazole, pyrazole, triazole, oxazole, oxadiazole, fluorenone, anthraquinodimethane, anthrone, diphenylquinone, thiopyrandioxide, carbodiimide, fluorenylidene methane, distyrylepyrazine, fluorine substituted aromatic compound, heterocyclic tetracarboxylic acid anhydrides such as naphthalene perylene, various metal complexes represented by a metal complex of phthalocyanine or a 8-quinolinol derivative, metal phthalocyanine, and a metal complex using benzoxazole or benzothiazole as a ligand, and derivatives thereof (may have a substituent or a condensed ring).

In the light emitting layer of the present invention, the lowest triplet excited state energy ($T_1$ energy) of the host material (also containing the compound represented by Formula (1)) is preferably higher than the $T_1$ energy of the phosphorescent light emitting material from the viewpoint of color purity, emission efficiency, and driving durability.

Further, the content of the host compound in the present invention is not particularly limited, but from the viewpoint of emission efficiency and driving voltage, the content is preferably 15 mass % or more and 95 mass % or less on the basis of the total mass of the compound forming the light emitting layer.

In the case where the compound represented by Formula (1) is introduced in a layer other than the light emitting layer (for example, a charge transporting layer), the compound is contained in the layer in an amount of preferably 10 mass % to 100 mass %, and more preferably 30 mass % to 100 mass %.

(Fluorescent Light Emitting Material)

Examples of the fluorescent light emitting material used in the present invention may contain various complexes represented by complexes of a benzoxazole derivative, a benzoimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a condensed aromatic compound, a perinone derivative, an oxadiazole derivative, an oxazine derivative, an aldazine derivative, a pyrralidine derivative, a cyclopentadiene derivative, a bisstyrylanthracene derivative, a quinacridone derivative, a pyrrolopyridine derivative, a thiadiazolopyridine derivative, a cyclopentadiene derivative, a styrylamine derivative, a diketopyrrolopyrrole derivative, an aromatic dimethylidine compound and a 8-quinolinol derivative or a complex of a pyrromethene derivative, a polymer compound such as polythiophene, polyphenylene, and polyphenylenevinylene, and a compound such as an organic silane derivative.

(Phosphorescent Light Emitting Material)

The phosphorescent light emitting material used in the present invention may contain, in addition to the compound represented by Formula (1), for example, phosphorescent light emitting compounds described in Patent documents such as U.S. Pat. Nos. 6,303,238B1, 6,097,147, WO00/57676, WO00/70655, WO01/08230, WO01/39234A2, WO01/41512A1, WO02/02714A2, WO02/15645A1, WO02/44189A1, WO05/19373A2, Japanese Patent Application Laid-Open No. 2001-247859, Japanese Patent Application Laid-Open No. 2002-302671, Japanese Patent Application Laid-Open No. 2002-117978, Japanese Patent Application Laid-Open No. 2003-133074, Japanese Patent Application Laid-Open No. 2002-235076, Japanese Patent Application Laid-Open No. 2003-123982, Japanese Patent Application Laid-Open No. 2002-170684, EP1211257, Japanese Patent Application Laid-Open No. 2002-226495, Japanese Patent Application Laid-Open No. 2002-234894, Japanese Patent Application Laid-Open No. 2001-247859, Japanese Patent Application Laid-Open No. 2001-298470, Japanese Patent Application Laid-Open No. 2002-173674, Japanese Patent Application Laid-Open No. 2002-203678, Japanese Patent Application Laid-Open No. 2002-203679, Japanese Patent Application Laid-Open No. 2004-357791, Japanese Patent Application Laid-Open No. 2006-256999, Japanese Patent Application Laid-Open No. 2007-19462, Japanese Patent Application Laid-Open No. 2007-84635, and Japanese Patent Application Laid-Open No. 2007-96259, and among them, a more preferable light emitting material may contain an Ir complex, a Pt complex, a Cu complex, a Re complex, a W complex, a Rh complex, a Ru complex, a Pd complex, an Os complex, a Eu complex, a Tb complex, a Gd complex, a Dy complex, and a Ce complex. An Ir complex, a Pt complex or a Re complex is particularly preferred, and among them, an Ir complex, a Pt complex or a Re complex containing at least one coordination mode of a metal-carbon bond, a metal-nitrogen bond, a metal-oxygen bond and a metal-sulfur bond is preferred. Further, from the viewpoint of emission efficiency, driving durability and chromaticity, an Ir complex, a Pt complex or a Re complex containing a polydentate of tridentate or more ligand is particularly preferred.

The content of the phosphorescent light emitting material in the light emitting layer is preferably 0.1 mass % or more and 50 mass % or less, more preferably 0.2 mass % or more and 50 mass % or less, even more preferably 0.3 mass % or more and 40 mass % or less, and most preferably 20 mass % or more and 30 mass % or less on the basis of the total mass of the light emitting layer.

The content of the phosphorescent light emitting material (the compound represented by Formula (PQ-1) and/or phosphorescent light emitting material used in combination), that may be used in the present invention, is preferably 0.1 mass % or more and 50 mass % or less, more preferably 1 mass % or more and 40 mass % or less, and most preferably 5 mass % or more and 30 mass % or less on the basis of the total mass of the light emitting layer. Particularly, in the range of 5 mass % or more and 30 mass % or less, dependency of the chromaticity of light emission of the organic electroluminescence device on the addition concentration of the phosphorescent light emitting material is small.

It is most preferable that the organic electroluminescence device of the present invention contains at least one kind of the compound (PQ-1) (the compound represented by Formula (PQ-1)) in an amount of 5 to 30 mass % on the basis of the total mass of the light emitting layer.

It is more preferable that the organic electroluminescence device contains a hydrocarbon compound, and it is even more preferable that the light emitting layer contains a hydrocarbon compound.

Further, the hydrocarbon compound is preferably a compound represented by the following Formula (VI).

By appropriately using the compound represented by Formula (VI) in conjunction with the light emitting material, it is possible to appropriately control an interaction between material molecules, and make an energy gap interaction between the adjacent molecules uniform, thereby further decreasing driving voltage.

In addition, the compound represented by Formula (VI) used in the organic electroluminescence device may prevent a decrease in efficiency of the organic electroluminescence device or a decrease in the lifespan of the device by decomposed products of the material because the chemical stability is excellent, and denaturing such as decomposition of the material when driving the device is hardly occurred.

The compound represented by Formula (VI) will be described.

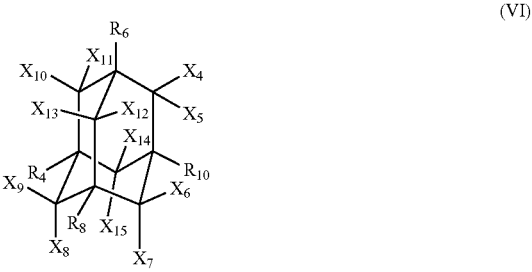

(VI)

In Formula (VI), each of $R_4$, $R_6$, $R_8$, $R_{10}$, and $X_4$ to $X_{15}$ independently represents a hydrogen atom, an alkyl group or an aryl group.

The alkyl group represented by $R_4$, $R_6$, $R_8$, $R_{10}$ and $X_4$ to $X_{15}$ in Formula (VI) may be substituted with an adamantane structure or an aryl structure, and has preferably 1 to 70 carbon atoms, more preferably 1 to 50 carbon atoms, even more preferably 1 to 30 carbon atoms, much more preferably 1 to 10 carbon atoms, particularly preferably 1 to 6 carbon atoms, and most preferably a straight-chained alkyl group having 2 to 6 carbon atoms.

The alkyl group represented by $R_4$, $R_6$, $R_8$, $R_{10}$ and $X_4$ to $X_{15}$ in Formula (VI) may include, for example, a n-$C_{50}H_{101}$ group, a n-$C_{30}H_{61}$ group, a 3-(3,5,7-triphenyladamantane-1-yl)propyl group (31 carbon atoms), a trityl group (19 carbon atoms), a 3-(adamantane-1-yl)propyl group (13 carbon atoms), a 9-decanyl group (10 carbon atoms), a benzyl group (7 carbon atoms), a cyclohexyl group (6 carbon atoms), a n-hexyl group (6 carbon atoms), a n-pentyl group (5 carbon atoms), a n-butyl group (4 carbon atoms), a n-propyl group (3 carbon atoms), a cyclopropyl group (3 carbon atoms), an ethyl group (2 carbon atoms) and a methyl group (1 carbon atom).

The aryl group represented by $R_4$, $R_6$, $R_8$, $R_{10}$ and $X_4$ to $X_{15}$ in Formula (VI) may be substituted with an adamantane structure or an alkyl structure, and has preferably 6 to 30 carbon atoms, more preferably 6 to 20 carbon atoms, even more preferably 6 to 15 carbon atoms, particularly preferably 6 to 10 carbon atoms, and most preferably 6 carbon atoms.

The aryl group represented by $R_4$, $R_6$, $R_8$, $R_{10}$ and $X_4$ to $X_{15}$ in Formula (VI) may include, for example, a 1-pyrenyl group (16 carbon atoms), a 9-anthracenyl group (14 carbon atoms), a 1-naphthyl group (10 carbon atoms), a 2-naphthyl group (10 carbon atoms), a p-t-butylphenyl group (10 carbon atoms), a 2-m-xylyl group (8 carbon atoms), a 5-m-xylyl group (8 carbon atoms), an o-tolyl group (7 carbon atoms), an m-tolyl group (7 carbon atoms), a p-tolyl group (7 carbon atoms), and a phenyl group (6 carbon atoms).

$R_4$, $R_6$, $R_8$ and $R_{10}$ in Formula (VI) may be a hydrogen atom, an alkyl group or an aryl group, but from the viewpoint of the above description that the high glass transition temperature is preferable, it is preferable that at least one is an aryl group, it is more preferable that at least two are aryl groups, and it is particularly preferable that three to four are aryl groups.

$X_4$ to $X_{15}$ in Formula (VI) may be a hydrogen atom, an alkyl group or an aryl group, preferably a hydrogen atom or aryl group, and particularly preferably a hydrogen atom.

The molecular weight of the compound represented by Formula (VI) in the present invention is preferably 2000 or less, more preferably 1200 or less, and particularly preferably 1000 or less from the viewpoint of deposition application or solubility, because the organic electroluminescence device is manufactured by using a vacuum deposition process or a solution coating process. Further, from the viewpoint of deposition application, if the molecular weight is too small, a vapor pressure is decreased and a change from a gas phase to a solid phase does not occur, and as a result, it is difficult to form the organic layer. Therefore, the molecular weight is preferably 250 or more, more preferably 350 or more, and particularly preferably 400 or more.

The compound represented by Formula (VI) is preferably a solid at room temperature (25° C.), more preferably a solid from room temperature (25° C.) to 40° C., and particularly preferably a solid from room temperature (25° C.) to 60° C.

In the case where the compound represented by Formula (VI), which does not form a solid at room temperature (25° C.), is used, a solid phase may be formed at ambient temperature by combining with other materials.

The purpose of the compound represented by Formula (VI) is not particularly limited, and the compound may be contained in any layer of the organic layers. A layer introducing the compound represented by Formula (VI) in the present invention is preferably any one or a plurality of layers of a light emitting layer, a hole injection layer, a hole transporting layer, an electron transporting layer, an electron injection layer, an exciton blocking layer and a charge blocking layer as described below, more preferably any one or a plurality of layers of a light emitting layer, a hole injection layer, a hole transporting layer, an electron transporting layer and an electron injection layer, particularly preferably any one or a plurality of layers of a light emitting layer, a hole injection layer and a hole transporting layer, and most preferably a light emitting layer.

In the case where the compound represented by Formula (VI) is used in the organic layer, it is required that the content of the compound represented by Formula (VI) used is limited to an amount that does not suppress charge transportability, and the compound represented by Formula (VI) is contained in an amount of preferably 0.1 to 70 mass %, more preferably 0.1 to 30 mass %, and particularly preferably 0.1 to 25 mass %.

Further, in the case where the compound represented by Formula (VI) is used in a plurality of organic layers, it is preferable that the compound is contained in the above range in each layer.

Only one kind of compound represented by Formula (VI) may be contained in any one of organic layers, or a plurality of compounds represented by Formula (VI) may be contained in combination at a predetermined ratio.

Particular examples of the compound represented by Formula (VI) will be described below, but are not limited thereto.

(1-1)

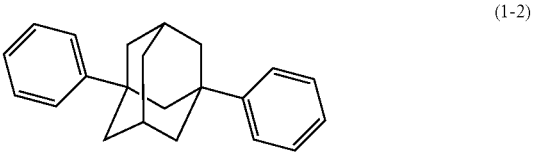

(1-2)

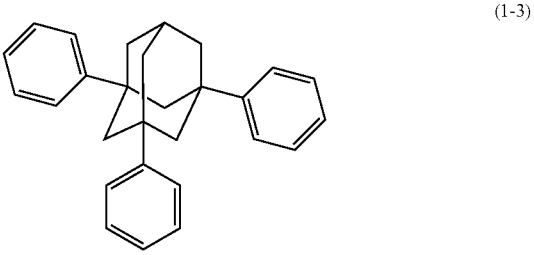

(1-3)

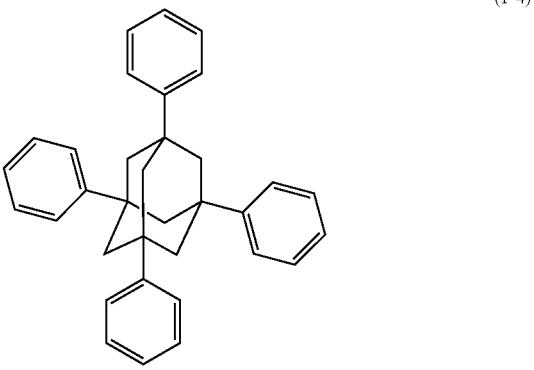

(1-4)

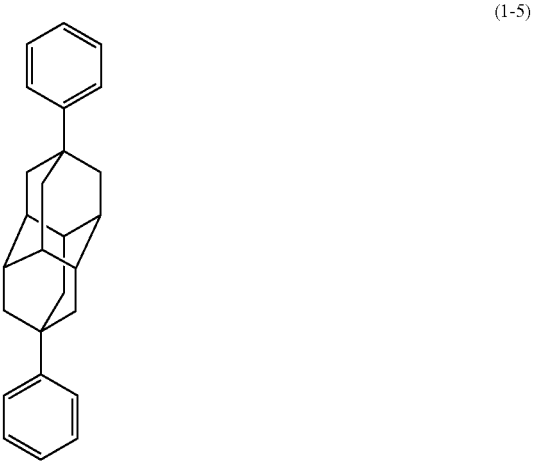

(1-5)

(1-6)
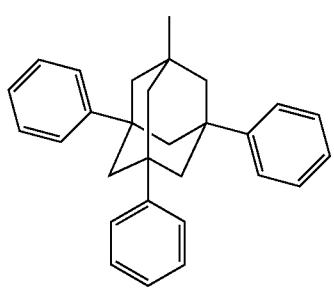
(1-7)
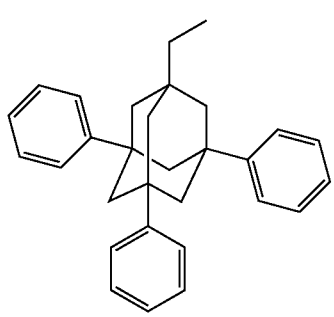
(1-8)
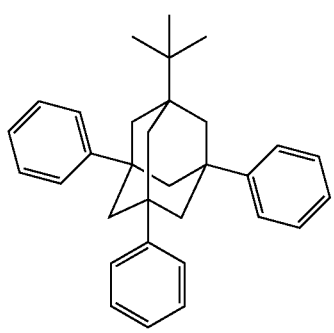
(1-9)
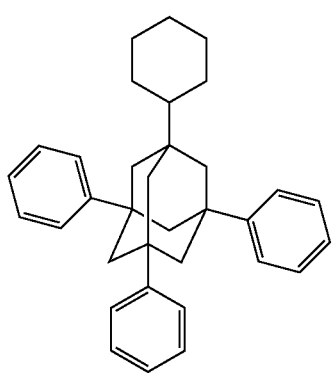
(1-10)
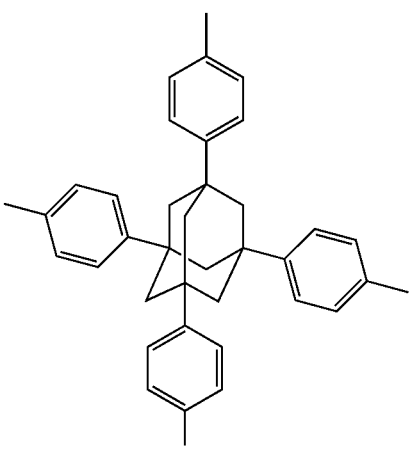
(1-11)
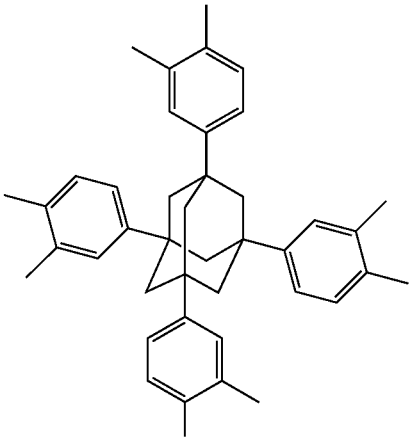
(1-12)
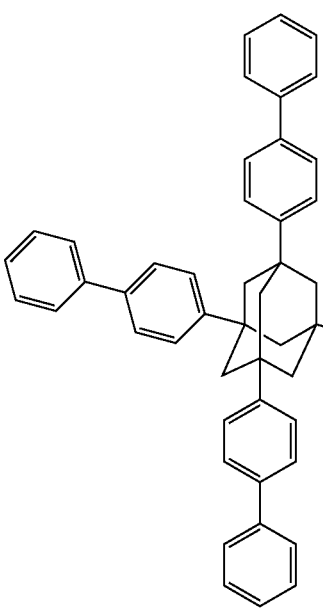

(1-13)
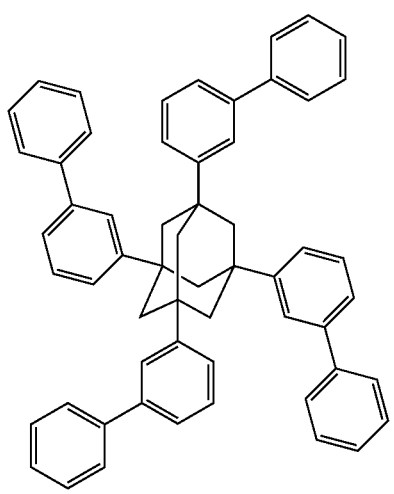
(1-14)
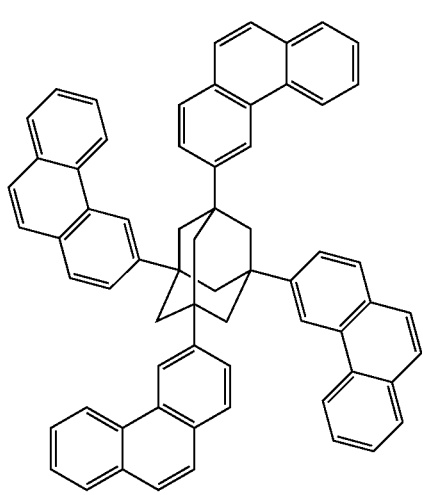
(1-15)
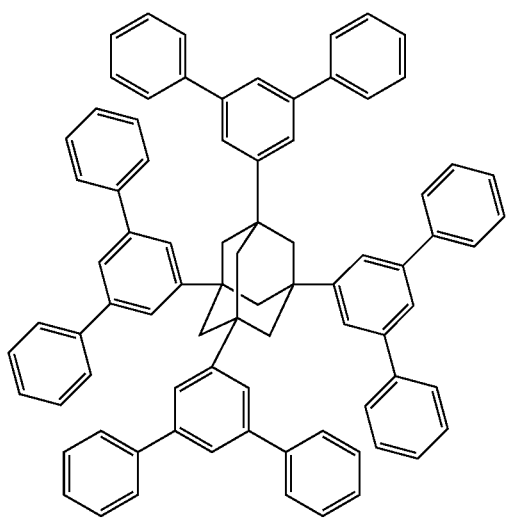
(1-16)
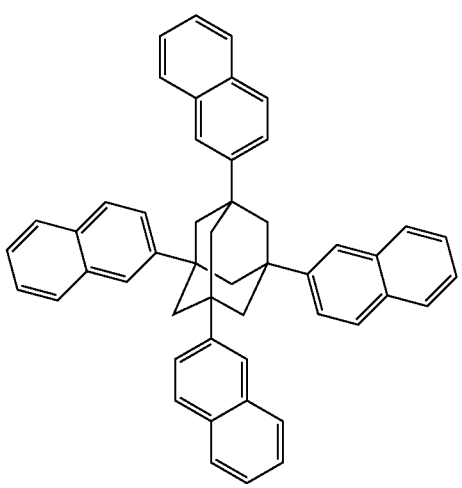
(1-17)
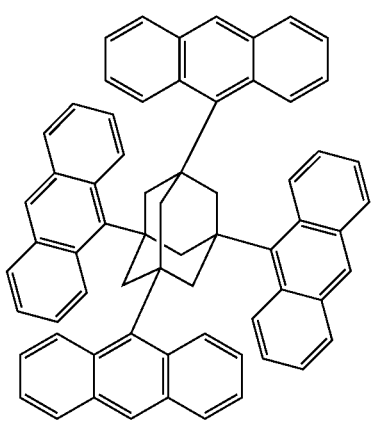
(1-18)
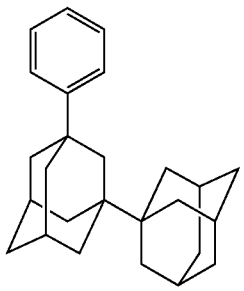
(1-19)
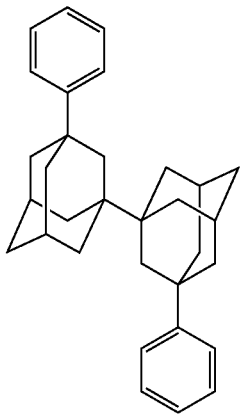

(1-20)
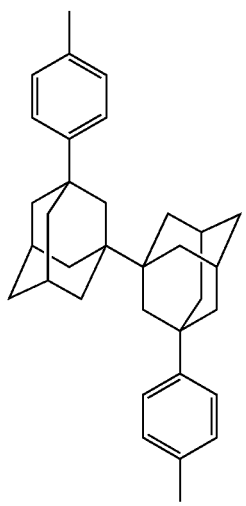
(1-21)
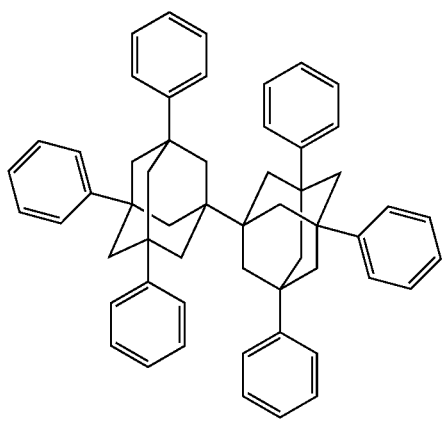
(1-22)
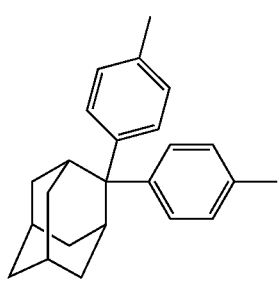
(1-23)
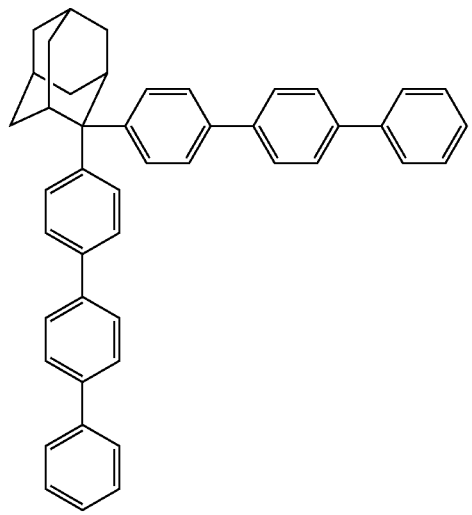
(1-24)
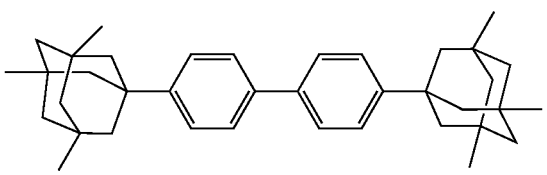
(1-25)
(1-26)
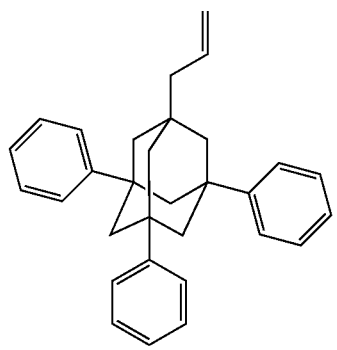
(1-27)
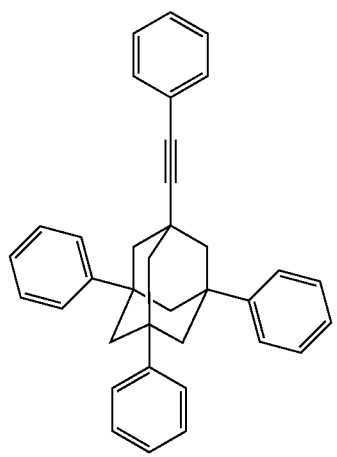

(1-28)
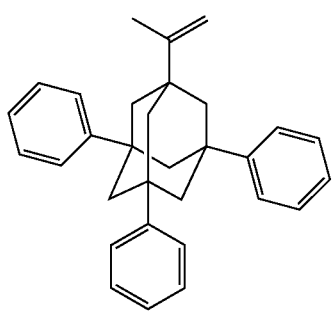
(1-29)
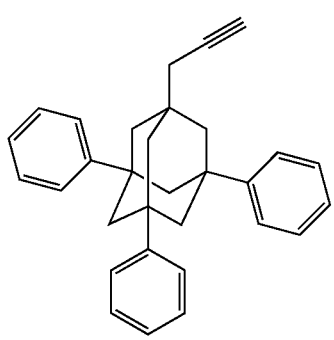
(1-30)
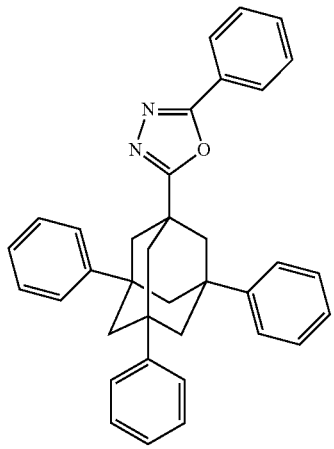
(1-31)
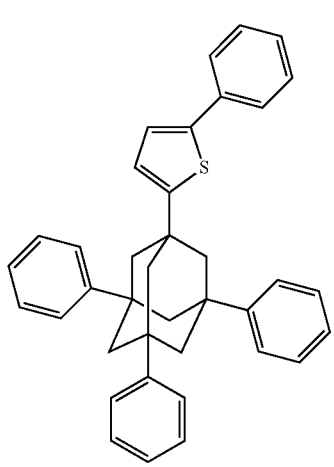
(1-32)
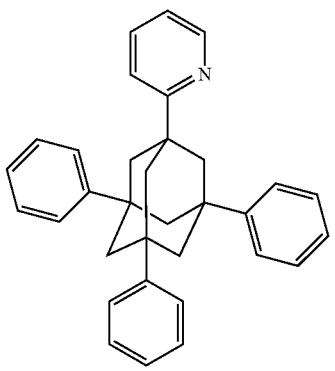
(1-33)
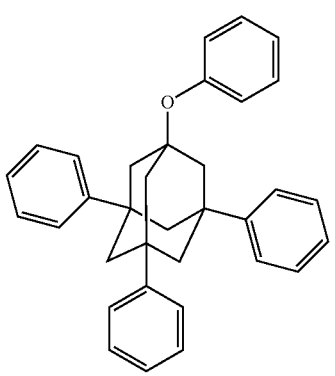
(1-34)
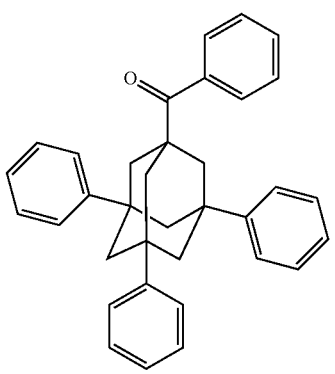
(1-35)
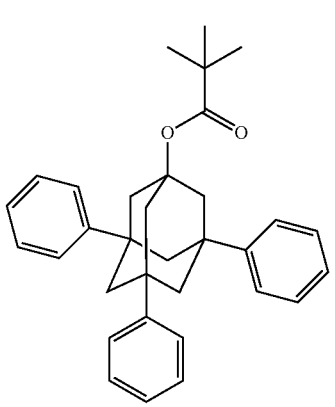

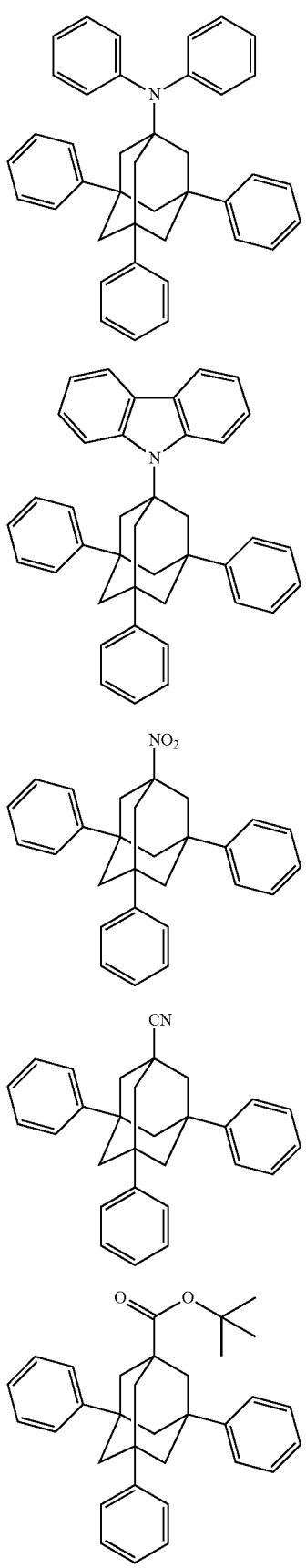
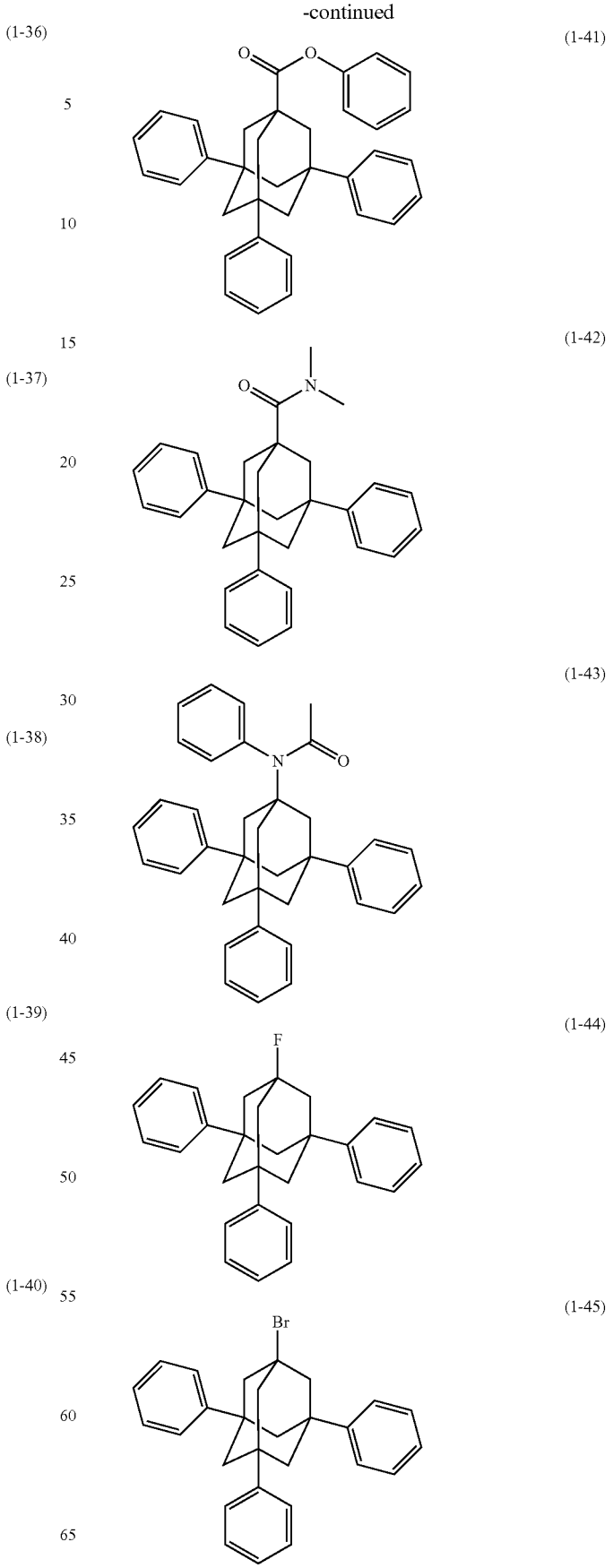

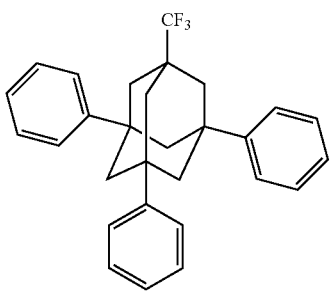
(1-46)

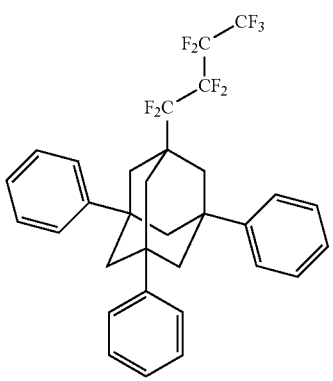
(1-47)

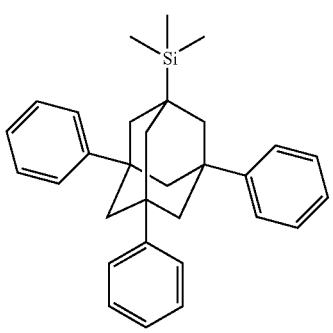
(1-48)

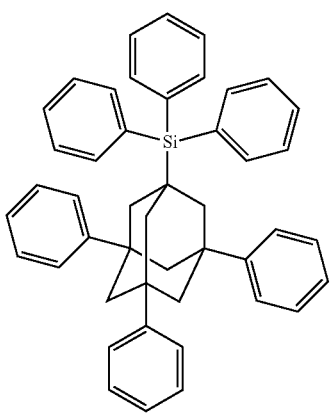
(1-49)

The compound represented by Formula (VI) may be synthesized by appropriately combining adamantane, halogenated adamantine, halogenated alkyl or alkylmagnesium halide (Grignard reagent). For example, halogenated adamantane and halogenated alkyl may be coupled by using indium (Document 1). Further, the aromatic compound may be coupled with the Grignard reagent by converting halogenated alkyl with an alkylcopper reagent (Document 2). In addition, halogenated alkyl may be coupled by using an appropriate arylboric acid and a palladium catalyst (Document 3).

Document 1: Tetrahedron Lett. 39, 1998, 9557-9558.
Document 2: Tetrahedron Lett. 39, 1998, 2095-2096.
Document 3: J. Am. Chem. Soc. 124, 2002, 13662-13663.

The adamantane structure having an aryl group may be synthesized by appropriately combining adamantane or halogenated adamantane with corresponding arene or aryl halide.

Further, in the manufacturing method as described above, in the case where the defined substituent is changed under conditions of a certain synthesis method or is not suitable to perform the above method, the compound may be easily manufactured by means such as protection or unprotection of the functional group (for example, Protective Groups in Organic Synthesis, written by T. W. Greene, John Wiley & Sons Inc.) (1981)). In addition, if necessary, it is possible to change the order of the reaction process such as appropriate introduction of the substituent.

The thickness of the light emitting layer is not particularly limited, but, generally, preferably 1 nm to 500 nm, more preferably 5 nm to 200 nm, and even more preferably 10 nm to 100 nm.

In the organic electroluminescence device of the present invention, it is preferable that the electrode contains the anode, the charge transporting layer is contained between the light emitting layer and the anode, and the charge transporting layer contains a carbazole compound.

(Charge Transporting Layer)

The charge transporting layer refers to a layer which transports charge occurs when voltage is applied to the organic electroluminescence device. Particularly, the layer may be a hole injection layer, a hole transporting layer, an electron blocking layer, a light emitting layer, a hole blocking layer, an electron transporting layer or an electron injection layer. A hole injection layer, a hole transporting layer, an electron blocking layer or a light emitting layer is preferred. If the charge transporting layer formed by a coating method is a hole injection layer, a hole transporting layer, an electron blocking layer or a light emitting layer, it is possible to manufacture the organic electroluminescence device having high efficiency at low cost. Further, the charge transporting layer is more preferably a hole injection layer, a hole transporting layer or an electron blocking layer.

—Hole Injection Layer and Hole Transporting Layer—

Each of the hole injection layer and the hole transporting layer are a layer having a function of accepting holes from the anode or the anode side to transport the holes into the cathode side.

A hole injection material or a hole transporting material used in these layers may be a low molecular compound or a polymer compound.

Specifically, the above layer is preferably a layer containing a pyrrole derivative, a carbazole derivative, a pyrrole derivative, a triazole derivative, an oxazole derivative, a oxadiazole derivative, an imidazole derivative, a polyarylalkane derivative, a pyrazoline derivative, a pyrazolone derivative, a phenylenediamine derivative, an arylamine derivative, an amino substituted carcone derivative, a styrylanthracene derivative, a fluorenone derivative, a hydrazone derivative, a stilbene derivative, a silazane derivative, an aromatic tertiary amine compound, a styrylamine compound, a phthalocyanine-based compound, a porphyrin-based compound, a thiophene derivative, an organic silane derivative, a carbon, and various metal complexes such as an iridium complex.

It is preferable that the hole injection layer and the hole transporting layer include a carbazole compound.

In the present invention, it is preferable that the carbazole compound is a carbazole compound represented by the following Formula (a).

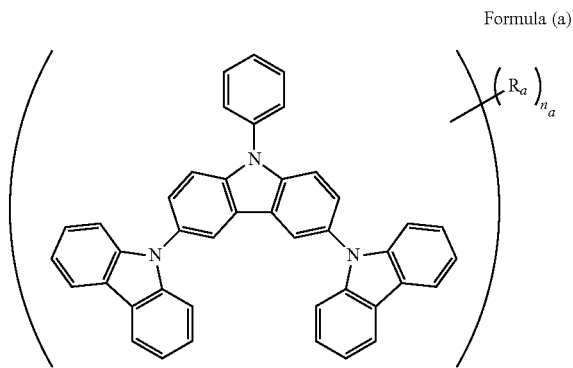

Formula (a)

(In Formula (a), $R_a$ represents a substituent which may be substituted with a hydrogen atom in the structure, and when a plurality of $R_a$ exists, each of $R_a$ may be the same as or different from every other $R_a$, and $n_a$ represents an integer of 0 to 8.)

In the case where the compound represented by Formula (a) is used in the charge transporting layer, the compound represented by Formula (a) is contained in an amount of preferably 50 to 100 mass %, preferably 80 to 100 mass %, and particularly preferably 95 to 100 mass %.

Further, in the case where the compound represented by Formula (a) is used in a plurality of organic layers, the compound is preferably contained in the above range in each layer.

Only one kind of compound represented by Formula (a) may be contained in any one organic layer, or a plurality of compounds represented by Formula (a) may be contained in combination at a predetermined ratio.

In the present invention, in the case where the compound represented by Formula (a) is contained in the hole transporting layer, the thickness of the hole transporting layer containing the compound represented by Formula (a) is preferably 1 nm to 500 nm, more preferably 3 nm to 200 nm, and even more preferably 5 nm to 100 nm. Further, it is preferable that the hole transporting layer is installed while being contacted with the light emitting layer.

The hole transporting layer may have a single layer structure composed of one or two or more kinds of the above-described materials, or may have a multilayer structure composed of a plurality of layers of the same or different compositions.

The substituent represented by $R_a$ may include, specifically, a halogen atom, an alkoxy group, a cyano group, a nitro group, an alkyl group, an aryl group and an aromatic heterocyclic group, preferably an alkyl group having 10 or less carbon atoms and a substituted or unsubstituted aryl group having 10 or less carbon atoms, and more preferably an alkyl group having 6 or less carbon atoms. $n_a$ is preferably 0 to 4, and more preferably 0 to 2.

In the present invention, the hydrogen atoms constituting Formula (a) include isotopes of hydrogen (such as deuterium atom) as well. In this case, all hydrogen atoms of the compound may be replaced by isotopes of hydrogen, and may be a mixture that is a compound in which a portion thereof contains isotopes of hydrogen.

The compounds represented by Formula (a) may be synthesized by combining various known synthesis methods. Most generally, with respects to the carbazole compound, there may be a synthesis by dehydrogenation aromatization after Aza-Cope rearrangement reaction of arylhydrazine and a condensate with cyclohexane derivative (written by L. F. Tieze, and Th. Eicher, translated by Dakano, Ogasawara, Fine Organic Synthesis, p. 339 (published by Nankodo Co., Ltd.)). Further, with respects to the coupling reaction of the obtained carbazole compound and halogenated aryl compound using the palladium catalyst, there may be a method described in Tetrahedron Letters Vol. 39, p. 617 (1998), Vol. 39, p. 2367 (1998) and Vol. 40, p. 6393 (1999). The reaction temperature and the reaction time are not particularly limited, and the condition described in the above document may be applied.

In the present invention, it is preferable that the compounds represented by Formula (a) form a thin layer by a vacuum deposition process, but a wet process such as solution coating may be appropriately used. The molecular weight of the compound is preferably 2,000 or less, more preferably 1,200 or less, and particularly preferably 800 or less from the viewpoint of deposition application or solubility. Further, from the viewpoint of deposition application, if the molecular weight is too small, a vapor pressure is decreased and a change from a gas phase to a solid phase does not occur, and as a result, it is difficult to form the organic layer. Therefore, the molecular weight is preferably 250 or more, and particularly preferably 300 or more.

Hereinafter, particular examples of the compound represented by Formula (a) in the present invention are exemplified, but the present invention is not limited thereto.

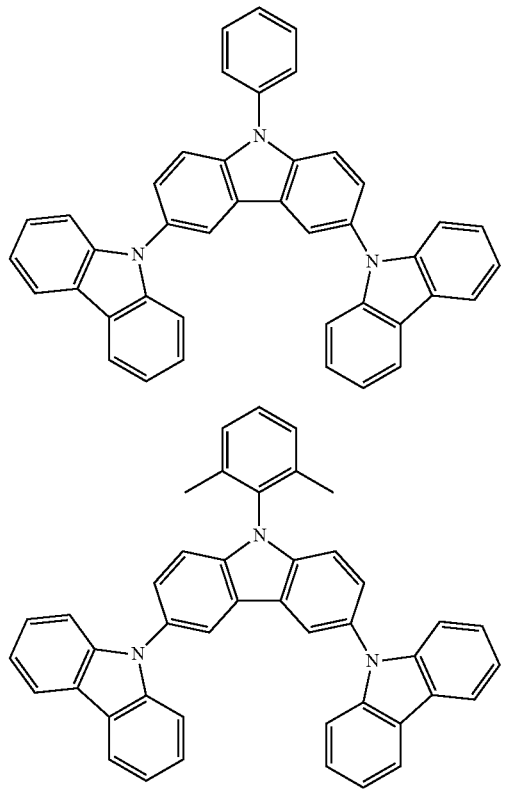

129
-continued
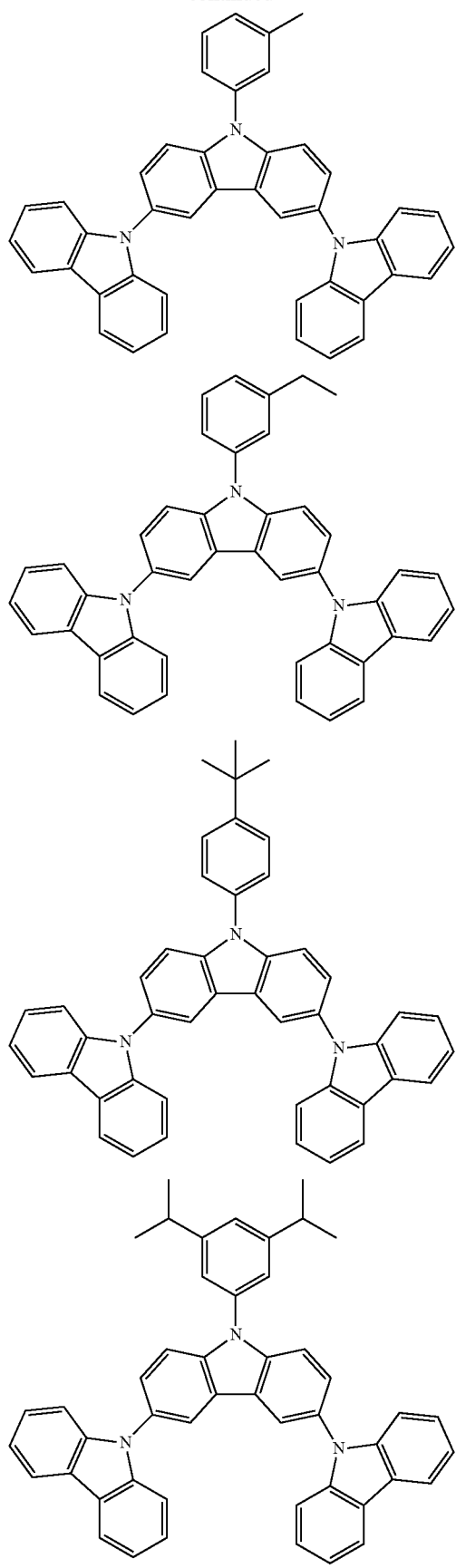
130
-continued
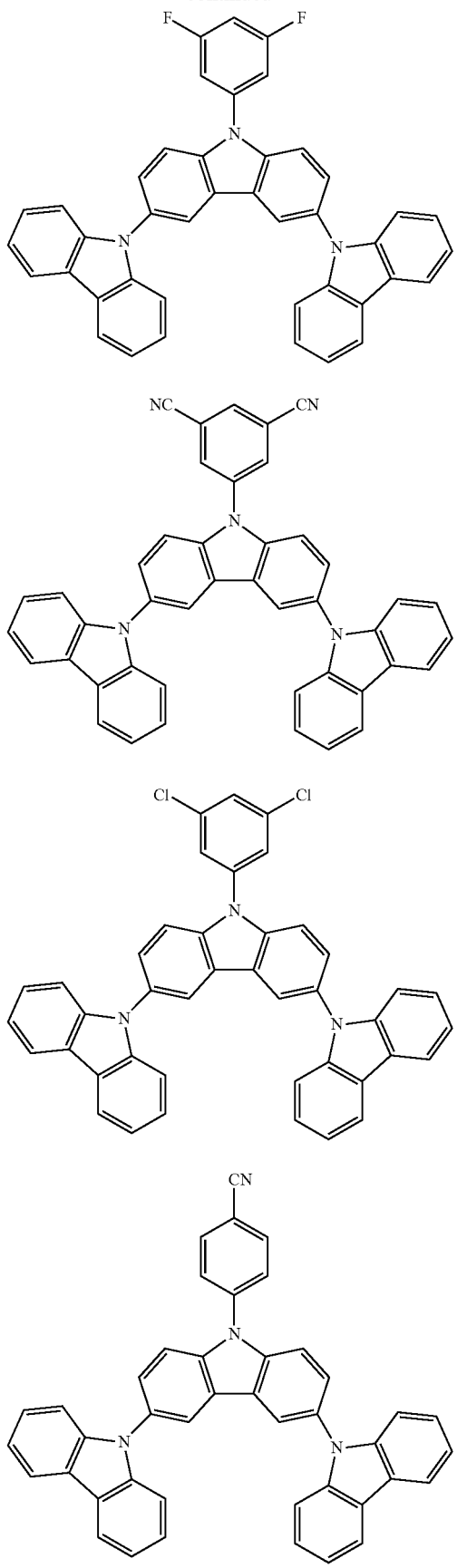

131 -continued
132 -continued
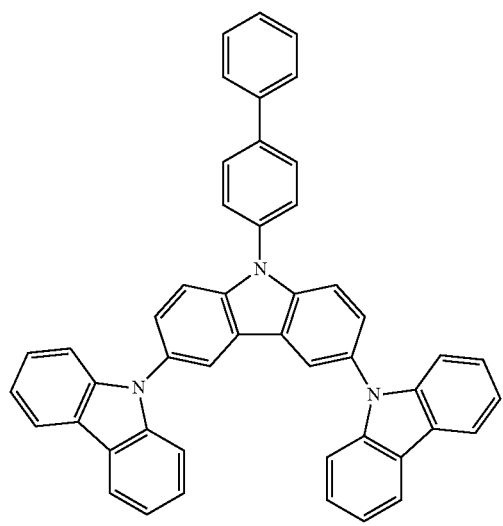
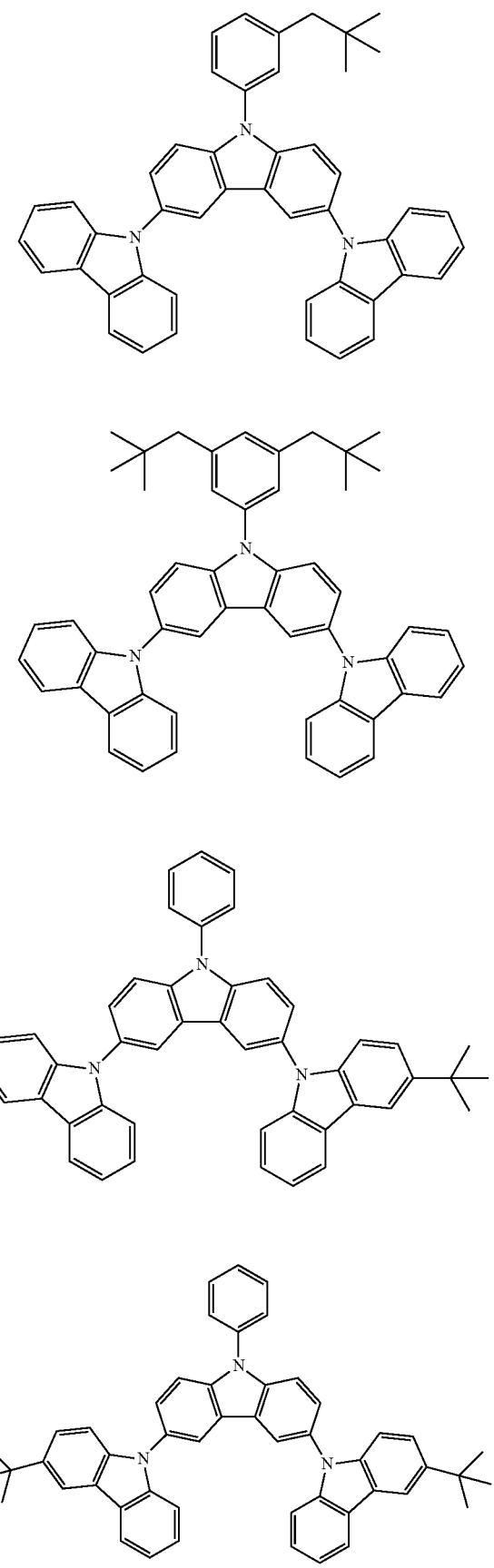

133
-continued
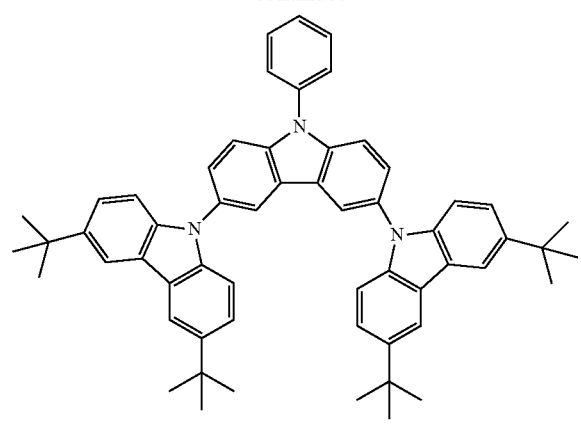
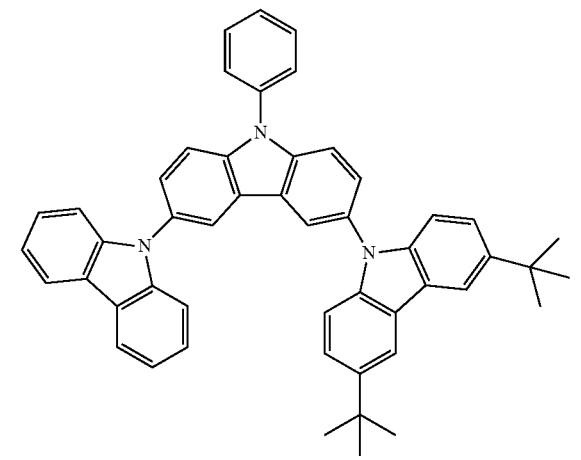
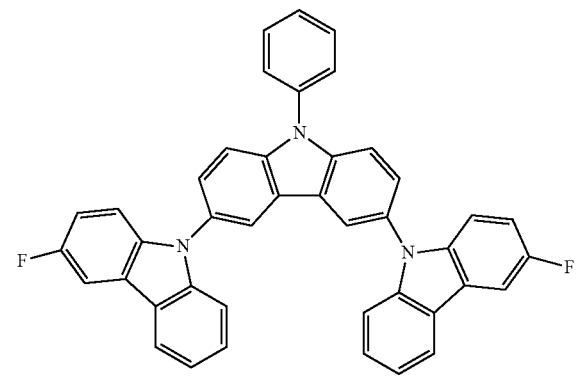
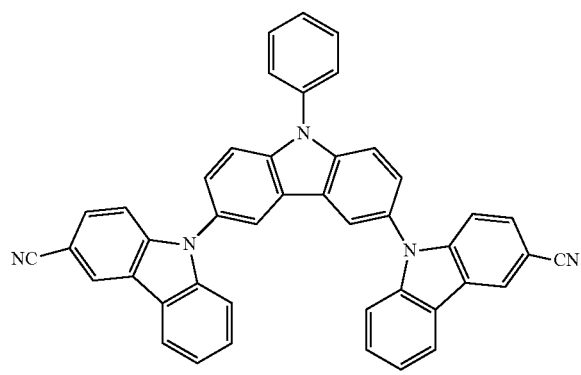
134
-continued
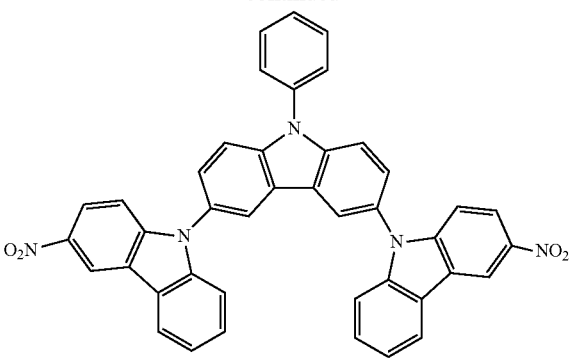
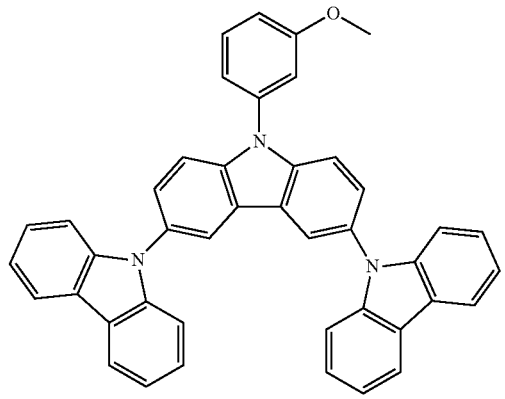
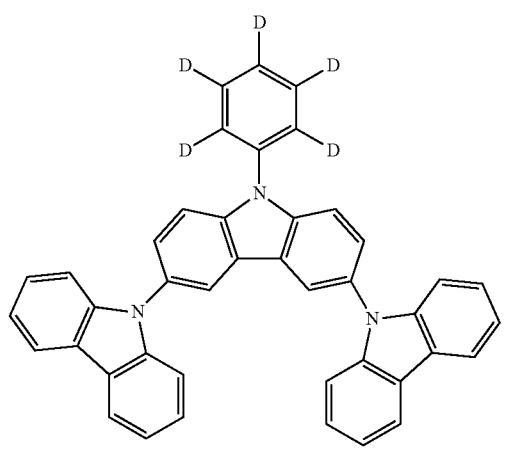

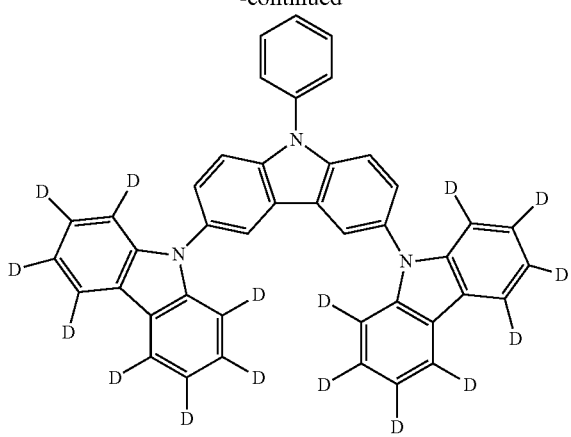

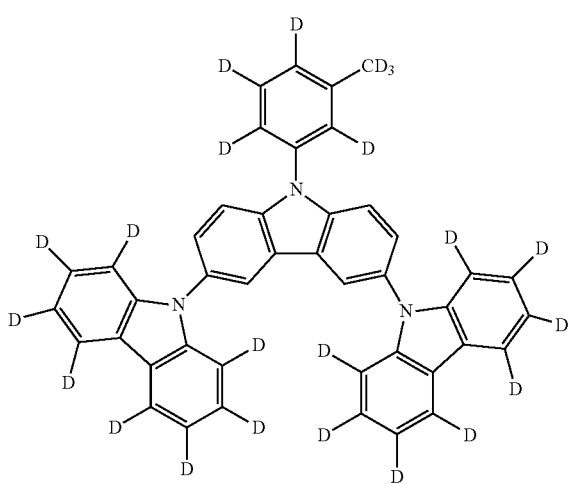

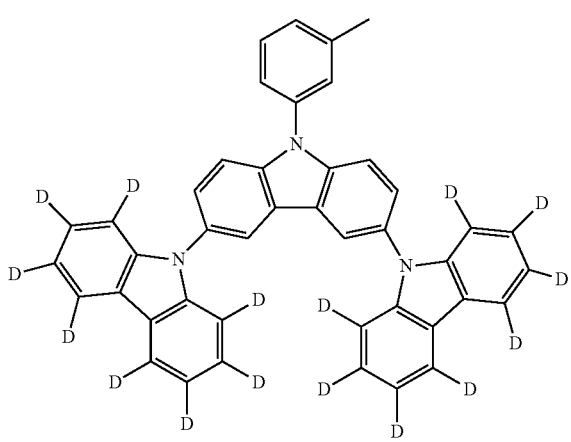

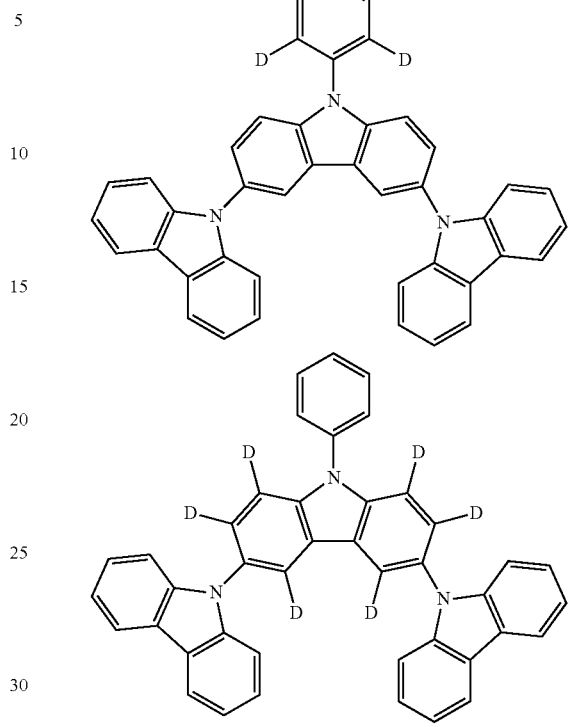

The hole injection layer or hole transporting layer of the organic electroluminescence device of the present invention may contain an electron-accepting dopant. As an electron-accepting dopant introduced into the hole injection layer or hole transporting layer, an inorganic compound or an organic compound may be used so long as the compound is electron-accepting, and has a property to oxidize organic compounds.

Specifically, the inorganic compound may contain halogenated metal such as ferric chloride, aluminum chloride, gallium chloride, indium chloride and antimony pentachloride, and metal oxide such as vanadium pentoxide and molybdenum trioxide.

In the case of the organic compound, a compound having a nitro group, a halogen, a cyano group or a trifluoromethyl group as a substituent, a quinone-based compound, an acid anhydride-based compound and fullerene may be appropriately used.

In addition to these, compounds described in Japanese Patent Application Laid-Open No. 6-212153, Japanese Patent Application Laid-Open No. Hei 11-111463, Japanese Patent Application Laid-Open No. Hei 11-251067, Japanese Patent Application Laid-Open No. 2000-196140, Japanese Patent Application Laid-Open No. 2000-286054, Japanese Patent Application Laid-Open No. 2000-315580, Japanese Patent Application Laid-Open No. 2001-102175, Japanese Patent Application Laid-Open No. 2001-160493, Japanese Patent Application Laid-Open No. 2002-252085, Japanese Patent Application Laid-Open No. 2002-56985, Japanese Patent Application Laid-Open No. 2003-157981, Japanese Patent Application Laid-Open No. 2003-217862, Japanese Patent Application Laid-Open No. 2003-229278, Japanese Patent Application Laid-Open No. 2004-342614, Japanese Patent Application Laid-Open No. 2005-72012, Japanese Patent Application Laid-Open No. 2005-166637, and Japanese Patent Application Laid-Open No. 2005-209643 may be appropriately used.

Among them, hexacyanobutadiene, hexacyanobenzene, tetracyanoethylene, tetracyanoquinodimethane, tetrafluorotetracyanoquinodimethane, p-fluoranyl, p-chloranyl, p-bromanyl, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerine C60 is preferable, hexacyanobutadiene, hexacyanobenzene, tetracyanoethylene, tetracyanoquinodimethane, tetrafluorotetracyanoquinodimethane, p-fluoranil, p-chloranyl, p-bromanyl, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone or 2,3,5,6-tetracyanopyridine is more preferable, and tetrafluorotetracyanoquinodimethane is particularly preferable.

These electron-accepting dopants may be used either alone or in combination of 2 or more kinds thereof. The amount of electron-accepting dopant used varies depending on a kind of a material, but preferably 0.01 mass % to 50 mass %, more preferably 0.05 mass % to 20 mass %, and particularly preferably 0.1 mass % to 10 mass % on the basis of the hole transporting layer material.

The thicknesses of each of the hole injection layer and the hole transporting layer preferably are 500 nm or less from the viewpoint of a decrease in driving voltage.

The thickness of the hole transporting layer is preferably 1 nm to 500 nm, more preferably 5 nm to 200 nm, and even more preferably 10 nm to 100 nm. The thickness of the hole injection layer is preferably 0.1 nm to 200 nm, more preferably 0.5 nm to 100 nm, and even more preferably 1 nm to 100 nm.

The hole injection layer and hole transporting layer may have a single layer structure composed of one or two or more kinds of the above-described materials, or may have a multilayer structure composed of a plurality of layers of the same or different compositions.

—Electron Injection Layer and Electron Transporting Layer—

Each of the electron injection layer and the electron transporting layer is a layer having a function of accepting electrons from the cathode or cathode side to transport the electrons into the anode side.

With respect to the hole injection layer, the hole transporting layer, the electron injection layer, and the electron transporting layer, the subject matters described in [0165] to [0167] of Japanese Patent Application Laid-Open No. 2008-270736 may be applied to the present invention.

—Hole Blocking Layer—

The hole blocking layer is a layer having a function of preventing the hole transported from the anode side to the light emitting layer from being discharged to the cathode side. In the present invention, the hole blocking layer may be installed as an organic layer that is adjacent to the light emitting layer and the cathode side.

Examples of the organic compound configuring the hole blocking layer may include an aluminum complex such as aluminum(III)bis(2-methyl-8-quinolinato) 4-phenylphenolate (abbreviated to Balq), a triazole derivative, and a phenanthroline derivative such as 2,9-dimethyl-4,7-diphenyl-1,10-phenanthroline (abbreviated as BCP).

The thickness of the hole blocking layer is preferably 1 nm to 500 nm, more preferably 5 nm to 200 nm, and even more preferably 10 nm to 100 nm.

The hole blocking layer may have a single layer structure composed of one kind or two or more kinds of the above-described materials, or may have a multilayer structure composed of a plurality of layers of the same or different compositions.

—Electron Blocking Layer—

The electron blocking layer is a layer having a function of preventing the electron transported from the cathode side to the light emitting layer from being discharged to the anode side. In the present invention, the electron blocking layer may be installed as an organic layer that is adjacent to the light emitting layer in the anode side.

Examples of the organic compound constituting the electron blocking layer may include, for example, those exemplified as the hole transporting material.

The thickness of the electron blocking layer is preferably 1 nm to 500 nm, more preferably 5 nm to 200 nm, and even more preferably 10 nm to 100 nm.

The electron blocking layer may have a single layer structure composed of one kind or two or more kinds of the above-described materials, or may have a multilayer structure composed of a plurality of layers having the same or different compositions.

<Protective Layer>

In the present invention, the entire organic EL device may be protected by a protective layer.

With respect to the protective layer, the subject matters described in [0169] to [0170] of Japanese Patent Application Laid-Open No. 2008-270736 may be applied to the present invention.

<Sealing Vessel>

The entire device of the present invention may be sealed by using a sealing vessel.

With respect to the sealing vessel, the subject matters described in [0171] of Japanese Patent Application Laid-Open No. 2008-270736 may be applied to the present invention.

[Film Forming Method]

Further, the present invention relates to a film forming method of forming a film by simultaneously heating the compound represented by Formula (1) and the compound represented by Formula (PQ-1) to sublimate the compounds.

When forming a film, it is preferable that the compound represented by Formula (1) and the compound represented by Formula (PQ-1) are mixed, and the composition of the present invention may be used. In the content ratio of the compound represented by Formula (1) and the compound represented by Formula (PQ-1), the content of the compound represented by Formula (PQ-1) is preferably 1% to 45%, and more preferably 1% to 25% on the basis of the compound represented by Formula (1).

The heating temperature is preferably 200° C. to 400° C., and more preferably 250° C. or 320° C.

The heating time is preferably 0.1 to 350 hours, and more preferably 0.1 to 150 hours.

According to the film forming method of the present invention, it is advantageous in that a light emitting layer film having high efficiency, high durability, and a small change in color when driving at a high temperature may be easily formed.

(Driving)

In the organic electroluminescence device of the present invention, light emission may be obtained by applying a DC voltage (typically 2 volts to 15 volts) (may include an alternating current component if necessary) or a direct current between the anode and the cathode.

With respect to the driving method of the organic electroluminescence device of the present invention, driving methods described in Japanese Patent Application Laid-Open No. Hei 2-148687, Japanese Patent Application Laid-Open No. Hei 6-301355, Japanese Patent Application Laid-Open No. Hei 5-29080, Japanese Patent Application Laid-Open No. Hei 7-134558, Japanese Patent Application Laid-Open No. Hei 8-234685, and Japanese Patent Application Laid-Open No. Hei 8-241047, and Japanese Patent No. 2784615, U.S. Pat. Nos. 5,828,429, and 6,023,308, and the like, may be applied.

The luminescence device of the present invention may improve light extraction efficiency by various known devices. For example, external quantum efficiency may be improved by improving light extraction efficiency by processing a surface shape of the substrate (for example, forming a fine uneven pattern), controlling refractive indexes of the substrate, ITO layer and organic layer, or controlling the thicknesses of the substrate, ITO layer and organic layer.

The external quantum efficiency of the organic electroluminescence device of the present invention is preferably 20% or more and 30% or less. As values of external quantum efficiency, a' maximum value of external quantum efficiency when driving the device at 20° C., or a value of external quantum efficiency near 100 to 300 cd/m$^2$ when driving the device at 20° C. may be used.

The luminescence device of the present invention may be a so-called top emission type extracting light emitted from the anode side.

The organic EL device in the present invention may have a resonator structure. For example, a multilayer film mirror formed of a plurality of laminate films having different refractive indexes, a transparent or semi-transparent electrode, a light emitting layer and a metal electrode are overlapped on the transparent substrate. Light generated in the light emitting layer is repeatedly reflected and resonated between the multilayer film mirror and the metal electrode as a reflection plate.

In another preferable aspect, on the transparent substrate, each of the transparent or semi-transparent electrode and the metal electrode serves as the reflection plate, such that light generated in the light emitting layer is repeatedly reflected and resonated therebetween.

In order to form a resonant structure, a length of a light path, which is determined from effective refractive indexes of two reflection plates, and a refractive index and a thickness of each layer between the reflection plates, is controlled to be an optimum value for obtaining a desired resonant wavelength. In the case of the first aspect, a calculation equation is described in Japanese Patent Application Laid-Open No. Hei 9-180883. In the case of the second aspect, a calculation equation is described in Japanese Patent Application Laid-Open No. 2004-127795.

(Use of the Luminescence Device of the Present Invention)

The luminescence device of the present invention may be appropriately used for a light emission apparatus, a pixel, a display device, a display, a backlight, an electronic picture, an illumination light source, a recording light source, an exposure light source, a reading light source, a signal, a signboard, an interior or an optical communication. Particularly, the luminescence device is preferably used in a device that is driven in a field where luminance intensity is high, such as an illumination apparatus and a display apparatus.

Next, with reference to FIG. 2, a light emission apparatus of the present invention will be described.

The light emission apparatus of the present invention is formed by using the organic electroluminescence device.

Figure 2:
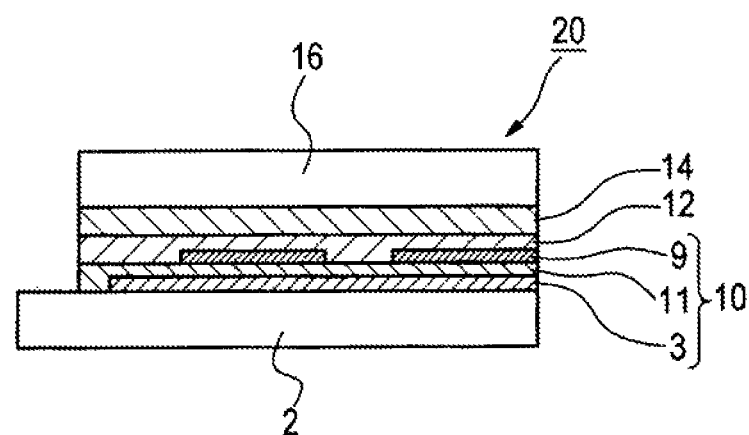
FIG. 2 is a schematic view illustrating an example (second exemplary embodiment) of a light emission apparatus according to the present invention.

FIG. 2 is a cross-sectional view schematically illustrating an example of the light emission apparatus of the present invention.

A light emission apparatus 20 of FIG. 2 is composed of a transparent substrate (substrate) 2, an organic electroluminescence device 10, and a sealing vessel 16.

The organic electroluminescence device 10 is configured by sequentially laminating an anode (first electrode) 3, an organic layer 11, a cathode (second electrode) 9 on the substrate 2. Further, on the cathode 9, a protective layer 12 is laminated, and on the protective layer 12, the sealing vessel 16 is further installed through an adhesive layer 14. In addition, a portion of each of the electrodes 3 and 9, a partition and an insulating layer are omitted.

Herein, as the adhesive layer 14, a photocurable adhesive or a thermosetting adhesive such as an epoxy resin may be used, and for example, a thermosetting adhesive sheet may be used.

The use of the light emission apparatus of the present invention is not particularly limited, and for example, in addition to the illumination apparatus, the apparatus may be used as a display apparatus such as a television, a personal computer, a mobile phone and an electronic paper.

Next, with reference to FIG. 3, an illumination apparatus according to the exemplary embodiment of the present invention will be described.

Figure 3:
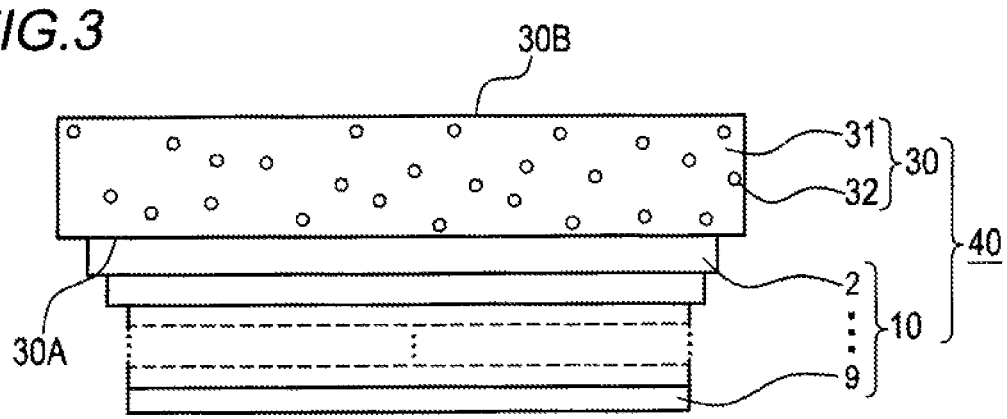
FIG. 3 is a schematic view illustrating an example (third exemplary embodiment) of an illumination apparatus according to the present invention.

FIG. 3 is a cross-sectional view schematically illustrating an example of the illumination apparatus according to the exemplary embodiment of the present invention.

The illumination apparatus 40 according to the exemplary embodiment of the present invention, as shown in FIG. 3, is provided with the organic EL device 10 and a light scattering member 30. More specifically, the illumination apparatus 40 is configured so that the substrate 2 of the organic EL device 10 comes in contact with the light scattering member 30.

The light scattering member 30 is not particularly limited so long as the member can scatter light, but in FIG. 3, the member is formed of a member in which microparticles 32 are dispersed in a transparent substrate 31. The transparent substrate 31 may appropriately be, for example, a glass substrate. The microparticles 32 may appropriately be transparent resin microparticles. Publicly known glass substrate and transparent resin microparticles may be used. If light emitted from the organic electroluminescence device 10 is incident on a light incident surface 30A of the scattering member 30, the illumination apparatus 40 scatters the incident light by the light scattering member 30 and reflect the scattered light from a light reflecting surface 30B as illumination light.

EXAMPLE

Hereinafter, the present invention will be described with reference to the following Examples in more detail, but the scope of the present invention is not limited to the following particular examples.

The compound represented by Formula (1), which was used in the Examples, was synthesized with reference to the pamphlet of International Publication No. WO03/080760, the pamphlet of International Publication No. WO03/078541, the pamphlet of International Publication No. WO05/085387, the pamphlet of International Publication No. WO05/022962, and the like. For example, exemplary compound 4 may be synthesized using m-bromobenzoaldehyde as a starting raw material by a method described in [0074] to [0075] of the pamphlet of International Publication No. WO05/085387 (page 45, line 11 to page 46, line 18). Further, exemplary compound 77 may be synthesized using N-phenylcarbazole as a starting raw material by a method described on page 137, line 10 to page 139, line 9 of the pamphlet of International Publication No. WO05/022962. FR-1 to FR-3 may be synthesized by various methods such as a method described in, for example, Japanese Patent No. 3929632. For example, FR-2 may be synthesized by using 2-phenylquinoline as a starting raw material by a method described on page 18, lines 2 to 13 of Japanese Patent No. 3929632. Further, FR-3 may be synthesized by using 2-(2-naphthyl)quinoline as a starting raw material by a method described on page 18, line 14 to page 19, line 8 of Japanese Patent No. 3929632.

The compound represented by Formula (C-1), which was used in the Examples, was synthesized by methods described in Japanese Patent Application Laid-Open No. 2005-310733, Japanese Patent Application Laid-Open No. 2006-93542, Japanese Patent Application Laid-Open No. 2007-19462, Journal of Organic Chemistry 53, 786 (1988), and the like. For example, compound 8-4 may be synthesized by a method described on page 52, line 34 to page 53, line 23 of Japanese Patent Application Laid-Open No. 2007-19462 using the following compound BBPy as a starting raw material which may be obtained by a method described on page 789, line 53 of the left-hand column to line 7 of the right-hand column, a method described on page 790, lines 18 to 38 of the left-hand column, a method described on page 790, lines 19 to 30 of the right-hand column in Journal of Organic Chemistry 53, 786 (1988), G. R. Newkome et al., and a combination thereof.

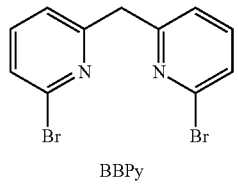 [SMILES: Brc1cccc(Cc2cccc(Br)n2)n1]

BBPy

In addition, all of the organic materials used in the Examples in the present specification were subjected to sublimation purification and used.

Comparative Example 1

A glass substrate having an indium tin oxide (ITO) film having a thickness of 0.5 mm and each side of 2.5 cm in square (manufactured by Geomatec Co., Ltd., and surface resistance 10Ω/□) was put into a washing container, ultrasonically washed in 2-propanol, followed by UV-ozone treatment for 30 min. The following organic layers were sequentially vapor deposited on this transparent anode (ITO film) by means of vacuum deposition.

First layer: CuPc (copper phthalocyanine): film thickness 10 nm

Second layer: NPD (N,N'-di-α-naphthyl-N,N'-diphenyl)-benzidine): film thickness 30 nm Third layer: dopant ($Ir(btp)_2(acac)$, 5 mass %), and host material (CBP, 95 mass %): film thickness 30 nm Fourth layer: Balq: film thickness 10 nm Fifth layer: Alq (tris(8-hydroxyquinoline)aluminum complex): film thickness 40 nm 0.2 nm-thick lithium fluoride and 70 nm-thick metal aluminum were vapor deposited in this order thereon, thereby forming a cathode. A film containing two or more kinds of materials as the third layer was formed by simultaneously heating the materials to sublimate the materials.

The obtained laminate was placed in a glove box substituted with an argon gas without being in contact with the atmosphere, and sealed using a glass-made sealing tube and a UV-curable adhesive (XNR5516-HV, manufactured by Nagase-CHIBA Ltd.) to obtain a device of Comparative Example 1.

Examples 1 to 59 and Comparative Examples 2 to 13

Various devices were obtained in the same manner as in Comparative Example 1, except that the constituting materials of the third layer (host material and dopant) and the constituting material of the fourth layer were changed into compositions shown in the following Tables 1 to 6.

For example, in the third layer of Example 40, 85 mass % of the exemplary compound 4 as a host material, 5 mass % of FR-1, and 10 mass % of platinum complex 2-3 were used.

TABLE 1

| | Light emitting layer (Third layer) | | Fourth layer | External quantum efficiency (%) | Driving durability | Color shift after driving at high temperature |
|---|---|---|---|---|---|---|
| | Host material | Dopant | | | | |
| Comparative Example 1 | CBP | 5% $Ir(btp)_2(acac)$ | Balq | 3.2 | 100 | (0.01, 0.02) |
| Comparative Example 2 | Exemplary compound 4 | 5% $Ir(btp)_2(acac)$ | Balq | 3.4 | 110 | (0.01, 0.03) |
| Comparative Example 3 | CBP | 5% FR-1 | Balq | 6.8 | 140 | (<0.005, 0.008) |
| Example 1 | Exemplary compound 4 | 5% FR-1 | Balq | 11.5 | 400 | (<0.005, <0.005) |
| Example 2 | Exemplary compound 4 | 5% FR-2 | Balq | 12.4 | 600 | (<0.005, <0.005) |
| Example 3 | Exemplary compound 4 | 5% FR-3 | Balq | 11.0 | 550 | (<0.005, <0.005) |
| Example 4 | Exemplary compound 4 | 5% FR-4 | Balq | 10.5 | 350 | (<0.005, <0.005) |
| Comparative Example 4 | Exemplary compound 69 | 5% $Ir(btp)_2(acac)$ | Balq | 3.4 | 120 | (0.02, 0.01) |
| Example 5 | Exemplary compound 69 | 5% FR-1 | Balq | 9.8 | 250 | (<0.005, <0.005) |

TABLE 1-continued

|  | Light emitting layer (Third layer) | | Fourth layer | External quantum efficiency (%) | Driving durability | Color shift after driving at high temperature |
|---|---|---|---|---|---|---|
|  | Host material | Dopant | | | | |
| Example 6 | Exemplary compound 6 | 5% FR-2 | Balq | 10.5 | 370 | (<0.005, <0.005) |
| Example 7 | Exemplary compound 69 | 5% FR-3 | Balq | 9.9 | 290 | (<0.005, <0.005) |

TABLE 2

|  | Light emitting layer (Third layer) | | Fourth layer | External quantum efficiency (%) | Driving durability | Color shift after driving at high temperature |
|---|---|---|---|---|---|---|
|  | Host material | Dopant | | | | |
| Comparative Example 5 | Exemplary compound 40 | 5% Ir(btp)$_2$(acac) | Balq | 3.6 | 110 | (0.01, 0.01) |
| Example 8 | Exemplary compound 40 | 5% FR-1 | Balq | 8.7 | 220 | (<0.005, <0.005) |
| Example 9 | Exemplary compound 40 | 5% FR-2 | Balq | 10.8 | 340 | (<0.005, <0.005) |
| Example 10 | Exemplary compound 40 | 5% FR-3 | Balq | 10.4 | 330 | (<0.005, <0.005) |
| Comparative Example 6 | Exemplary compound 101 | 5% Ir(btp)$_2$(acac) | Balq | 3.4 | 110 | (0.01, 0.01) |
| Example 11 | Exemplary compound 101 | 5% FR-1 | Balq | 11.2 | 430 | (<0.005, <0.005) |
| Example 12 | Exemplary compound 101 | 5% FR-2 | Balq | 12.1 | 620 | (<0.005, <0.005) |
| Example 13 | Exemplary compound 101 | 5% FR-3 | Balq | 11.1 | 450 | (<0.005, <0.005) |
| Comparative Example 7 | Exemplary compound 102 | 5% Ir(btp)$_2$(acac) | Balq | 3.4 | 100 | (0.01, 0.02) |
| Example 14 | Exemplary compound 102 | 5% FR-1 | Balq | 11.0 | 390 | (<0.005, <0.005) |
| Example 15 | Exemplary compound 102 | 5% FR-2 | Balq | 12.0 | 540 | (<0.005, <0.005) |
| Example 16 | Exemplary compound 102 | 5% FR-3 | Balq | 9.7 | 460 | (<0.005, <0.005) |

TABLE 3

|  | Light emitting layer (Third layer) | | Fourth layer | External quantum efficiency (%) | Driving durability | Color shift after driving at high temperature |
|---|---|---|---|---|---|---|
|  | Host material | Dopant | | | | |
| Comparative Example 8 | Exemplary compound 8 | 5% Ir(btp)$_2$(acac) | Balq | 2.4 | 84 | (0.01, 0.01) |
| Example 17 | Exemplary compound 8 | 5% FR-1 | Balq | 10.6 | 330 | (<0.005, <0.005) |
| Example 18 | Exemplary compound 8 | 5% FR-2 | Balq | 10.9 | 440 | (<0.005, <0.005) |
| Example 19 | Exemplary compound 8 | 5% FR-3 | Balq | 10.0 | 450 | (<0.005, <0.005) |
| Example 20 | Exemplary compound 105 | 5% FR-1 | Balq | 11.9 | 390 | (<0.005, <0.005) |
| Example 21 | Exemplary compound 106 | 5% FR-1 | Balq | 11.7 | 330 | (<0.005, <0.005) |
| Example 22 | Exemplary compound 107 | 5% FR-1 | Balq | 12.7 | 280 | (<0.005, <0.005) |
| Example 23 | Exemplary compound 108 | 5% FR-1 | Balq | 11.1 | 380 | (<0.005, <0.005) |
| Example 24 | Exemplary compound 109 | 5% FR-1 | Balq | 11.5 | 250 | (<0.005, <0.005) |
| Example 25 | Exemplary compound 112 | 5% FR-1 | Balq | 10.8 | 380 | (<0.005, <0.005) |
| Example 26 | Exemplary compound 113 | 5% FR-1 | Balq | 11.6 | 380 | (<0.005, <0.005) |

TABLE 4

| | Light emitting layer (Third layer) | | | External quantum efficiency | Driving | Color shift after driving at high |
|---|---|---|---|---|---|---|
| | Host material | Dopant | Fourth layer | (%) | durability | temperature |
| Comparative Example 9 | CBP | 5% Ir(btp)$_2$(acac) | Exemplary compound 4 | 5.2 | 75 | (0.01, 0.01) |
| Comparative Example 10 | Exemplary compound 4 | 5% Ir(btp)$_2$(acac) | Exemplary compound 4 | 5.7 | 100 | (0.01, 0.01) |
| Comparative Example 11 | CBP | 5% FR-1 | Exemplary compound 4 | 7.0 | 100 | (0.01, 0.008) |
| Example 27 | Exemplary compound 4 | 5% FR-1 | Exemplary compound 4 | 13.8 | 380 | (<0.005, <0.005) |
| Example 28 | Exemplary compound 4 | 5% FR-2 | Exemplary compound 4 | 14.2 | 550 | (<0.005, <0.005) |
| Example 29 | Exemplary compound 4 | 5% FR-3 | Exemplary compound 4 | 14.8 | 500 | (<0.005, <0.005) |
| Example 30 | Exemplary compound 4 | 5% FR-1 | Exemplary compound 101 | 13.5 | 360 | (<0.005, <0.005) |
| Example 31 | Exemplary compound 4 | 5% FR-1 | Exemplary compound 102 | 13.3 | 360 | (<0.005, <0.005) |
| Example 32 | Exemplary compound 4 | 5% FR-1 | Exemplary compound 8 | 14.2 | 400 | (<0.005, <0.005) |
| Example 33 | Exemplary compound 4 | 5% FR-1 | Exemplary compound 105 | 13.1 | 370 | (<0.005, <0.005) |
| Example 34 | Exemplary compound 4 | 5% FR-1 | Exemplary compound 106 | 13.5 | 350 | (<0.005, <0.005) |
| Example 35 | Exemplary compound 107 | 5% FR-1 | Exemplary compound 107 | 13.4 | 310 | (<0.005, <0.005) |
| Example 36 | Exemplary compound 108 | 5% FR-1 | Exemplary compound 108 | 13.6 | 350 | (<0.005, <0.005) |
| Example 37 | Exemplary compound 109 | 5% FR-1 | Exemplary compound 109 | 11.4 | 290 | (<0.005, <0.005) |
| Example 38 | Exemplary compound 112 | 5% FR-1 | Exemplary compound 112 | 12.7 | 330 | (<0.005, <0.005) |
| Example 39 | Exemplary compound 113 | 5% FR-1 | Exemplary compound 7 | 13.1 | 330 | (<0.005, <0.005) |

TABLE 5

| | Light emitting layer (Third layer) | | Fourth layer | External quantum efficiency (%) | Driving durability | Color shift after driving at high temperature |
|---|---|---|---|---|---|---|
| | Host material | Dopant | | | | |
| Comparative Example 12 | Exemplary compound 4 | 5% Ir(btp)$_2$(acac) + 10% Complex 2-3 | Balq | 3.2 | 100 | (0.01, 0.01) |
| Comparative Example 13 | CBP | 5% FR-1 + 10% Complex 2-3 | Balq | 7.2 | 160 | (<0.005, 0.01) |
| Example 40 | Exemplary compound 4 | 5% FR-1 + 10% Complex 2-3 | Balq | 16.0 | 500 | (<0.005, <0.005) |
| Example 41 | Exemplary compound 4 | 5% FR-1 + 10% Complex 8-4 | Balq | 15.8 | 490 | (<0.005, <0.005) |
| Example 42 | Exemplary compound 4 | 5% FR-1 + 10% Complex 9-16 | Balq | 15.8 | 460 | (<0.005, <0.005) |
| Example 43 | Exemplary compound 4 | 5% FR-1 + 10% Complex 9-20 | Balq | 16.2 | 510 | (<0.005, <0.005) |
| Example 44 | Exemplary compound 4 | 5% FR-1 + 10% Complex 2-8 | Balq | 15.5 | 430 | (<0.005, <0.005) |
| Example 45 | Exemplary compound 4 | 5% FR-1 + 10% Complex 5-2 | Balq | 14.7 | 460 | (<0.005, <0.005) |
| Example 46 | Exemplary compound 4 | 5% FR-2 + 10% Complex 2-3 | Balq | 16.3 | 610 | (<0.005, <0.005) |
| Example 47 | Exemplary compound 4 | 5% FR-1 + 10% Complex 9-2 | Balq | 13.0 | 380 | (<0.005, <0.005) |
| Example 48 | Exemplary compound 4 | 5% FR-1 + 10% Complex 8-2 | Balq | 15.1 | 460 | (<0.005, <0.005) |
| Example 49 | Exemplary compound 4 | 5% FR-1 + 10% Complex 2-3 | Balq | 15.0 | 550 | (<0.005, <0.005) |

TABLE 6

| | Light emitting layer (Third layer) | | Fourth layer | External quantum efficiency (%) | Driving durability | Color shift after driving at high temperature |
|---|---|---|---|---|---|---|
| | Host material | Dopant | | | | |
| Example 50 | 80% Exemplary compound 4 + 15% R-1 | 5% FR-1 | Balq | 11.5 | 380 | (<0.005, <0.005) |
| Example 51 | 80% Exemplary compound 4 + 15% R-2 | 5% FR-1 | Balq | 11.6 | 385 | (<0.005, <0.005) |
| Example 52 | 80% Exemplary compound 45 + 15% R-3 | 5% FR-1 | Balq | 8.7 | 210 | (<0.005, <0.005) |
| Example 53 | 80% Exemplary compound 45 + 15% R-4 | 5% FR-1 | Balq | 8.5 | 215 | (<0.005, <0.005) |
| Example 54 | 80% Exemplary compound 77 + 15% R-5 | 5% FR-1 | Balq | 9.7 | 240 | (<0.005, <0.005) |
| Example 55 | 80% Exemplary compound 77 + 15% R-6 | 5% FR-1 | Balq | 9.6 | 220 | (<0.005, <0.005) |
| Example 56 | 70% Exemplary compound 4 + 25% R-7 | 5% FR-1 | Balq | 8.6 | 210 | (<0.005, <0.005) |
| Example 57 | 70% Exemplary compound 4 + 15% R-8 | 5% FR-1 + 10% Complex 2-3 | Balq | 7.9 | 210 | (<0.005, <0.005) |
| Example 58 | 70% Exemplary compound 4 + 15% R-9 | 5% FR-1 + 10% Complex 2-3 | Balq | 7.7 | 225 | (<0.005, <0.005) |
| Example 59 | 70% Exemplary compound 4 + 15% R-10 | 5% FR-1 + 10% Complex 2-3 | Balq | 7.5 | 195 | (<0.005, <0.005) |

Example 60

A glass substrate having an indium tin oxide (ITO) film having a thickness of 0.5 mm and each side of 2.5 cm in square (manufactured by Geomatec Co., Ltd., and surface resistance 10Ω/□) was put into a washing container, ultrasonically washed in 2-propanol, followed by UV-ozone treatment for 30 min. The following organic layers were sequentially vapor deposited on this transparent anode (ITO film) by means of vacuum deposition.

First layer: CuPc (copper phthalocyanine): film thickness 10 nm

Second layer: NPD (N,N'-di-α-naphthyl-N,N'-diphenyl)-benzidine): film thickness 30 nm Third layer: Adjacent layer material (V-1): film thickness 3 nm Fourth layer: dopant (FR-1, 5 mass %), and host material (exemplary compound 4, 95 mass %): film thickness 30 nm Fifth layer: Balq: film thickness 10 nm Sixth layer: Alq (tris(8-hydroxyquinoline)aluminum complex): film thickness 40 nm 0.2 nm-thick lithium fluoride and 70 nm-thick metal aluminum were vapor deposited in this order thereon, thereby forming a cathode.

The obtained laminate was placed in a glove box substituted with an argon gas without being in contact with the atmosphere, and sealed using a glass-made sealing tube and a UV-curable adhesive (XNR5516HV, manufactured by Nagase-CHIBA Ltd.) to obtain a device of Example 60.

Examples 60 to 65

Various devices were obtained in the same manner as in Example 60, except that the constituting material of the third layer and the constituting materials of the fourth layer (host material and dopant) were changed into compositions shown in the following Table 7.

TABLE 7

| | Third layer | Light emitting layer (Fourth layer) | | Fifth layer | External quantum efficiency (%) | Driving durability | Color shift after driving at high temperature |
|---|---|---|---|---|---|---|---|
| | | Host material | Dopant | | | | |
| Example 60 | V-1 | Exemplary compound 4 | 5% FR-1 | Balq | 11.8 | 420 | (<0.005, <0.005) |
| Example 61 | V-2 | Exemplary compound 4 | 5% FR-1 | Balq | 11.9 | 422 | (<0.005, <0.005) |
| Example 62 | V-3 | Exemplary compound 4 | 5% FR-1 | Balq | 10.7 | 380 | (<0.005, <0.005) |
| Example 63 | V-4 | Exemplary compound 4 | 5% FR-1 | Balq | 10.6 | 390 | (<0.005, <0.005) |

TABLE 7-continued

| | Third layer | Light emitting layer (Fourth layer) Host material | Dopant | Fifth layer | External quantum efficiency (%) | Driving durability | Color shift after driving at high temperature |
|---|---|---|---|---|---|---|---|
| Example 64 | V-5 | Exemplary compound 4 | 5% FR-1 | Balq | 10.9 | 380 | (<0.005, <0.005) |
| Example 65 | V-6 | Exemplary compound 4 | 5% FR-1 | Balq | 11.2 | 360 | (<0.005, <0.005) |

(Evaluation of Performance of the Organic Electroluminescence Device)

Performances of the obtained various devices were evaluated.

(a) External Quantum Efficiency

DC voltage was applied to the respective devices by using a Source Measure Unit 2400 manufactured by Toyo Technica Corporation to enable the devices to emit light. The luminance intensity was measured by using a luminance meter BM-8 manufactured by TOPCON CORPORATION. Emission spectrum and emission wavelengths were measured by using a spectrum analyzer PMA-11 manufactured by Hamamatsu Photonics K.K. On the basis of the obtained numerical values, the external quantum efficiency in the vicinity of the luminance intensity of about 1000 cd/m² was calculated by a luminance intensity conversion method.

(b) Driving Durability

DC voltage was applied to the respective devices such that the luminance intensity was 1000 cd/m², thereby enabling the devices to continuously emit light, and then, a time required until the luminance intensity became 500 cd/m² was set as an index of the driving durability, and a relative value was obtained by setting the value of Comparative Example 1 to 100.

(c) Change in Chromaticity when Driving at a High Temperature

The differences between x values and between y values (Δx and Δy) of chromaticity obtained between when DC voltage was applied to the respective devices such that the luminance intensity became 1000 cd/m² to enable the devices to emit light, and when DC voltage had been applied to respective devices such that the luminance intensity became 1000 cd/m² in a thermostatic bath at 80° C. to enable the devices to emit light continuously and the luminance intensity became 500 cd/m², were used as indices for a change in chromaticity when driving at a high temperature.

From the results of Tables 1 to 7, it is understood that the device of the present invention using the host material containing the compound represented by Formula (1) having a carbazole group and a specific iridium complex represented by Formula (PQ-1) in the light emitting layer has excellent external quantum efficiency and driving durability and shows a small change in chromaticity after driving at a high temperature as compared to the devices of the Comparative Examples.

In the case of a light emission apparatus, a display apparatus and an illumination apparatus, it is required to instantaneously emit light emission at high luminance intensity through a high current density in each pixel, and the luminescence device of the present invention is advantageously designed so that emission efficiency is increased in such a case.

Further, the device of the present invention has excellent emission efficiency and durability when used for in-vehicle under the high temperature environment, and thus, is suitable for the light emission apparatus, the display apparatus and the illumination apparatus.

The structures of the compounds used in the Examples and Comparative Examples will be shown below.

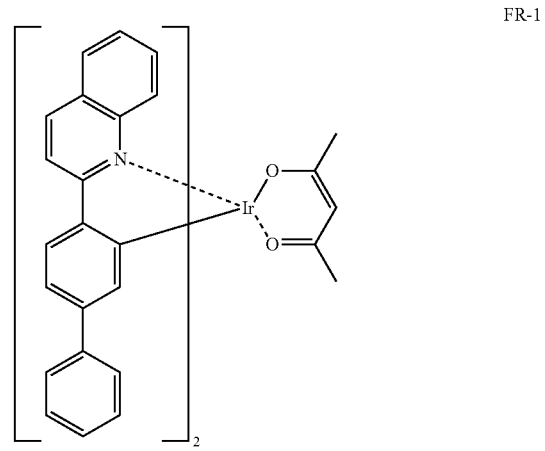

FR-1

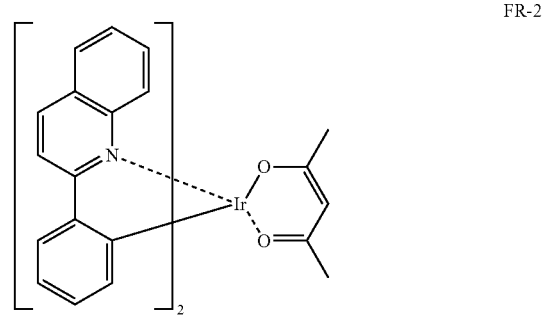

FR-2

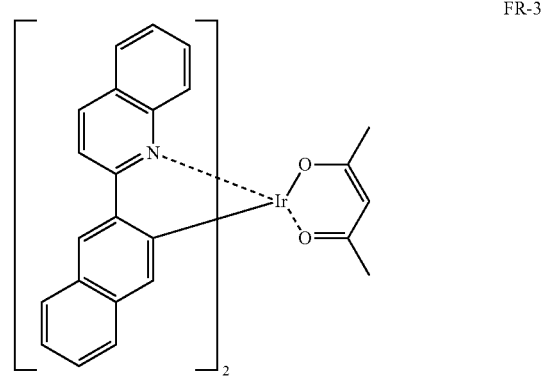

FR-3

FR-4
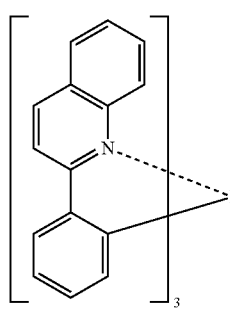
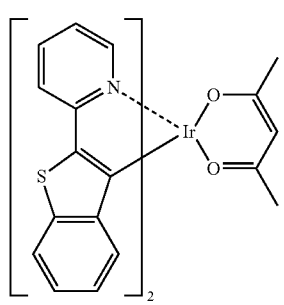
Ir(btp)₂(acac)
4
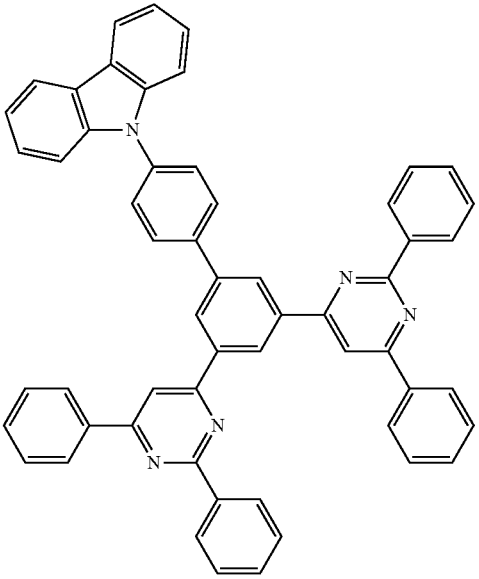
6
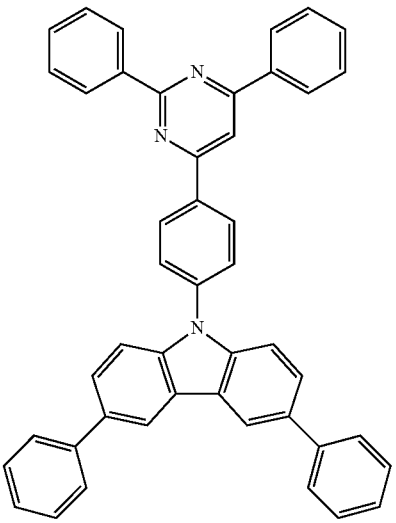
8
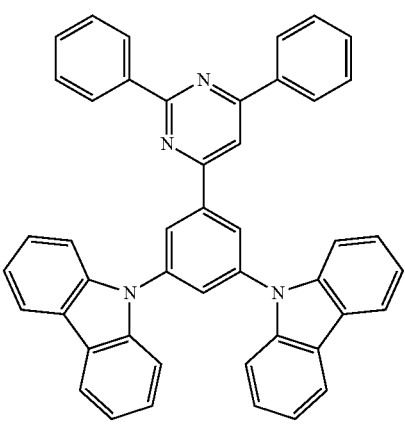

69
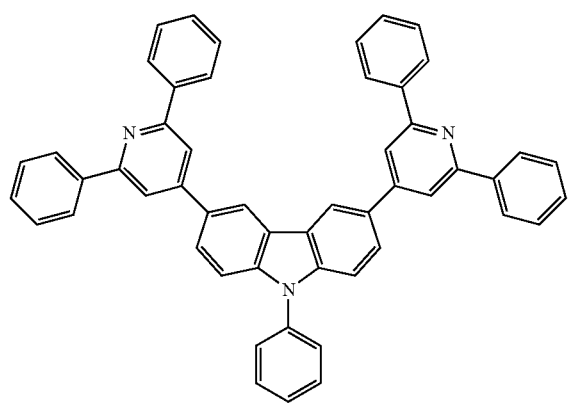
101
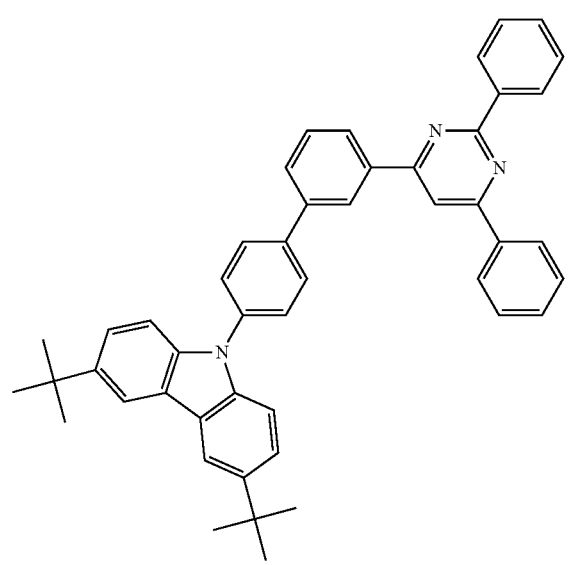
102
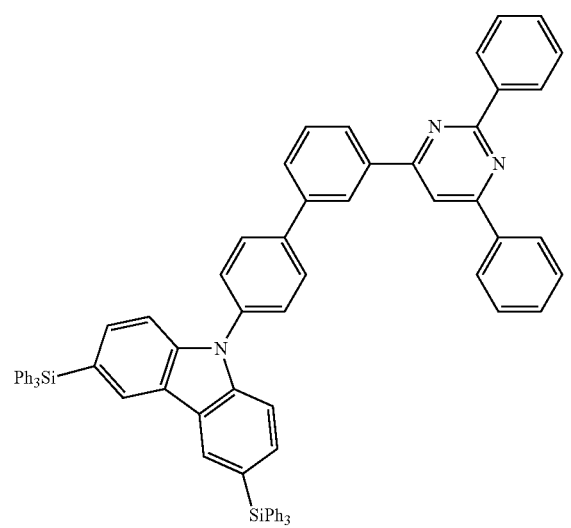
105
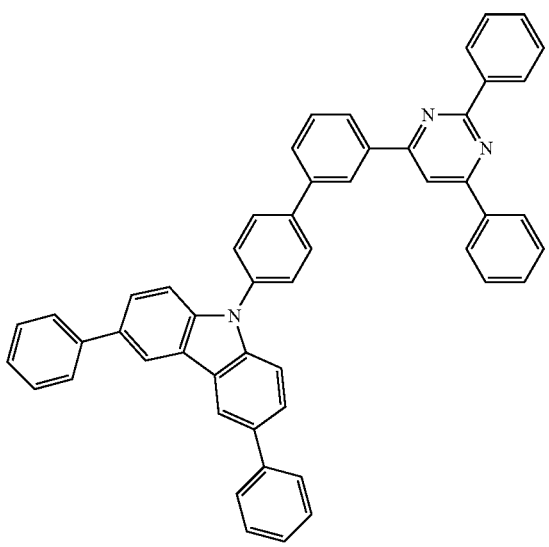
106
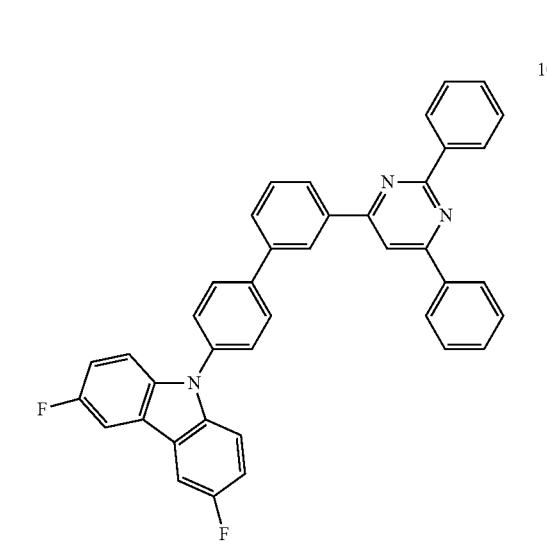
107
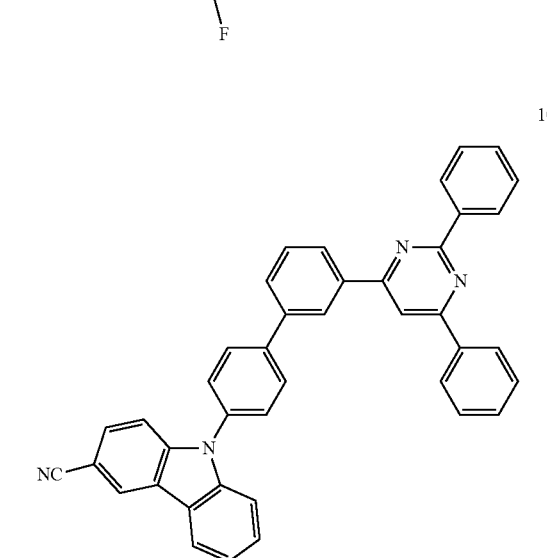

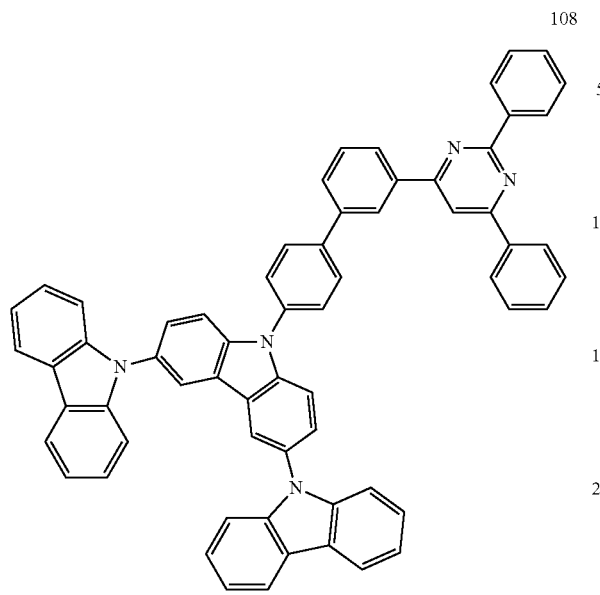
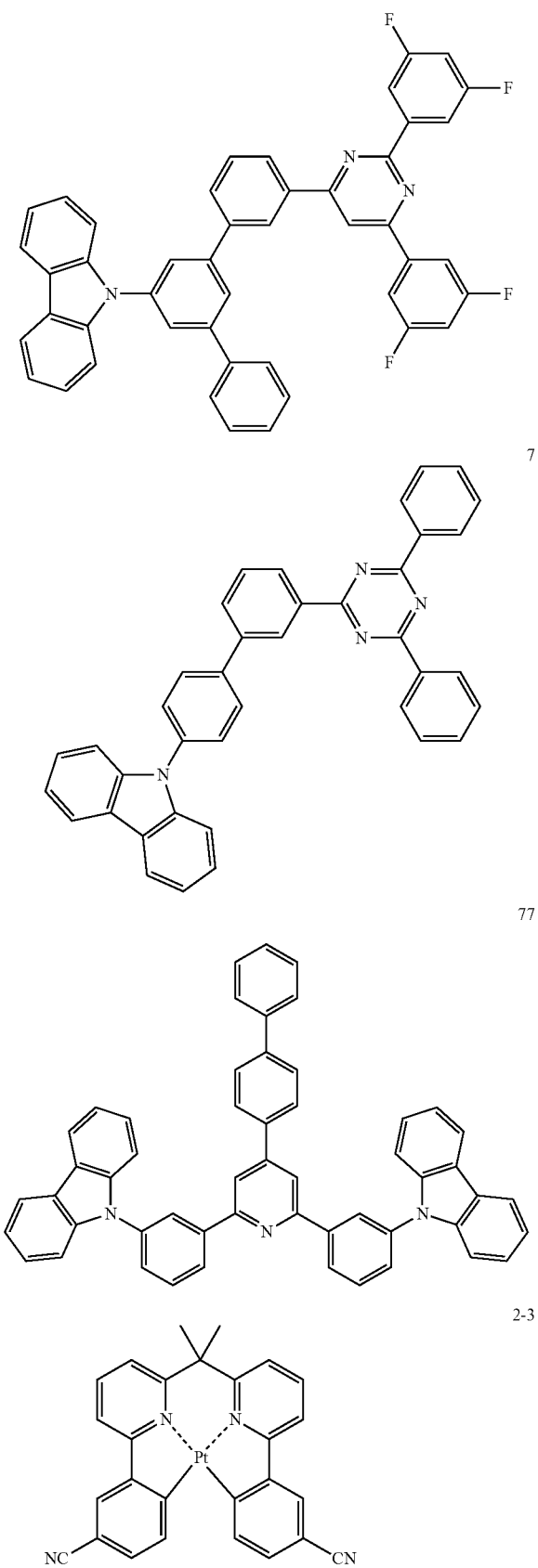

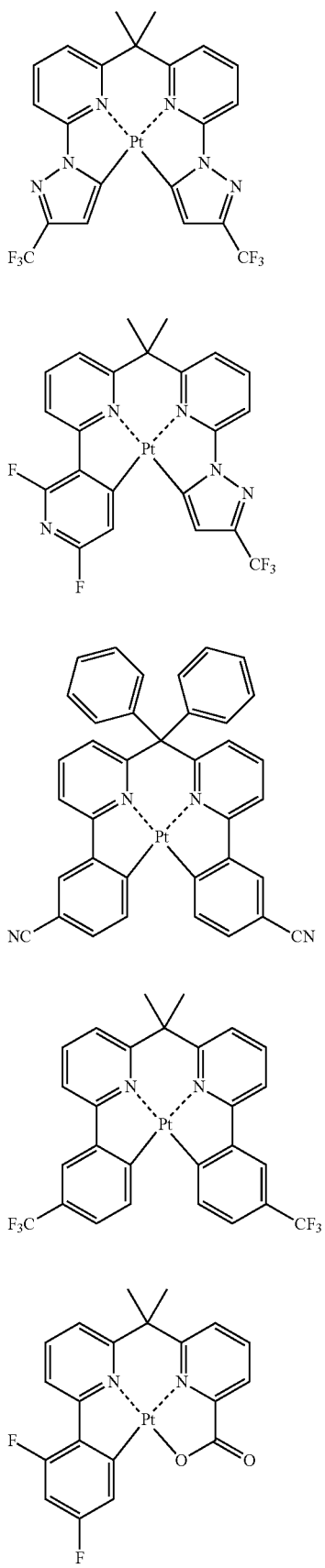
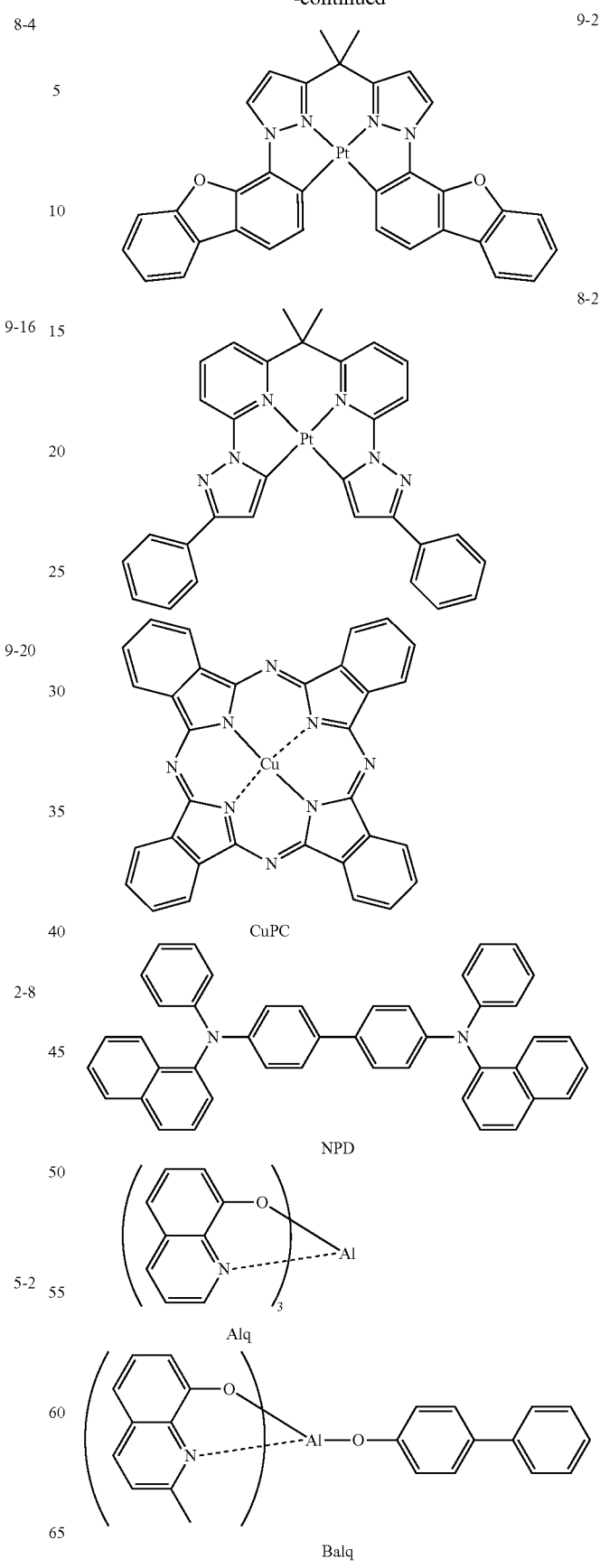

159
-continued
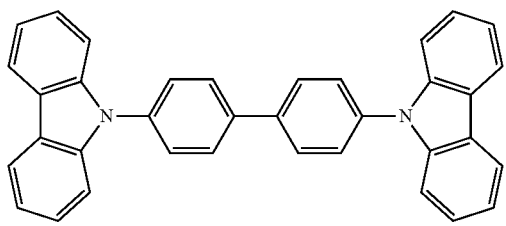
CBP
R-1
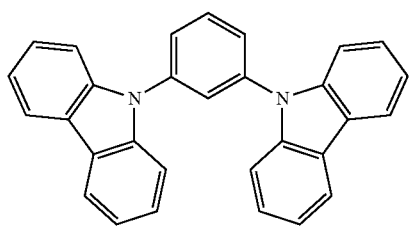
R-2
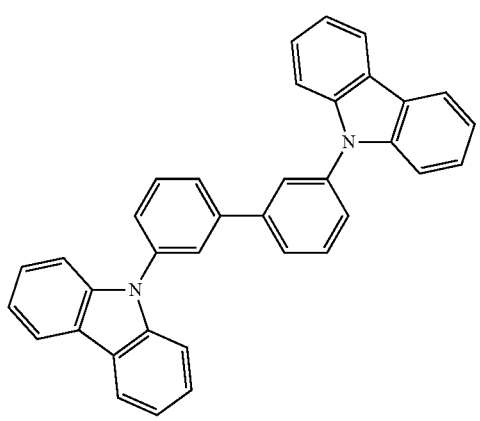
R-3
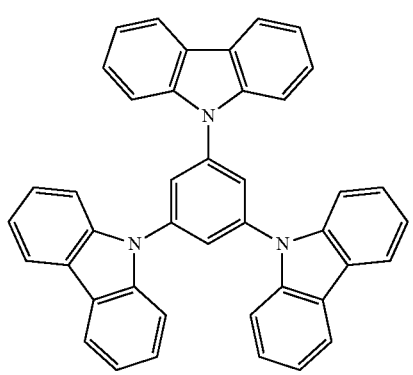
R-4
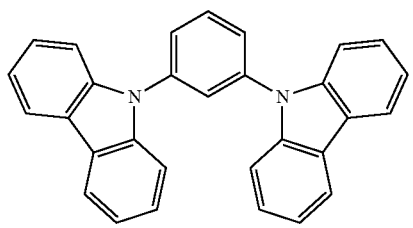
160
-continued
R-5
R-6
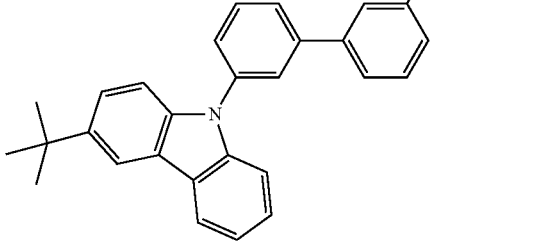
R-7
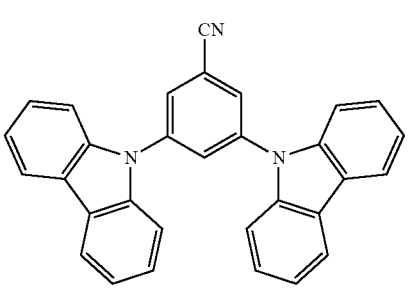
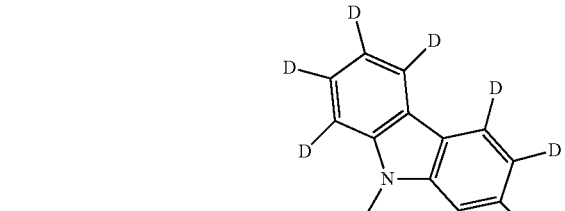
R-8
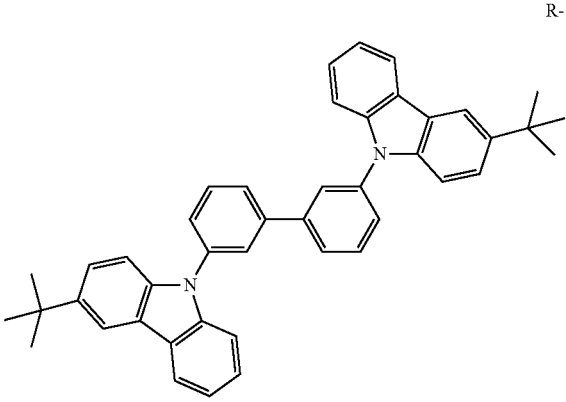

R-9
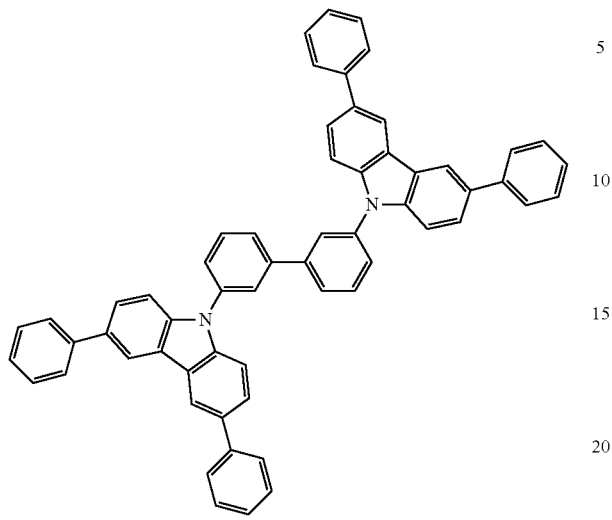
V-2
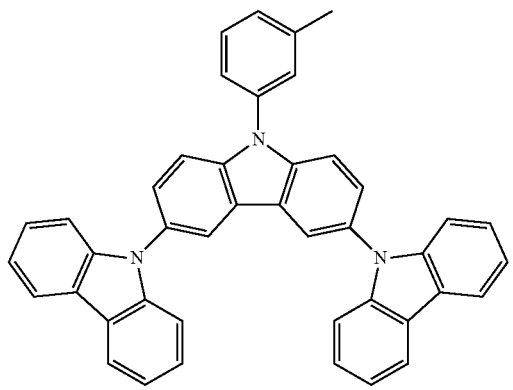
V-3
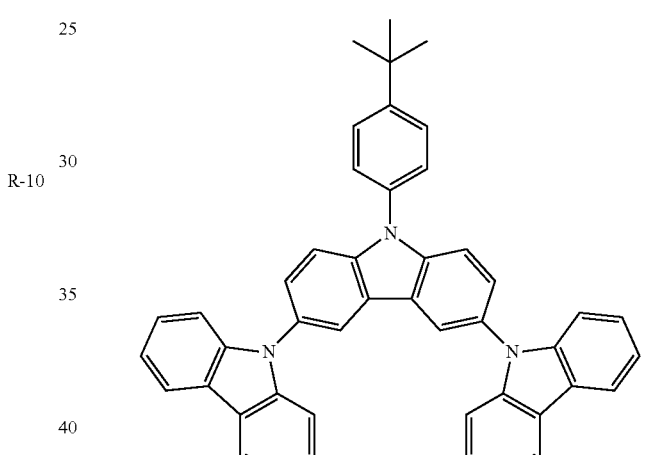
R-10
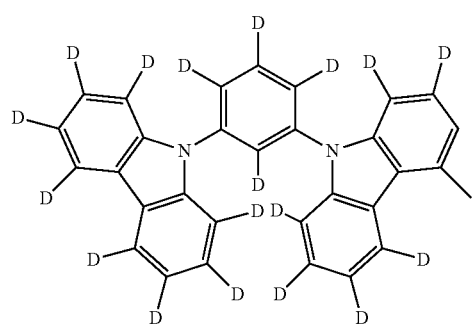
V-1
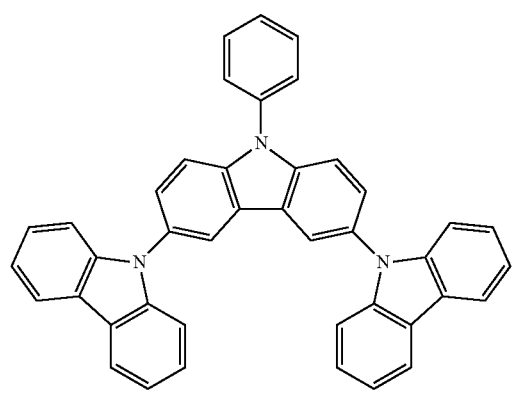
V-4
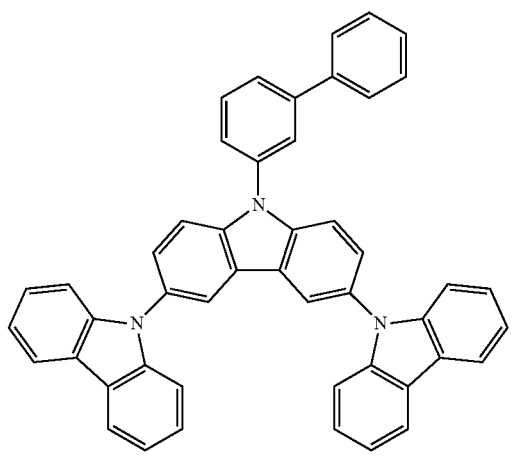

V-5

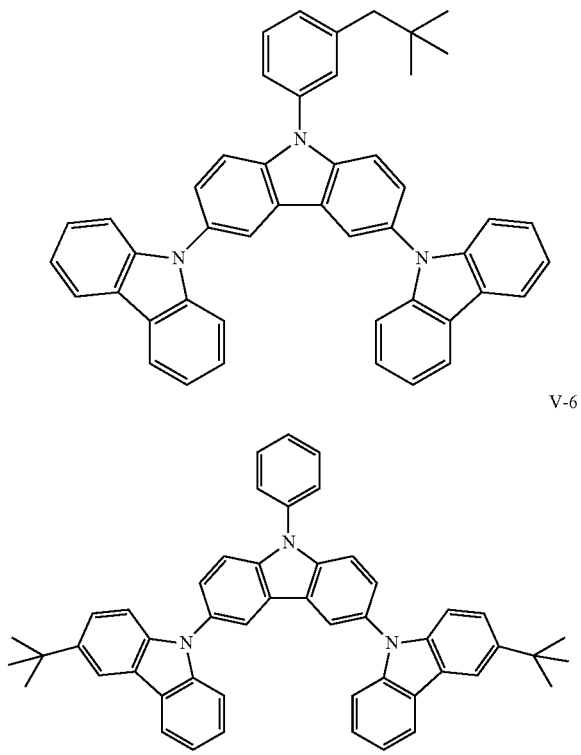

V-6

INDUSTRIAL APPLICABILITY

An organic electroluminescence device of the present invention has high external quantum efficiency and excellent durability. Further, since a change in chromaticity is small when driving at a high temperature, the device may be used, for example, for vehicle use that requires driving durability under the high temperature environment.

Although the present invention has been described with reference to detailed and specific embodiments thereof, it is obvious to those skilled in the art that various changes or modifications may be made without departing from the spirit and scope of the present invention.

This application claims priority from Japanese Patent Application (Japanese Patent Application No. 2009-180223) filed on Jul. 31, 2009, Japanese Patent Application (Japanese Patent Application No. 2009-201155) filed on Aug. 31, 2009, and Japanese Patent Application (Japanese Patent Application No. 2009-221663) filed on Sep. 25, 2009, the disclosures of which are incorporated herein by reference in its entirety.

EXPLANATION OF REFERENCE NUMERALS AND SYMBOLS

2: Substrate
3: Anode
4: Hole injection layer.
5: Hole transporting layer
6: Light emitting layer
7: Hole blocking layer
8: Electron transporting layer
9: Cathode
10: Organic electroluminescence device (organic EL device)
11: Organic layer
12: Protective layer
14: Adhesive layer
16: Sealing vessel
20: Light emission apparatus
30: Light scattering member
30A: Light incident surface
30B: Light reflecting surface
31: Transparent substrate
32: Microparticles
40: Illumination apparatus

The invention claimed is:

1. An organic electroluminescence device, comprising on a substrate:
   a pair of electrodes; and
   a light emitting layer disposed between the electrodes,
   wherein a compound represented by the following Formula (1) and a compound represented by Formula (PQ-1) are contained in the light emitting layer:

$$(Cz)p\text{-}L\text{-}(A)q \quad (1)$$

in Formula (1), Cz represents a substituted or unsubstituted arylcarbazolyl group or a substituted or unsubstituted carbazolylaryl group;

L represents a single bond, a substituted or unsubstituted arylene group, a substituted or unsubstituted cycloalkylene group or a substituted or unsubstituted aromatic heterocyclic ring;

A is a substituted or unsubstituted nitrogen-containing aromatic heterocyclic six-membered ring; and each of p and q independently represents an integer of 1 to 6:

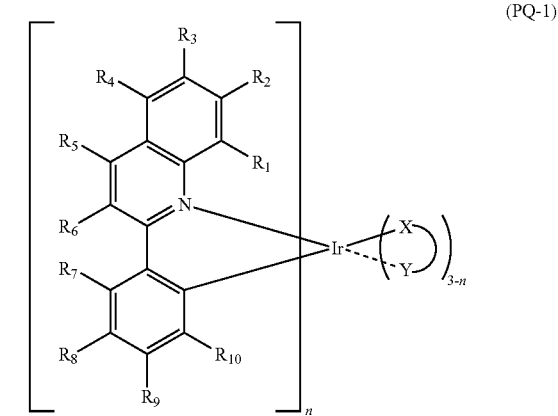

(PQ-1)

in the formula, each of $R_1$ to $R_{10}$ independently represents a hydrogen atom or a substituent, and the substituents may be bonded to each other to form a ring, with the proviso that when all of $R_1$ to $R_{10}$ are hydrogen atoms, then n is not 2;

X—Y represents a mono-anionic bidentate ligand; and
n represents an integer of 2 or 3.

2. The organic electroluminescence device according to claim 1,
   wherein, in Formula (PQ-1), n=3.

3. The organic electroluminescence device according to claim 1,
   wherein, in Formula (PQ-1), n=2.

4. The organic electroluminescence device according to claim 1,
   wherein, in Formula (PQ-1), $R_1$ to $R_6$ are hydrogen atoms.

5. The organic electroluminescence device according to claim 1,
wherein, in Formula (PQ-1), $R_9$ represents an aryl group.

6. The organic electroluminescence device according to claim 1,
wherein the compound represented by Formula (1) is a compound represented by the following Formula (2):

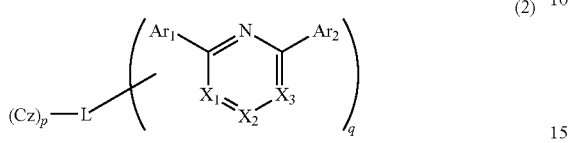

(2)

in Formula (2), Cz represents a substituted or unsubstituted arylcarbazolyl group or a substituted or unsubstituted carbazolylaryl group;
L represents a single bond, a substituted or unsubstituted arylene group, a substituted or unsubstituted cycloalkylene group or a substituted or unsubstituted aromatic heterocyclic ring, and is linked to a carbon atom of $Ar_1$, $Ar_2$, $X_1$, $X_2$ or $X_3$;
each of $Ar_1$ and $Ar_2$ independently represents a substituted or unsubstituted aryl group or a substituted or unsubstituted aromatic heterocyclic group;
each of $X_1$, $X_2$ and $X_3$ independently represents a nitrogen atom or a carbon atom to which a hydrogen atom or a substituent is bonded; and
each of p and q independently represents an integer of 1 to 6.

7. The organic electroluminescence device according to claim 6,
wherein the compound represented by Formula (2) is a compound represented by the following Formula (3):

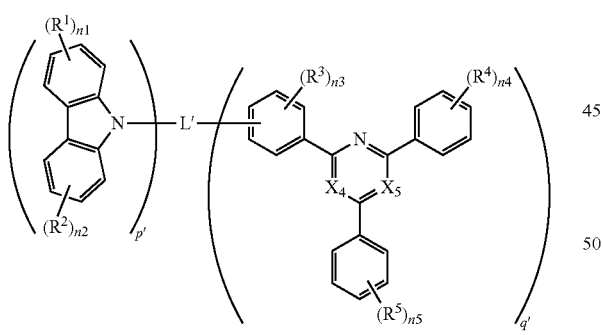

(3)

in Formula (3), each of $X_4$ and $X_5$ independently represents a nitrogen atom or a carbon atom to which a hydrogen atom or a substituent is bonded, and either one of $X_4$ and $X_5$ is a nitrogen atom, the other is a carbon atom to which a hydrogen atom or a substituent is bonded;
L' represents a single bond, a substituted or unsubstituted arylene group, a substituted or unsubstituted cycloalkylene group or a substituted or unsubstituted aromatic heterocyclic ring;
each of $R^1$ to $R^5$ independently represents a substituent;
each of n1 to n5 independently represents an integer of 0 to 5; and each of p' and q' independently represents an integer of 1 to 4.

8. The organic electroluminescence device according to claim 1,
wherein the (X—Y) is any one of acetylacetonate (acac), picolinate (pic) and a derivative thereof.

9. The organic electroluminescence device according to claim 1,
wherein a compound represented by the following Formula (C-1) is further contained in the light emitting layer:

(C-1)

in Formula (C-1), each of $Q^1$, $Q^2$, $Q^3$ and $Q^4$ independently represents a ligand which is coordinated to Pt; and
each of $L^1$, $L^2$ and $L^3$ independently represents a single bond or a divalent linking group.

10. The organic electroluminescence device according to claim 9,
wherein the compound represented by Formula (C-1) is a compound represented by the following Formula (C-2):

(C-2)

in Formular (C-2), $L^{21}$ represents a single bond or a divalent linking group;
each of $A^{21}$ and $A^{22}$ independently represents a carbon atom or a nitrogen atom;
each of $Z^{21}$ and $Z^{22}$ independently represents a nitrogen-containing aromatic heterocyclic ring; and
each of $Z^{23}$ and $Z^{24}$ independently represents a benzene ring or an aromatic heterocyclic ring.

11. The organic electroluminescence device according to claim 1, further comprising:
a layer containing a compound represented by Formula (1) between the light emitting layer and a cathode.

12. A composition, comprising:
a compound represented by Formula (1); and
a compound represented by Formula (PQ-1):

$(Cz)p$-L-$(A)q$ (1)

in Formula (1), Cz represents a substituted or unsubstituted arylcarbazolyl group or a substituted or unsubstituted carbazolylaryl group;
L represents a single bond, a substituted or unsubstituted arylene group, a substituted or unsubstituted cycloalkylene group or a substituted or unsubstituted aromatic heterocyclic ring;
A is a substituted or unsubstituted nitrogen-containing aromatic heterocyclic six-membered ring; and
each of p and q independently represents an integer of 1 to 6:

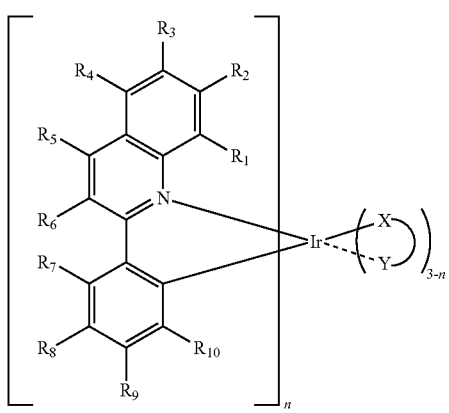

(PQ-1)

in the formula, each of $R_1$ to $R_{10}$ independently represents a hydrogen atom or a substituent, and the substituents may be bonded to each other to form a ring, with the proviso that when all of $R_1$ to $R_{10}$ are hydrogen atoms, then n is not 2;

X—Y represents a mono-anionic bidentate ligand; and n represents an integer of 2 or 3.

13. The composition according to claim 12, further comprising:

a compound represented by Formula (C-1):

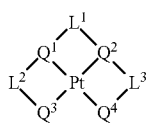

(C-1)

in Formula (C-1), each of $Q^1$, $Q^2$, $Q^3$ and $Q^4$ independently represents a ligand which is coordinated to Pt; and each of $L^1$, $L^2$ and $L^3$ independently represents a single bond or a divalent linking group.

14. A light emitting layer, comprising:

a compound represented by Formula (1); and a compound represented by Formula (PQ-1):

(Cz)p-L-(A)q    (1)

in Formula (1), Cz represents a substituted or unsubstituted arylcarbazolyl group or a substituted or unsubstituted carbazolylaryl group;

L represents a single bond, a substituted or unsubstituted arylene group, a substituted or unsubstituted cycloalkylene group or a substituted or unsubstituted aromatic heterocyclic ring;

A is a substituted or unsubstituted nitrogen-containing aromatic heterocyclic six-membered ring; and each of p and q independently represents an integer of 1 to 6:

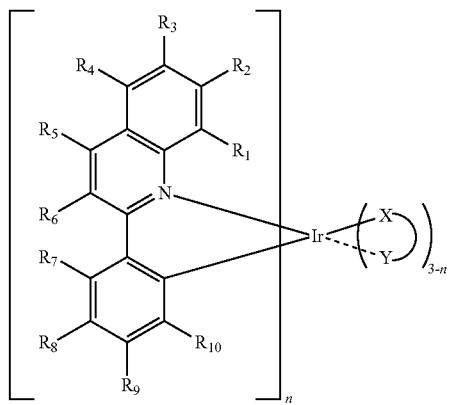

(PQ-1)

in the formula, each of $R_1$ to $R_{10}$ independently represents a hydrogen atom or a substituent, and the substituents may be bonded to each other to form a ring, with the proviso that when all of $R_1$ to $R_{10}$ are hydrogen atoms, then n is not 2;

X—Y represents a mono-anionic bidentate ligand; and n represents an integer of 2 or 3.

15. The light emitting layer according to claim 14, further comprising:

a compound represented by Formula (C-1):

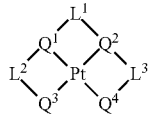

(C-1)

in Formula (C-1), each of $Q^1$, $Q^2$, $Q^3$ and $Q^4$ independently represents a ligand which is coordinated to Pt; and each of $L^1$, $L^2$ and $L^3$ independently represents a single bond or a divalent linking group.

16. A method for forming a film, comprising:

simultaneously heating a compound represented by Formula (1) and a compound represented by Formula (PQ-1) so as to sublimate the compounds:

(Cz)p-L-(A)q    (1)

in Formula (1), Cz represents a substituted or unsubstituted arylcarbazolyl group or a substituted or unsubstituted carbazolylaryl group;

L represents a single bond, a substituted or unsubstituted arylene group, a substituted or unsubstituted cycloalkylene group or a substituted or unsubstituted aromatic heterocyclic ring;

A is a substituted or unsubstituted nitrogen-containing aromatic heterocyclic six-membered ring; and each of p and q independently represents an integer of 1 to 6:

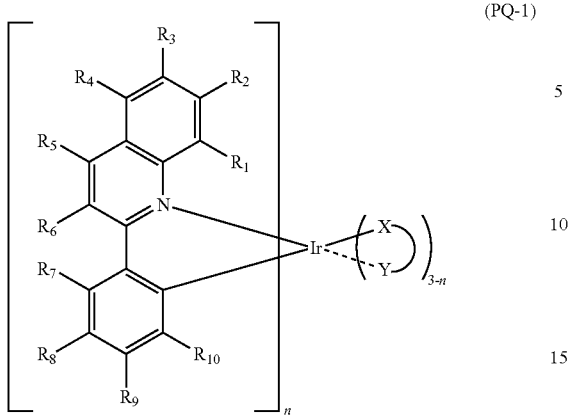

(PQ-1)

in the formula, each of $R_1$ to $R_{10}$ independently represents a hydrogen atom or a substituent, and the substituents may be bonded to each other to form a ring,
with the proviso that when all of $R_1$ to $R_{10}$ are hydrogen atoms, then n is not 2;

X—Y represents a mono-anionic bidentate ligand; and n represents an integer of 2 or 3.

17. A light emission apparatus, comprising the organic electroluminescence device according to claim 1.

18. A display apparatus, comprising the organic electroluminescence device according to claim 1.

19. An illumination apparatus, comprising the organic electroluminescence device according to claim 1.

* * * * *